United States Patent
Lim et al.

(10) Patent No.: US 11,356,070 B2
(45) Date of Patent: Jun. 7, 2022

(54) RF AMPLIFIERS HAVING SHIELDED TRANSMISSION LINE STRUCTURES

(71) Applicant: Wolfspeed, Inc., Durham, NC (US)

(72) Inventors: Kwangmo Chris Lim, San Jose, CA (US); Basim Noori, San Jose, CA (US); Qianli Mu, San Jose, CA (US); Marvin Marbell, Morgan Hill, CA (US); Scott Sheppard, Chapel Hill, NC (US); Alexander Komposch, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 180 days.

(21) Appl. No.: 16/888,957

(22) Filed: Jun. 1, 2020

(65) Prior Publication Data

US 2021/0376807 A1    Dec. 2, 2021

(51) Int. Cl.
| | |
|---|---|
| *H03F 3/72* | (2006.01) |
| *H01Q 1/52* | (2006.01) |
| *H03F 1/56* | (2006.01) |
| *H03F 3/19* | (2006.01) |
| *H03F 3/21* | (2006.01) |
| *H03H 2/00* | (2006.01) |

(52) U.S. Cl.
CPC ............. *H03F 3/72* (2013.01); *H01Q 1/526* (2013.01); *H03F 1/56* (2013.01); *H03F 3/19* (2013.01); *H03F 3/211* (2013.01); *H03H 2/008* (2013.01)

(58) Field of Classification Search
CPC ..... H03F 3/72; H03F 1/56; H03F 3/19; H03F 3/211; H01Q 1/526; H03H 2/008
USPC ........................................................ 330/51
See application file for complete search history.

(56) References Cited

U.S. PATENT DOCUMENTS

| | | | |
|---|---|---|---|
| 4,946,547 A | 8/1990 | Palmour et al. | |
| 5,192,987 A | 3/1993 | Khan et al. | |
| 5,200,022 A | 4/1993 | Kong | |
| 5,210,051 A | 5/1993 | Carter | |
| 5,296,395 A | 3/1994 | Khan et al. | |
| RE34,861 E | 2/1995 | Davis et al. | |
| 5,393,993 A | 2/1995 | Edmond et al. | |
| 5,523,589 A | 6/1996 | Edmond et al. | |
| 6,218,680 B1 | 4/2001 | Carter et al. | |

(Continued)

FOREIGN PATENT DOCUMENTS

| | | |
|---|---|---|
| CA | 2511005 C | 5/2016 |
| CN | 1757119 B | 2/2011 |

(Continued)

OTHER PUBLICATIONS

The definition of Redistribution Layers (RDLs), https://semiengineering.com/knowledge_centers/packaging/redistribution-layers-rdls, Copyright © 2013-2022 SMG (Year: 2022).*

(Continued)

*Primary Examiner* — Hafizur Rahman
(74) *Attorney, Agent, or Firm* — Myers Bigel, P.A

(57) ABSTRACT

RF transistor amplifiers include an RF transistor amplifier die having a semiconductor layer structure, a coupling element on an upper surface of the semiconductor layer structure, and an interconnect structure on an upper surface of the coupling element so that the RF transistor amplifier die and the interconnect structure are in a stacked arrangement. The coupling element includes a first shielded transmission line structure.

20 Claims, 25 Drawing Sheets

(56) References Cited

U.S. PATENT DOCUMENTS

| | | |
|---|---|---|
| 6,316,793 B1 | 11/2001 | Sheppard et al. |
| 6,548,333 B2 | 4/2003 | Smith |
| 6,825,559 B2 | 11/2004 | Mishra et al. |
| 7,030,428 B2 | 4/2006 | Saxler |
| 7,135,766 B1 | 11/2006 | Costa et al. |
| 7,354,782 B2 | 4/2008 | Mishra et al. |
| 7,544,963 B2 | 6/2009 | Saxler |
| 7,548,112 B2 | 6/2009 | Sheppard |
| 7,592,211 B2 | 9/2009 | Sheppard et al. |
| 7,615,774 B2 | 11/2009 | Saxler |
| 7,709,269 B2 | 5/2010 | Smith et al. |
| 7,851,909 B2 | 12/2010 | Mishra et al. |
| 7,906,799 B2 | 3/2011 | Sheppard et al. |
| 8,274,159 B2 | 9/2012 | Mishra et al. |
| 8,803,313 B2 | 8/2014 | Mishra et al. |
| 9,226,383 B2 | 12/2015 | Mishra et al. |
| 9,515,011 B2 | 12/2016 | Wood et al. |
| 9,947,616 B2 | 4/2018 | Wood et al. |
| 10,483,352 B1 | 11/2019 | Mokhti et al. |
| 2001/0038310 A1 | 11/2001 | Olofsson et al. |
| 2002/0066908 A1 | 6/2002 | Smith |
| 2002/0167023 A1 | 11/2002 | Chavarkar et al. |
| 2003/0102482 A1 | 6/2003 | Saxler |
| 2004/0061129 A1 | 4/2004 | Saxler et al. |
| 2006/0226498 A1* | 10/2006 | Davies .............. H01L 29/66719 257/409 |
| 2009/0256266 A1 | 10/2009 | Lao et al. |
| 2010/0059791 A1 | 3/2010 | Takagi |
| 2012/0063097 A1 | 3/2012 | Reza et al. |
| 2012/0168928 A1 | 7/2012 | Lao et al. |
| 2014/0312458 A1 | 10/2014 | Ashrafzadeh et al. |
| 2018/0090475 A1 | 3/2018 | Zuo et al. |
| 2019/0057924 A1 | 2/2019 | Kim et al. |
| 2019/0110358 A1 | 4/2019 | Mu et al. |
| 2019/0149098 A1 | 5/2019 | Tanomura |
| 2019/0181099 A1 | 6/2019 | Then et al. |
| 2019/0304887 A1 | 10/2019 | Ganesan et al. |
| 2020/0075479 A1 | 3/2020 | Khalil et al. |
| 2020/0219866 A1 | 7/2020 | Cabahug et al. |
| 2020/0328721 A1* | 10/2020 | Nanan .................. H01L 25/072 |

FOREIGN PATENT DOCUMENTS

| | | | |
|---|---|---|---|
| EP | 2518764 A2 | 10/2012 | |
| EP | 3855486 A1 * | 7/2021 | ............ H01L 23/36 |
| EP | 3855486 A1 | 7/2021 | |
| JP | 4830092 B2 | 9/2011 | |
| JP | 2020507230 A * | 3/2020 | ......... H01L 23/4855 |
| KR | 101288153 B1 | 7/2013 | |
| KR | 101371907 B1 | 3/2014 | |
| TW | I333278 B | 11/2010 | |
| WO | 2004061973 A1 | 7/2004 | |
| WO | 2019097564 A1 | 5/2019 | |
| WO | 2020100219 A1 | 5/2020 | |

OTHER PUBLICATIONS

A schematic of Yole development vertical packaging (Year: 2014).*
Ramesh, S., "Laying Foundations for Vertical Transistor Manufacture", published in compound semiconductor, Sep. 20, 2018 (Year: 2018).*
Dumé, I. ,"Nanowires give vertical transistors a boost", Physics World, Semiconductors and Electronics Research Update, Aug. 2, 2012 (Year: 2012).*
"Notification of Transmittal of the International Search Report and the Written Opinion of the International Searching Authority, or the Declaration for corresponding International Application No. PCT/US2021/034231, dated Oct. 8, 2021, (15 pages)".
Notification of Transmittal of the International Search Report and the Written Opinion of the International Searching Authority, or the Declaration, in corresponding PCT Application No. PCT/US2021/025102 (dated Dec. 13, 2021).
"Notification of Transmittal of the International Search Report and the Written Opinion of the International Searching Authority, or the Declaration for corresponding International Application No. PCT/US2021/048779, dated Jan. 14, 2022, (16 pages)".

* cited by examiner

RF AMPLIFIERS HAVING SHIELDED TRANSMISSION LINE STRUCTURES

FIELD

The present invention relates to microelectronic devices and, more particularly, to high power, high frequency transistor amplifiers.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

Most RF transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package that are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die may be damaged. As such, Group III nitride-based RF transistor amplifiers are typically mounted in packages that may be optimized for heat removal.

FIGS. 1A through 1D are various views that schematically illustrate a conventional Group III nitride-based RF transistor amplifier die 10. In particular, FIG. 1A is a schematic plan view of the Group III nitride-based RF transistor amplifier die 10, and FIG. 1B is a side view of the RF transistor amplifier die 10 taken along line 1B-1B of FIG. 1A. FIG. 1C is a schematic cross-sectional view taken along line 1C-1C of FIG. 1B that shows the metallization on the top surface of the semiconductor layer structure of the RF transistor amplifier die 10, and FIG. 1D is a cross-sectional view of the RF transistor amplifier die 10 taken along line 1D-1D of FIG. 1C. FIGS. 1E and 1F are schematic cross-sectional views illustrating two example ways that the RF transistor amplifier die 10 of FIGS. 1A-1D may be packaged to provide packaged RF transistor amplifiers 1A and 1B, respectively. It will be appreciated that FIGS. 1A-1F (and many of the other figures of the present application) are highly simplified diagrams, and that actual RF transistor amplifiers may include many more unit cells and various circuitry and elements that are not shown in the simplified figures herein.

As shown in FIG. 1A, the RF transistor amplifier die 10 includes a gate terminal 22 and a drain terminal 24 that are exposed on the top side of the RF transistor amplifier die 10. A first circuit element (not shown) may be connected to the gate terminal 22 by, for example, bond wires (not shown) and a second circuit element (not shown) may be connected to the drain terminal 24 by, for example, bond wires (not shown). The first circuit element may, for example, pass an input RF signal that is to be amplified to the RF transistor amplifier die 10 and the second circuit element may receive an amplified RF signal that is output by the RF transistor amplifier die 10. A protective insulating layer or pattern 28 may cover the rest of the top surface of the RF transistor amplifier die 10.

As shown in FIGS. 1B-1D, the RF transistor amplifier die 10 further includes a semiconductor layer structure 30, a top-side metallization structure 20 and a back side metallization structure that acts as a source terminal 26 for the RF transistor amplifier die 10.

The semiconductor layer structure 30 includes a plurality of semiconductor layers. The RF transistor amplifier die 10 may be a HEMT-based RF transistor amplifier die, and hence the semiconductor layer structure 30 may include at least a channel layer and a barrier layer. Referring to FIG. 1D, in the depicted example, a total of three layers are shown, namely a semiconductor channel layer 34 and a semiconductor barrier layer 36 that are sequentially formed on a growth substrate 32, which may be a semiconductor or insulating substrate (such as a SiC or sapphire substrate). The growth substrate 32, even if formed of a non-semiconductor material, is considered to be part of the semiconductor layer structure 30.

Referring again to FIG. 1B, the semiconductor layer structure 30 has a top side 12 and a bottom side 14. The top side metallization structure 20 is formed on the top side 12 of the semiconductor layer structure 30 and the source terminal 26 is formed on the bottom side 14 of the semiconductor layer structure 30. The top side metallization structure 20 includes, among other things, a conductive (typically metal) gate manifold 42 and a conductive (typically metal) drain manifold 44, conductive gate and drain vias 43, 45, conductive gate and drain terminals 22, 24, and gate, drain and source fingers 52, 54, 56 (described below). The gate manifold 42 is electrically connected to the gate terminal 22 through the gate vias 43, and the drain manifold 44 is electrically connected to the drain terminal 24 through the conductive drain vias 45. The gate and drain vias 43, 45 may comprise, for example, metal-plated vias or metal pillars that are formed through a dielectric material such as silicon oxide or silicon nitride.

As shown in FIG. 1C, the RF transistor amplifier die 10 comprises a plurality of unit cell transistors 16, one of which is indicated by the dashed box in FIG. 1C. Each unit cell transistor 16 includes a gate finger 52, a drain finger 54 and a source finger 56. The gate, drain and source fingers 52, 54, 56 are formed on the upper surface of the semiconductor layer structure 30 and comprise part of the top side metallization structure 20. The top side metallization structure 20 further includes the gate manifold 42 and the drain manifold 44. The gate fingers 52 are electrically connected to the gate manifold 42, and the drain fingers 54 are electrically connected to the drain manifold 44. The source fingers 56 are electrically connected to the source terminal 26 (FIG. 1B) via a plurality of conductive source vias 66 that extend through the semiconductor layer structure 30. The conductive source vias 66 may comprise metal-plated vias that extend completely through the semiconductor layer structure 30.

FIG. 1E is a schematic side view of a packaged Group III nitride-based RF transistor amplifier 1A that includes the RF transistor amplifier die 10 of FIGS. 1A-1D. As shown in FIG. 1E, packaged RF transistor amplifier 1A includes the RF transistor amplifier die 10 and an open cavity package 70. The package 70 includes metal gate leads 72, metal drain leads 74, a metal submount 76, ceramic sidewalls 78 and a ceramic lid 80.

The RF transistor amplifier die 10 is mounted on the upper surface of the metal submount 76 (which may be a metal flange) in a cavity defined by the metal submount 76, the ceramic sidewalls 78 and the ceramic lid 80. The source terminal 26 of the RF transistor amplifier die 10 may directly contact the metal submount 76. The metal submount 76 may provide the electrical connection to the source terminal 26 and may also serve as a heat dissipation structure that dissipates heat that is generated in the RF transistor amplifier die 10. The heat is primarily generated in the upper portion of the RF transistor amplifier die 10 where relatively high current densities are generated in, for example, the channel regions of the unit cell transistors 16. This heat may be transferred though the source vias 66 and the semiconductor layer structure 30 to the source terminal 26 and then to the metal submount 76.

Input matching circuits 90 and/or output matching circuits 92 may also be mounted within the package 70. The matching circuits 90, 92 may be impedance matching circuits that match the impedance of the fundamental component of RF signals that are input to or output from the RF transistor amplifier 1A to the impedance at the input or output of the RF transistor amplifier die 10, respectively, and/or harmonic termination circuits that are configured to ground harmonics of the fundamental RF signal that may be present at the input or output of the RF transistor amplifier die 10. More than one input matching circuit 90 and/or output matching circuit 92 may be provided. As schematically shown in FIG. 1E, the input and output matching circuits 90, 92 may be mounted on the metal submount 76. The gate lead 72 may be connected to the input matching circuit 90 by one or more first bond wires 82, and the input matching circuit 90 may be connected to the gate terminal 22 of RF transistor amplifier die 10 by one or more second bond wires 84. Similarly, the drain lead 74 may be connected to the output matching circuit 92 by one or more fourth bond wires 88, and the output matching circuit 92 may be connected to the drain terminal 24 of RF transistor amplifier die 10 by one or more third bond wires 86. The bond wires 82, 84, 86, 88 may form part of the input and/or output matching circuits. The gate lead 72 and the drain lead 74 may extend through the ceramic sidewalls 78. The interior of the package 70 may comprise an air-filled cavity.

FIG. 1F is a schematic side view of another conventional packaged Group III nitride-based RF transistor amplifier 1B. RF transistor amplifier 1B differs from RF transistor amplifier 1A in that it includes a different package 70'. The package 70' includes a metal submount 76 (which acts as a metal heat sink and can be implemented as a metal slug), as well as gate and drain leads 72', 74'. RF transistor amplifier 1B also includes a plastic overmold 78' that at least partially surrounds the RF transistor amplifier die 10, the leads 72', 74' and the metal submount 76. Other components of RF transistor amplifier 1B may be the same as the like-numbered components of RF transistor amplifier 1A and hence further description thereof will be omitted.

SUMMARY

Pursuant to embodiments of the present invention, RF transistor amplifiers are provided that include an RF transistor amplifier die having a semiconductor layer structure a coupling element on an upper surface of the semiconductor layer structure, and an interconnect structure on an upper surface of the coupling element so that the RF transistor amplifier die and the interconnect structure are in a stacked arrangement. The coupling element includes a first shielded transmission line structure.

In some embodiments, the first shielded transmission line structure may comprise a first conductive pillar that is electrically connected to a first input/output terminal of the RF transistor amplifier die and first and second conductive ground pillars that are on opposed sides of the first conductive pillar, the first and second conductive ground pillars electrically connected to a ground terminal of the RF transistor amplifier die. The first shielded transmission line structure may further include third and fourth conductive ground pillars that are on opposed sides of the first conductive pillar, the third and fourth conductive ground pillars electrically connected to the ground terminal of the RF transistor amplifier. In some embodiments, the first through fourth conductive ground pillars may surround the first conductive pillar.

In some embodiments, the first conductive pillar may vertically overlap an active region of the RF transistor amplifier die. In some embodiments, the first conductive ground pillar may additionally or alternatively vertically overlap a manifold of the RF transistor amplifier die, where the manifold is connected to a plurality of conductive fingers that extend across an active region of the RF transistor amplifier die. In some embodiments, the second conductive ground pillar may vertically overlap a portion of the RF transistor amplifier die that is outside an active region of the RF transistor amplifier die. In some embodiments, the first conductive pillar and the first conductive ground pillar may both vertically overlap the first input/output terminal.

In some embodiments, the first input/output terminal may be a gate terminal and the ground terminal may be a source terminal, and the coupling element may further include a second shielded transmission line structure that comprises a second conductive pillar that is electrically connected to a drain terminal of the RF transistor amplifier die and fifth and sixth conductive ground pillars that are on opposed sides of the second conductive pillar, the fifth and sixth conductive ground pillars electrically connected to the source terminal.

In some embodiments, the first input/output terminal may comprise a gate terminal and the ground terminal may comprise a source terminal, and the RF transistor amplifier die may further include a drain terminal. In such embodiments, the source terminal may be on opposed sides of the gate terminal and may be on opposed sides of the drain terminal.

In some embodiments, the first conductive pillar and a third conductive pillar may be electrically connected to a gate manifold of the RF transistor amplifier die, and where the first conductive ground pillar may be positioned between the first and third conductive pillars.

In some embodiments, the second conductive ground pillar may comprise a metal slug that has a cross-sectional area in a first plane that is parallel to a major surface of the RF transistor amplifier die that is at least five times a cross-sectional area of the first conductive pillar in the first plane.

In some embodiments, the first conductive ground pillar may have a first end and a second end, and the second end may not be connected to a conductive element.

In some embodiments, the coupling element may further comprise an injectable underfill material that surrounds the first conductive pillar and the first and second conductive ground pillars.

In some embodiments, the interconnect structure may include a second shielded transmission line structure. The, second shielded transmission line structure may comprise, for example, a stripline transmission line segment, a coplanar waveguide transmission line segment, or a grounded coplanar waveguide transmission line segment.

In some embodiments, the semiconductor layer structure may be a Group III nitride-based semiconductor layer structure. In some embodiments, the interconnect structure may comprise a redistribution layer laminate structure or a printed circuit board. In some embodiments, a plurality of circuit elements such as, for example, surface mount capacitor or a surface mount inductor, may be mounted on the interconnect structure.

In some embodiments, sides of the RF transistor amplifier die that do not connect to the interconnect structure may be encapsulated.

In some embodiments, the RF transistor amplifier die may further include a gate terminal, a drain terminal, and a source terminal on the upper surface of the semiconductor layer structure. In such embodiments, the first shielded transmission line structure may comprise a gate pillar that is electrically connected to the gate terminal and first and second ground pillars that are on opposed sides of the gate pillar, the first and second ground pillars electrically connected to the source terminal.

In some embodiments, the first shielded transmission line structure may comprise a plurality of conductive pillars that are arranged so that a first of the conductive pillars is a signal carrying pillar that is surrounded on at least two sides by additional ones of the conductive pillars that are coupled to a ground voltage source. In some embodiments, the first of the conductive pillars may be surrounded on at least three sides by ones of the conductive pillars that are coupled to the ground voltage source.

In some embodiments, the coupling element may have a fan-in configuration.

Pursuant to further embodiment of the present invention, RF transistor amplifiers are provided that include an RF transistor amplifier die having a Group III nitride-based semiconductor layer structure and gate and drain fingers extending on an upper surface of the semiconductor layer structure and a first shielded transmission line structure extending perpendicularly to the upper surface of the semiconductor layer structure.

In some embodiments, the first shielded transmission line structure may be electrically connected to one of the gate fingers and the drain fingers.

In some embodiments, the RF transistor amplifier may further include an interconnect structure, where the first shielded transmission line structure electrically connects the RF transistor amplifier die to the interconnect structure.

In some embodiments, the first shielded transmission line structure may comprise a first conductive pillar that is electrically connected to one of the gate fingers or one of the drain fingers and first and second conductive ground pillars that are on opposed sides of the first conductive pillar, the first and second conductive ground pillars electrically connected to source fingers of the RF transistor amplifier die. In such embodiments, the first shielded transmission line structure further may comprise third and fourth conductive ground pillars that are on opposed sides of the first conductive pillar, the third and fourth conductive ground pillars electrically connected to the source fingers.

In some embodiments, the first conductive pillar may vertically overlap an active region of the RF transistor amplifier die. In some embodiments, the first conductive ground pillar may vertically overlap a manifold of the RF transistor amplifier die that is electrically connected to either the gate fingers or the drain fingers. In some embodiments, the second conductive ground pillar may vertically overlap a portion of the RF transistor amplifier die that is outside an active region of the RF transistor amplifier die. In some embodiments, the first conductive pillar and the first conductive ground pillar may both vertically overlap a gate terminal of the RF transistor amplifier die.

In some embodiments, the first conductive pillar and a third conductive pillar may be electrically connected to a gate manifold of the RF transistor amplifier die, and where the first conductive ground pillar may be positioned between the first and third conductive pillars.

In some embodiments, the interconnect structure may include a second shielded transmission line structure.

In some embodiments, the RF transistor amplifier die may further include a gate terminal that is electrically connected to the gate fingers, a drain terminal that is electrically connected to the drain fingers, and source fingers that are electrically connected to a source terminal, wherein the gate terminal, the drain terminal and the source terminal are all located above the gate fingers, the drain fingers and the source fingers.

In some embodiments, the first shielded transmission line structure may comprise a gate pillar that is electrically connected to the gate terminal and first and second ground pillars that are on opposed sides of the gate pillar, the first and second ground pillars electrically connected to the source terminal.

Pursuant to still further embodiment of the present invention, RF transistor amplifiers are provided that include an RF transistor amplifier die having a Group III nitride-based semiconductor layer structure and gate fingers, drain fingers and source fingers extending on an upper surface of the semiconductor layer structure and a plurality of conductive pillars extending perpendicular to the upper surface of the semiconductor layer structure, the conductive pillars including a first conductive pillar that is electrically connected to either the gate fingers or the drain fingers and first and second conductive ground pillars that are on opposed sides of the first conductive pillar, the first and second conductive ground pillars electrically connected to the source fingers.

In some embodiments, the RF transistor amplifier may further comprise an interconnect structure, and the conductive pillars may extend between the interconnect structure and the RF transistor amplifier die and electrically connect the interconnect structure to the RF transistor amplifier die.

In some embodiments, the first and second conductive ground pillars and at least one additional conductive ground pillar may surround the first conductive pillar.

In some embodiments, the first conductive pillar may vertically overlap an active region of the RF transistor amplifier die, and/or the second conductive ground pillar may vertically overlap a portion of the RF transistor amplifier die that is outside the active region. In some embodiments, the first conductive ground pillar may vertically overlap a manifold of the RF transistor amplifier die.

In some embodiments, the drain fingers may extend from a drain manifold across an active region of the RF transistor amplifier die, and the first conductive pillar and a third conductive pillar may be electrically connected to the drain manifold, and the first conductive ground pillar may be positioned between the first and third conductive pillars.

In some embodiments, the semiconductor layer structure may comprise a Group III nitride-based semiconductor layer structure.

In some embodiments, the conductive pillars may have a fan-in configuration.

Pursuant to yet additional embodiment of the present invention, RF transistor amplifiers are provided that include an RF transistor amplifier die comprising a gate terminal, a drain terminal, and a source terminal on a first surface of the RF transistor amplifier die and an interconnect structure that is in a stacked arrangement with the RF transistor amplifier die and electrically connected thereto by a shielded transmission line structure.

In some embodiments, the shielded transmission line structure may comprise a first conductive pillar that is electrically connected to the gate terminal and first and second conductive ground pillars that are on opposed sides of the first conductive pillar, the first and second conductive ground pillars electrically connected to the source terminal.

In some embodiments, the shielded transmission line structure may comprise a first conductive pillar that is electrically connected to the drain terminal and first and second conductive ground pillars that are on opposed sides of the first conductive pillar, the first and second conductive ground pillars electrically connected to the source terminal.

In some embodiments, the shielded transmission line structure may further comprise a third conductive ground pillar that together with the first and second conductive ground pillars surrounds the first conductive pillar on at least three sides.

In some embodiments, the first conductive pillar may vertically overlap an active region of the RF transistor amplifier die. In some embodiments, the first conductive ground pillar may vertically overlap a gate manifold that is electrically connected to the gate terminal. In some embodiments, the first conductive pillar and the first conductive ground pillar may both vertically overlap the gate terminal.

In some embodiments, the first conductive pillar and a third conductive pillar may be electrically connected to a gate manifold of the RF transistor amplifier die, and the first conductive ground pillar may be positioned between the first and third conductive pillars.

In some embodiments, the interconnect structure may include a second shielded transmission line structure that is electrically connected to the shielded transmission line structure.

Pursuant to embodiment of the present invention, RF transistor amplifiers are provided that include an RF transistor amplifier die comprising a gate terminal, a drain terminal, and a source terminal on a first surface of the RF transistor amplifier die and an interconnect structure that is in a stacked arrangement with the RF transistor amplifier die, the interconnect structure including a shielded transmission line structure, wherein a ground conductor of the shielded transmission line structure is electrically connected to the source terminal and a signal conductor of the shielded transmission line structure is electrically connected to one of the gate terminal and the drain terminal.

In some embodiments, the shielded transmission line structure may comprise a stripline transmission line segment, a coplanar waveguide transmission line segment or a grounded coplanar waveguide transmission line segment.

In some embodiments, the interconnect structure may comprise a redistribution layer laminate structure or a printed circuit board. In some embodiments, a plurality of circuit elements may be mounted on the interconnect structure.

DETAILED DESCRIPTION

Figure 1A:
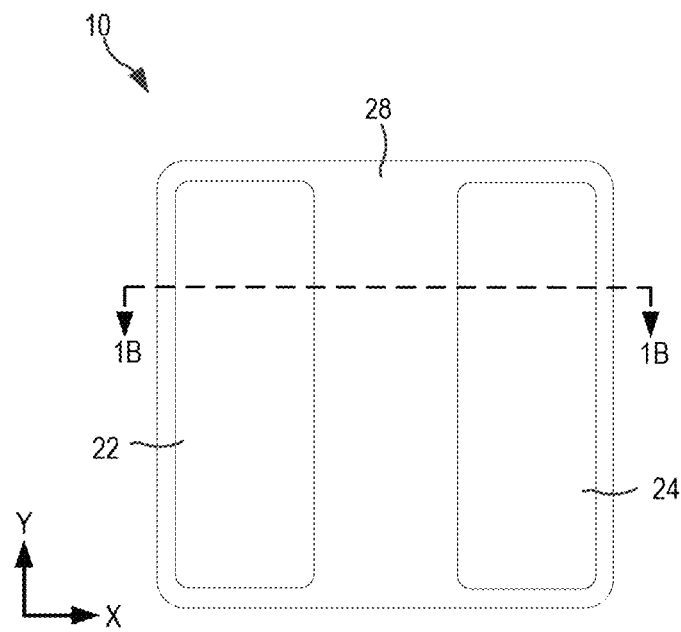
FIG. 1A is a schematic plan view of a conventional Group III nitride-based RF transistor amplifier die.
Figure 1B:
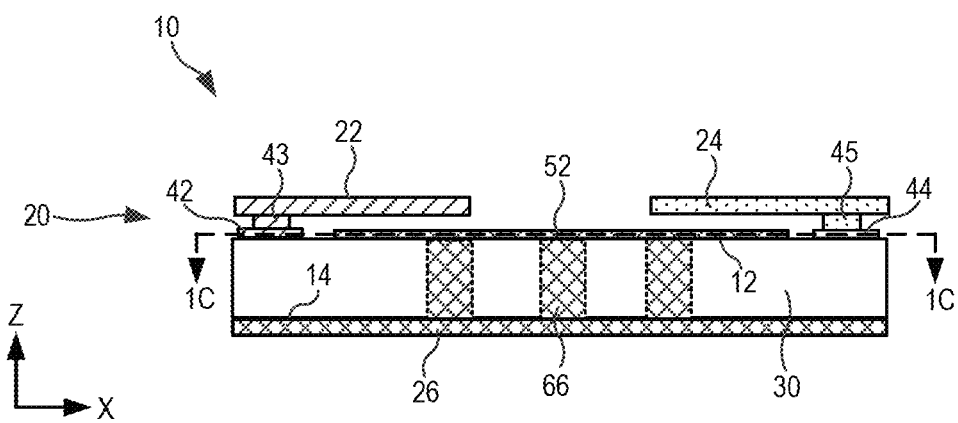
FIG. 1B is a schematic cross-sectional view taken along line 1B-1B of FIG. 1A.
Figure 1C:
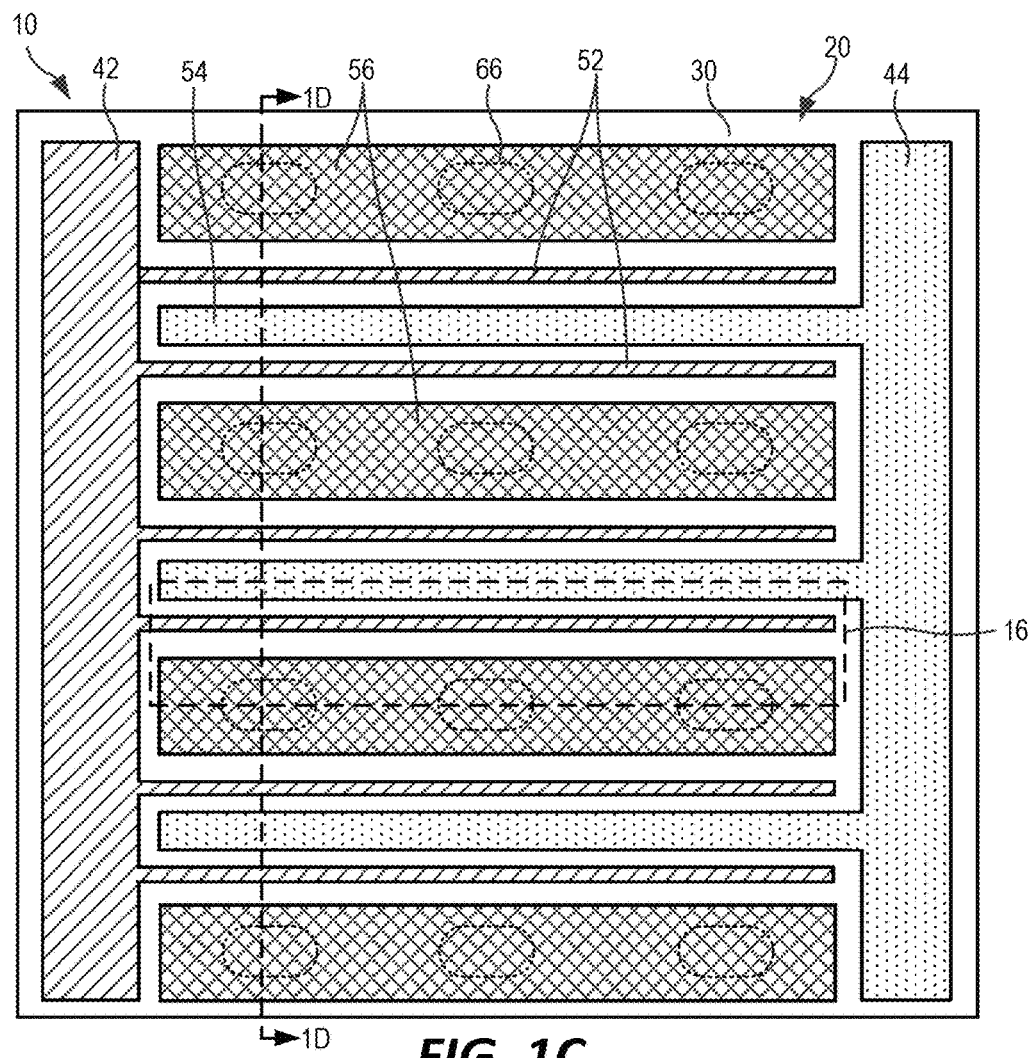
FIG. 1C is a schematic cross-sectional view taken along line 1C-1C of FIG. 1B that illustrates the metallization layers that are formed directly on the top surface of the semiconductor layer structure.
Figure 1D:
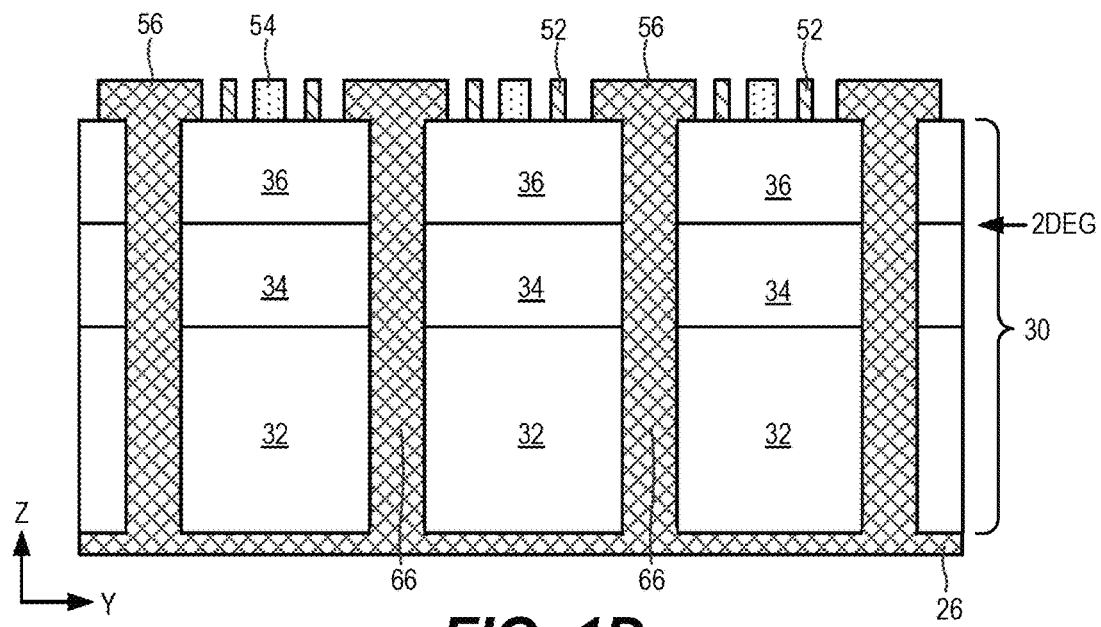
FIG. 1D is a schematic cross-sectional view taken along line 1D-1D of FIG. 1C.
Figure 1E:
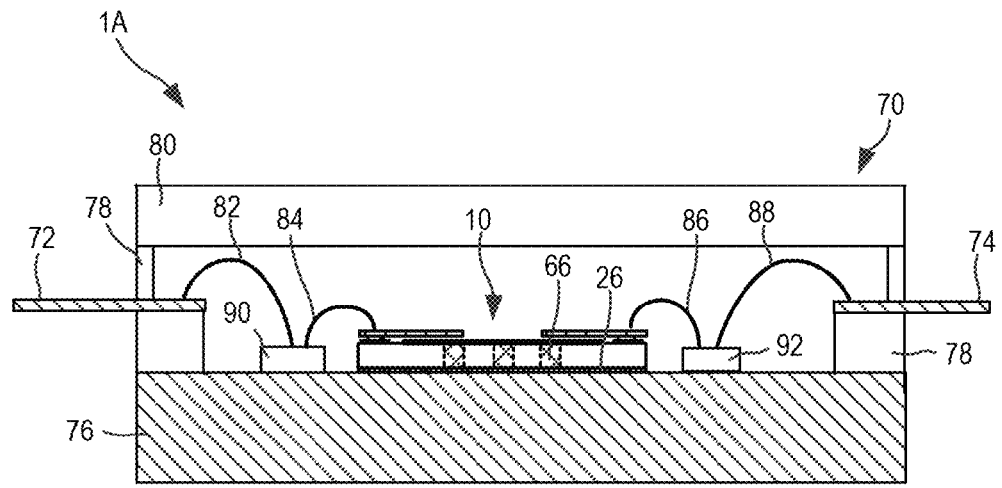
FIG. 1E is a schematic cross-sectional view of the Group III nitride-based RF transistor amplifier die of FIGS. 1A-1D packaged in a ceramic package.
Figure 1F:
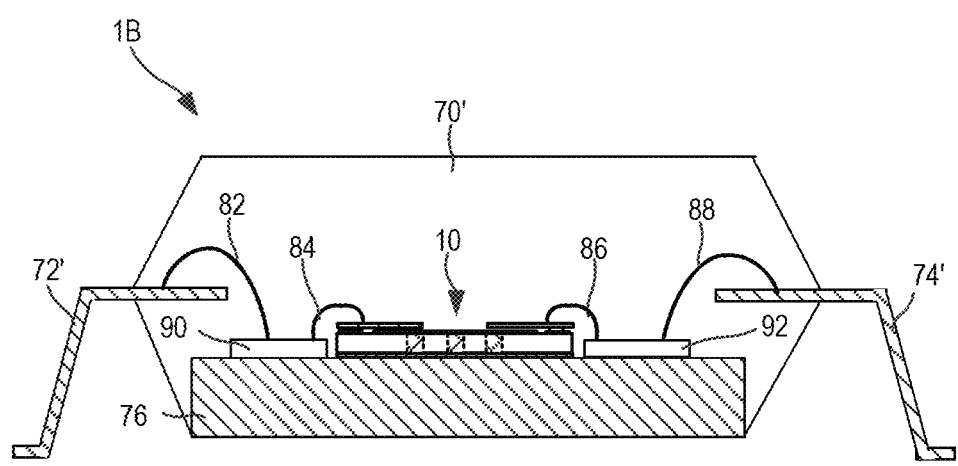
FIG. 1F is a schematic cross-sectional view of the Group III nitride-based RF transistor amplifier die of FIGS. 1A-1D packaged in an overmold package.

As described above, conventional Group III nitride-based packaged RF transistor amplifiers, such as the packaged RF transistor amplifiers 1A and 1B of FIGS. 1E and 1F, typically implement the gate and drain terminals on the upper side of the semiconductor layer structure and the source terminal on the lower side of the semiconductor layer structure. Conductive source vias extend through the semiconductor layer structure to electrically connect the source fingers in the upper portion of the semiconductor layer structure to the source terminal. These conventional RF transistor amplifiers also typically use bond wires to connect the RF transistor amplifier die to other elements of the devices such as matching circuits and/or input/output leads. These bond wires have inherent inductance that may supply some of the inductance of the impedance matching and/or harmonic termination circuits. The amount of inductance provided by the bond wires may be varied by changing the length and/or the cross-sectional area (e.g., the diameter) of the bond wires so that the bond wires provide a desired amount of inductance. Unfortunately, as applications move to higher frequencies, the inductance of the bond wires may exceed a desired amount of inductance for the impedance matching and/or harmonic termination circuits. When this occurs, bond wires that are very short and/or that have large cross-sectional areas may be used to decrease the inductance. Very short bond wires, however, may be difficult to solder in place, which may increase manufacturing costs, and/or may result in higher device failure rates. Bond wires having large cross-sectional areas may require larger gate and drain terminals on the RF transistor amplifier die, which may result in an undesirable increase in the overall size of the RF transistor amplifier die. Moreover, in some higher frequency applications, even very short bond wires having large cross-sectional areas may have too much inductance such that the matching networks cannot, for example, properly terminate the second or third order harmonics. While the RF transistor amplifiers may be implemented as monolithic microwave integrated circuit ("MMIC") devices in order to avoid the problem of too much inductance in the bond wires, MMIC RF amplifiers are more expensive to fabricate and can only be used in the frequency range of the matching circuits, reducing flexibility.

Moreover, wire bonding equipment that is typically used for high volume manufacturing may have a tolerance of +/−1 mil, meaning that the length of any particular bond wire may vary by as much 4 mils (i.e., +/−1 mil on each end of the bond wire). For high frequency applications, the variation in inductance associated with 4 mils of a bond wire may be significant, and hence the performance of the matching circuits may be degraded if the bond wires are 1-2 mils too short or long from a desired nominal length.

Pursuant to embodiments of the present invention, Group III nitride-based RF transistor amplifiers are provided that include RF transistor amplifier dies that have their gate terminals, drain terminals, and source terminals all located on the upper side of the RF transistor amplifier die. The RF transistor amplifiers may not include bond wires for the gate and/or drain connections, which may reduce an amount of inductance present in the circuit. Since all three of the gate, drain and source terminals are on the upper side of the RF transistor amplifier die, the RF transistor amplifiers according to embodiments of the present invention may be mounted in a flip chip arrangement in which the RF transistor amplifier die may be mounted on another substrate, such as an interconnect structure, in a stacked arrangement. The interconnect structure may include, for example, other circuit elements of the RF transistor amplifier such as, for example, impedance matching and/or harmonic termination circuitry.

In some embodiments, a coupling element may be connected directly to the gate, drain, and/or source terminals of the RF transistor amplifier die. In some embodiments, the coupling element may physically and electrically connect the gate, drain, and/or source terminals of the RF transistor amplifier die to the interconnect structure. In other embodiments, the interconnect structure may be omitted, and the coupling element may physically and electrically connect the gate, drain, and/or source terminals of the RF transistor amplifier die to separately mounted components and/or leads of the RF transistor amplifier.

Moreover, since the source terminal may be provided on the upper side of the RF transistor amplifier die, one or more connections to ground may be present at the upper side of the RF transistor amplifiers according to embodiments of the present invention. These ground connections may be used to implement the RF transmission line connections to the gate terminal and/or to the drain terminal using shielded (i.e., ground-signal-ground) transmission line structures. Herein, a "transmission line structure" refers to any physical structure that includes at least two conductive elements that are configured as a transmission path for RF signals. Examples of transmission line structures include microstrip transmission lines, stripline transmission lines, conductive pillars, vias, bumps, pads, sheets and the like (e.g., a pair of conductive pillars may form a transmission line structure). Herein, a "shielded transmission line structure" refers to an RF transmission line structure that includes a signal carrying conductor with one or more grounded conductors that is/are adjacent at least two opposed sides thereof, as well as transmission line structures in which three or more grounded conductors generally surround a signal carrying conductor. For example, a shielded transmission line structure may be formed by positioning first and second grounded conductors on first and second opposed sides of the signal carrying conductor or by forming a single conductor that wraps around the signal carrying conductor so that it is on opposed sides thereof. As another example, a shielded transmission line structure may be formed by positioning first through third grounded conductors in a triangle around a signal carrying conductor. Any number of separate grounded conductors may be included in the shielded transmission line structures according to embodiments of the present invention, including, one, two, three, four, five, six or even more grounded conductors. As yet another example, an annular grounded conductor may be formed in a dielectric layer that surrounds (or partly surrounds) a signal carrying conductor that is formed in the dielectric layer. Note that herein a grounded conductor is considered to be on two opposed sides of a signal carrying conductor if an axis exists that extends through two different portions of the grounded conductor and the signal carrying conductor. Similarly, a pair of grounded conductors are on two opposed sides of a signal carrying conductor if an axis exists that extends through both grounded conductors and the signal carrying conductor. In some embodiments, additional shielded transmission line structures such as, for example, stripline or coplanar waveguide structures may be provided in the interconnect structure. The use of the shielded transmission line structures for the connections between the RF transistor amplifier die and the interconnect structure and/or within the interconnect structure may provide increased signal isolation, reduced insertion loss and/or improved impedance matching. This may significantly improve the overall performance of the RF transistor amplifier.

Pursuant to some embodiments of the present invention, RF transistor amplifiers are provided that include an RF transistor amplifier die having a semiconductor layer structure, a coupling element on an upper surface of the semiconductor layer structure, and an interconnect structure on an upper surface of the coupling element so that the RF transistor amplifier die and the interconnect structure are in a stacked arrangement. The coupling elements on these RF transistor amplifiers include a first shielded transmission line structure. The RF transistor amplifier die may include a gate terminal, a drain terminal, and a source terminal on the upper surface of the semiconductor layer structure. The semiconductor layer structure may be a Group III nitride-based semiconductor layer structure.

In some embodiments, the first shielded transmission line structure may comprise a first conductive pillar that is electrically connected to a first input/output terminal of the RF transistor amplifier die and first and second conductive ground pillars that are on opposed sides of the first conductive pillar, the first and second conductive ground pillars electrically connected to a ground terminal of the RF transistor amplifier die. The first shielded transmission line structure may optionally include third and fourth conductive ground pillars that are on opposed sides of the first conductive pillar, the third and fourth conductive ground pillars electrically connected to the ground terminal of the RF transistor amplifier. The first through fourth conductive ground pillars may surround the first conductive pillar. Moreover, in some embodiments, the first conductive pillar may vertically overlap an active region of the RF transistor amplifier die and the first conductive ground pillar may vertically overlap a manifold of the RF transistor amplifier die or some other portion of the RF transistor amplifier die that is outside an active region of the RF transistor amplifier die.

In some embodiments, the RF transistor amplifiers may further include an interconnect structure that may be connected to the RF transistor amplifier die via the coupling element. The interconnect structure may include a second shielded transmission line structure such as a stripline transmission line segment, a coplanar waveguide transmission line segment or a grounded coplanar waveguide transmission line segment. The interconnect structure may comprise, for example, a redistribution layer laminate structure or a printed circuit board. One or more circuit elements such as surface mount capacitors or inductors may be mounted on the interconnect structure.

Pursuant to further embodiments of the present invention, RF transistor amplifiers are provided that include an RF transistor amplifier die having a Group III nitride-based semiconductor layer structure, gate and drain fingers extending on an upper surface of the semiconductor layer structure, and a first shielded transmission line structure extending perpendicularly to the upper surface of the semiconductor layer structure.

Pursuant to still further embodiments of the present invention, RF transistor amplifiers are provided that include an RF transistor amplifier die having a Group III nitride-based semiconductor layer structure and gate fingers, drain fingers and source fingers extending on an upper surface of the semiconductor layer structure, and a plurality of conductive pillars extending perpendicular to the upper surface of the semiconductor layer structure, the conductive pillars including a first conductive pillar that is electrically connected to either the gate fingers or the drain fingers and first and second conductive ground pillars that are on opposed sides of the first conductive pillar, the first and second conductive ground pillars electrically connected to the source fingers. These RF transistor amplifiers may further include comprising an interconnect structure, wherein the conductive pillars extend between the interconnect structure and the RF transistor amplifier die and electrically connect the interconnect structure to the RF transistor amplifier die. The first and second conductive ground pillars and at least one additional conductive ground pillar surround the first conductive pillar.

Pursuant to yet additional embodiments of the present invention, RF transistor amplifiers are provided that include an RF transistor amplifier die comprising a gate terminal, a drain terminal, and a source terminal on a first surface of the RF transistor amplifier die and an interconnect structure that is in a stacked arrangement with the RF transistor amplifier die and electrically connected thereto by a shielded transmission line structure.

Pursuant to still further embodiments of the present invention, RF transistor amplifiers are provided that include an RF transistor amplifier die comprising a gate terminal, a drain terminal, and a source terminal on a first surface of the RF transistor amplifier die and an interconnect structure that is in a stacked arrangement with the RF transistor amplifier die, the interconnect structure including a shielded transmission line structure, wherein a ground conductor of the shielded transmission line structure is electrically connected to the source terminal and a signal conductor of the shielded transmission line structure is electrically connected to one of the gate terminal and the drain terminal.

Embodiments of the present invention will now be discussed in further detail with reference to FIGS. 2-12.

Figure 2:
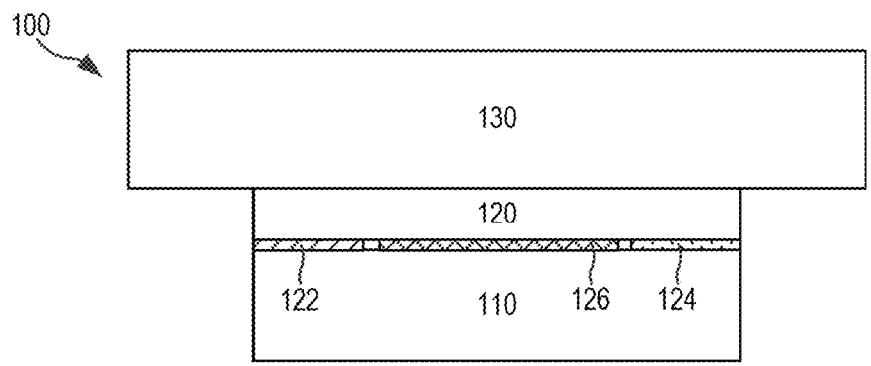
FIG. 2 is a schematic cross-sectional view illustrating the components of various RF transistor amplifiers according to embodiments of the present invention.

FIG. 2 is a schematic cross-sectional view of an RF transistor amplifier 100 according to embodiments of the present invention. As shown in FIG. 2, the RF transistor amplifier 100 includes an RF transistor amplifier die 110, a coupling element 120, and an interconnect structure 130. The RF transistor amplifier die 110 may comprise a Group III nitride-based RF transistor amplifier die that includes a plurality of unit cell transistors (not shown). Each unit cell transistor may comprise a field effect transistor that has a gate, drain and source. The unit cell transistors may be electrically connected in parallel. The RF transistor amplifier die 110 may include a gate terminal 122, a drain terminal 124 and a source terminal 126 that connect to the gate fingers, drain fingers and source fingers of the unit cell transistors. The gate terminal 122, drain terminal 124, and source terminal 126 may all be located on the top side of the RF transistor amplifier die 110.

As is further shown in FIG. 2, the coupling element 120 is provided on the upper surface of the RF transistor amplifier die 110, and the interconnect structure 130 is provided on the upper surface of the coupling element 120. Thus, the coupling element 120 may be interposed between the RF transistor amplifier die 110 and the interconnect structure 130. In some embodiments, the coupling element may comprise conductive structures (e.g., metal pillars and pads) that are formed during wafer level processing (i.e., before a semiconductor wafer that includes a plurality of RF transistor amplifier dies 110 is diced into individual RF transistor amplifier dies 110) using conventional semiconductor processing techniques and/or other methods. In such embodiments, underfill material such as capillary underfill material may be injected to fill in the space between the conductive structures of the coupling element 120. It should be noted that even if the coupling element is formed as part of wafer level processing, it will be described herein as being a separate element from the RF transistor amplifier die 110 for convenience of description. In other embodiments, the coupling element 120 may be a separate structure such as, for example, a redistribution layer ("RDL") laminate structure and/or an interposer that may be formed separately from the RF transistor amplifier die, and which may be attached to the RF transistor amplifier die 110 either during a wafer level processing step (i.e., before the wafer is diced into individual RF transistor amplifier dies 110) or may be applied to an individual RF transistor amplifier die 110. It should also be noted that the interconnect structure 130 may be omitted in some embodiments of the present invention, as will be described in more detail below.

Figure 3A:
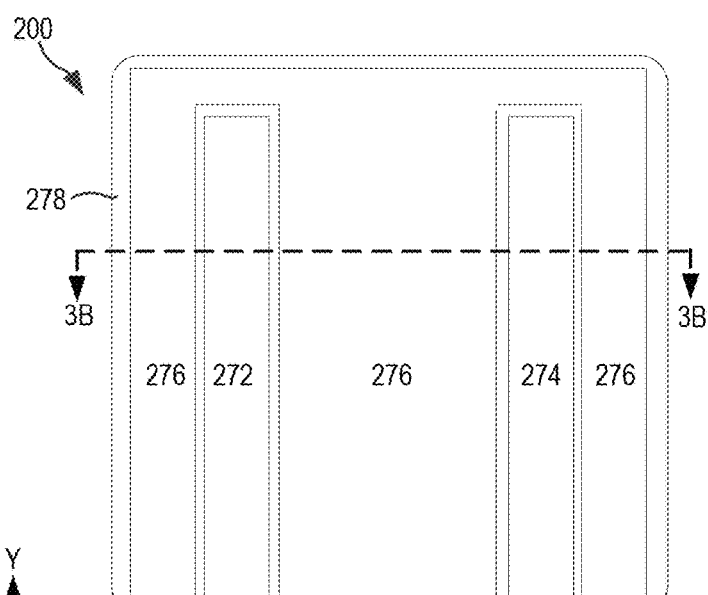
FIG. 3A is a schematic plan view of a Group III nitride-based RF transistor amplifier die according to certain embodiments of the present invention.
Figure 3B:
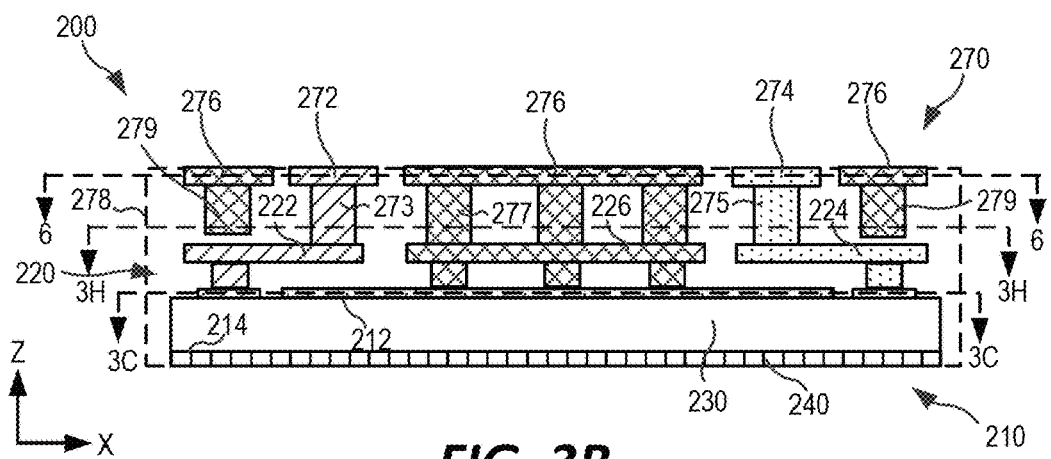
FIG. 3B is a schematic cross-sectional view taken along line 3B-3B of FIG. 3A.
Figure 3C:
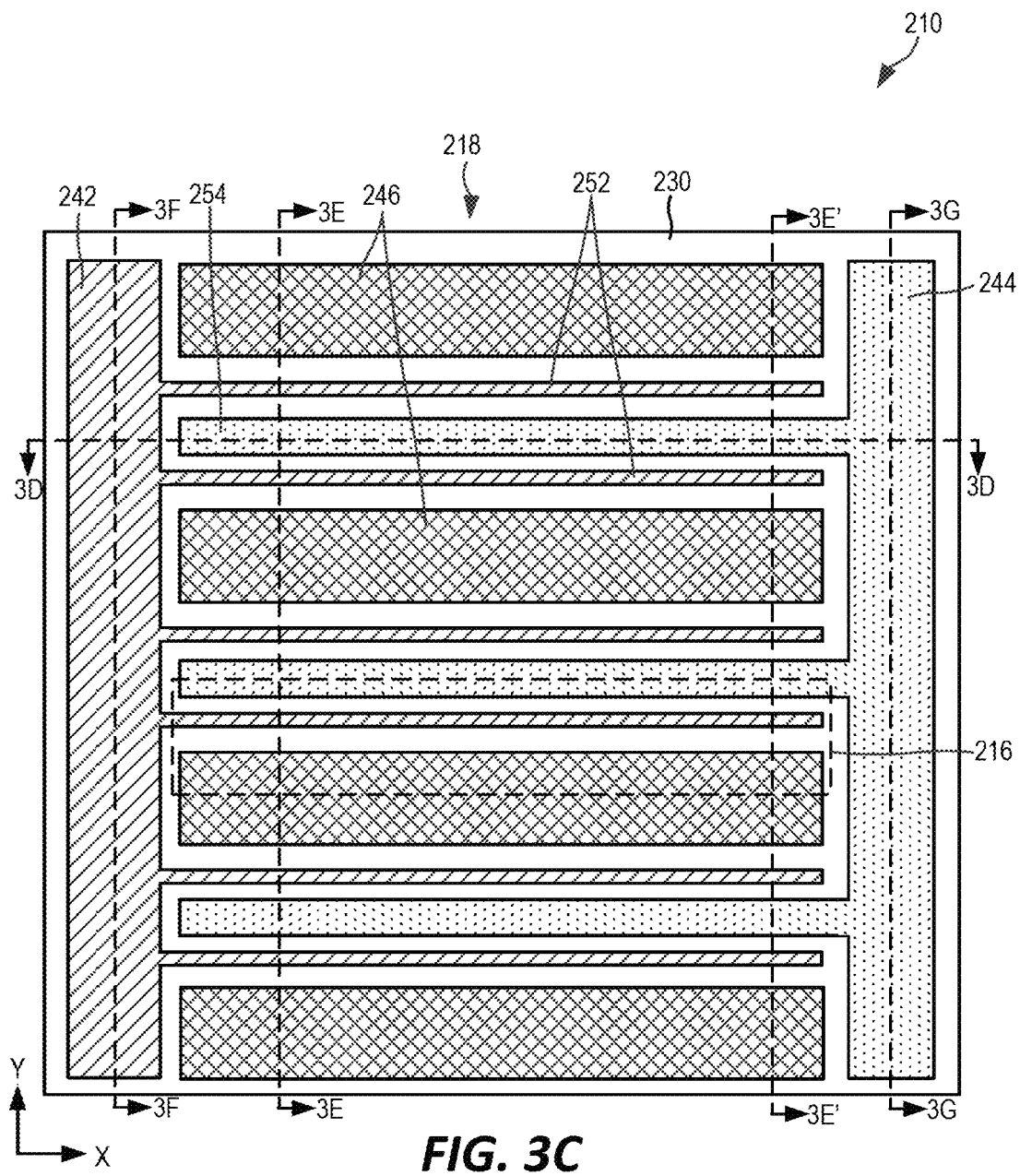
FIG. 3C is a schematic plan view taken along line 3C-3C of FIG. 3B that illustrates the top side metallization that directly contacts the semiconductor layer structure.
Figure 3D:
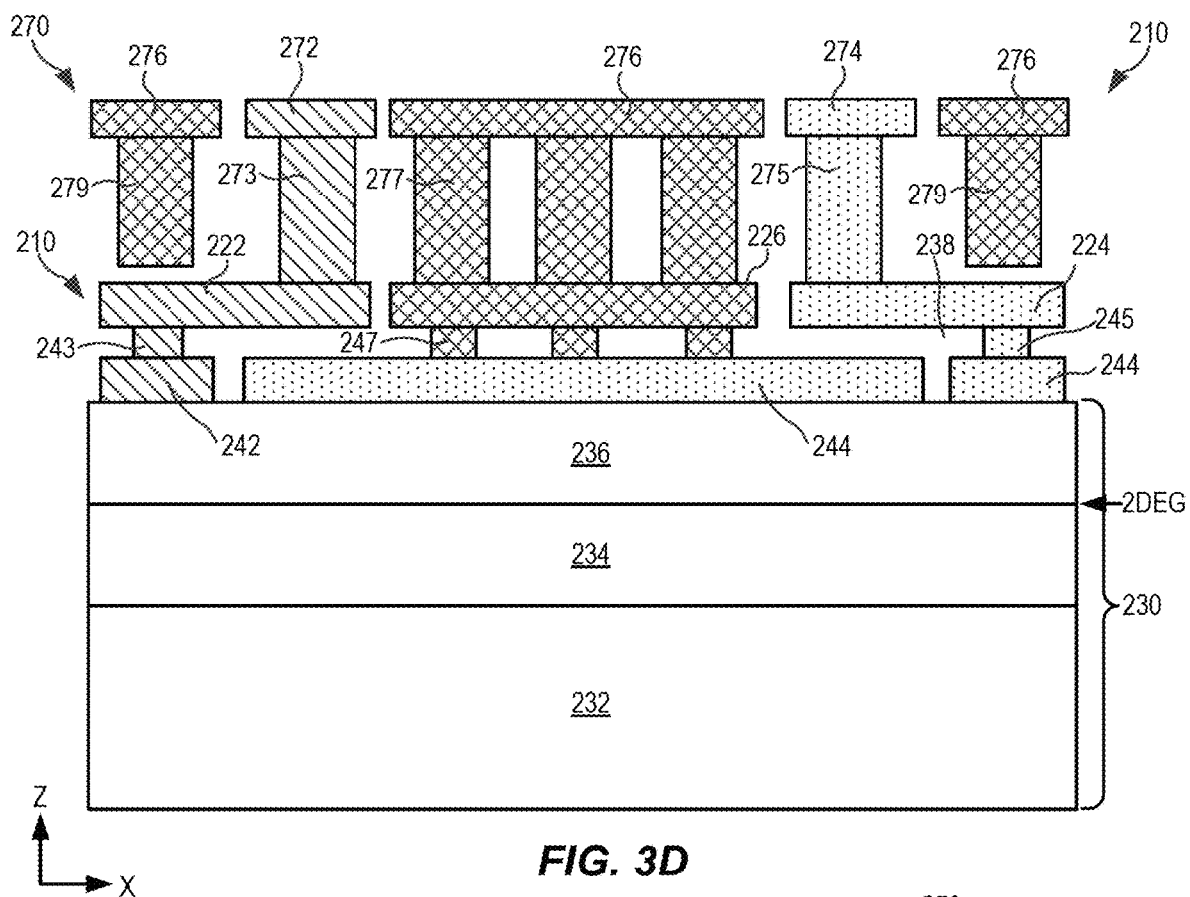
FIG. 3D is a schematic cross-sectional view taken along line 3D-3D of FIG. 3C.
Figure 3E:
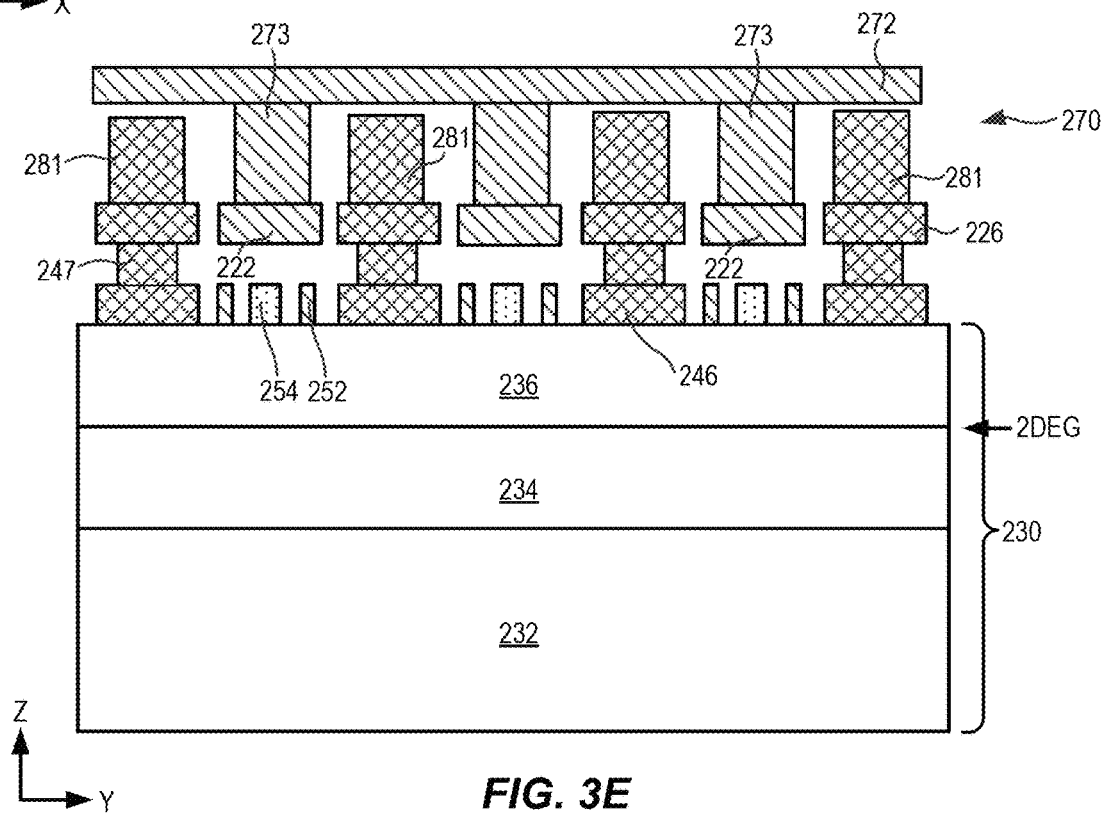
FIG. 3E is a schematic cross-sectional view taken along line 3E-3E of FIG. 3C.
Figure 3F:
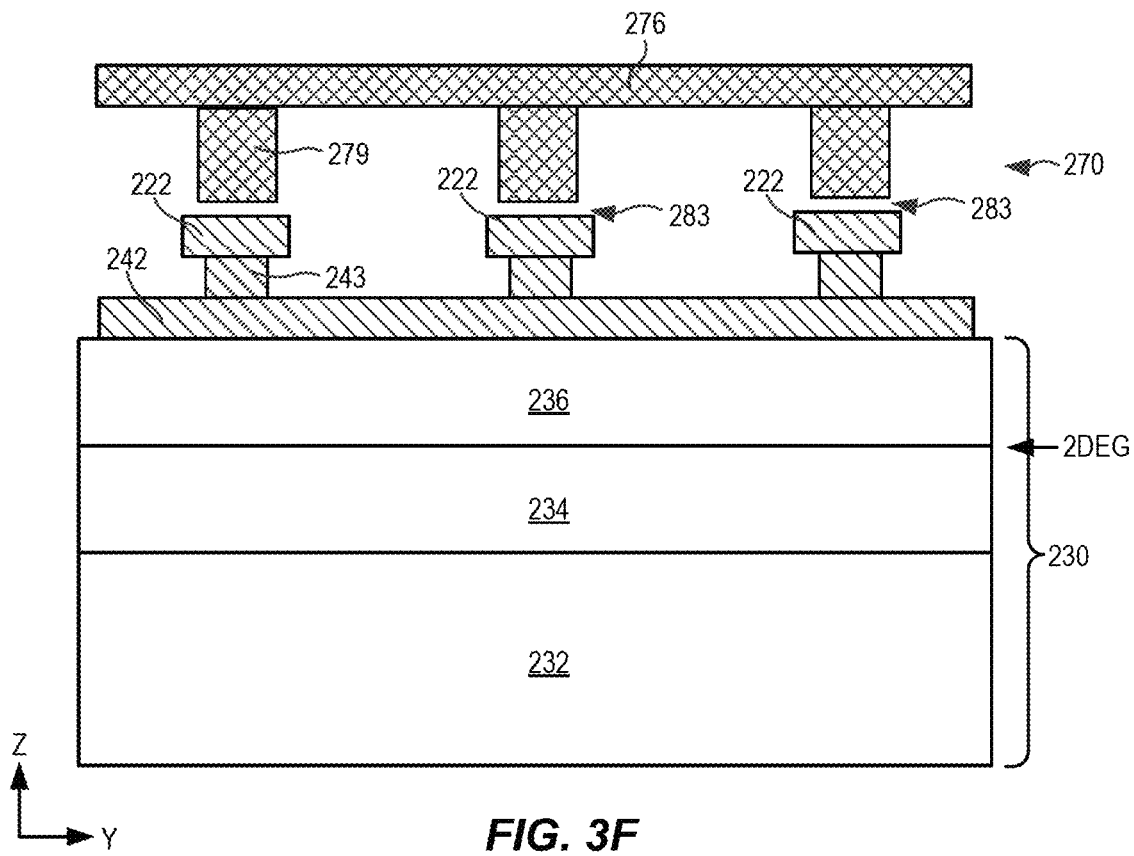
FIG. 3F is a schematic cross-sectional view taken along line 3F-3F of FIG. 3C.
Figure 3G:
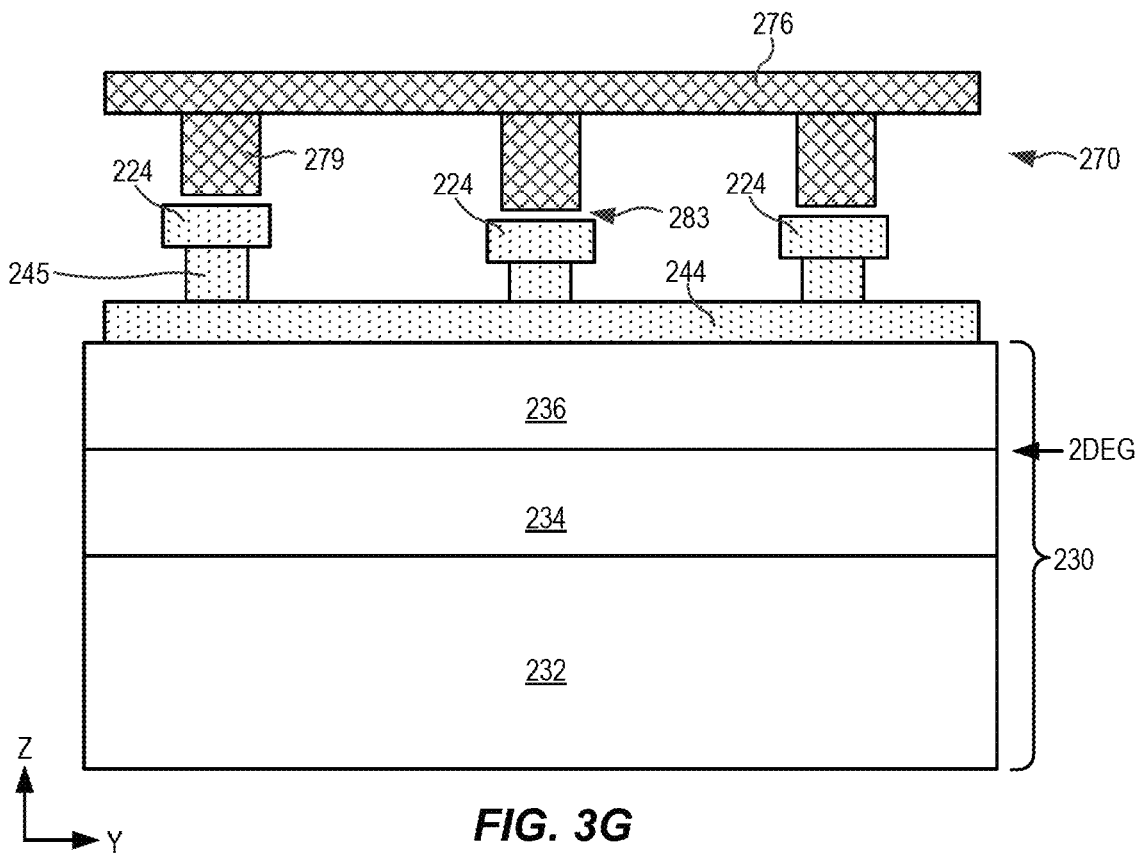
FIG. 3G is a schematic cross-sectional view taken along line 3G-3G of FIG. 3C.
Figure 3H:
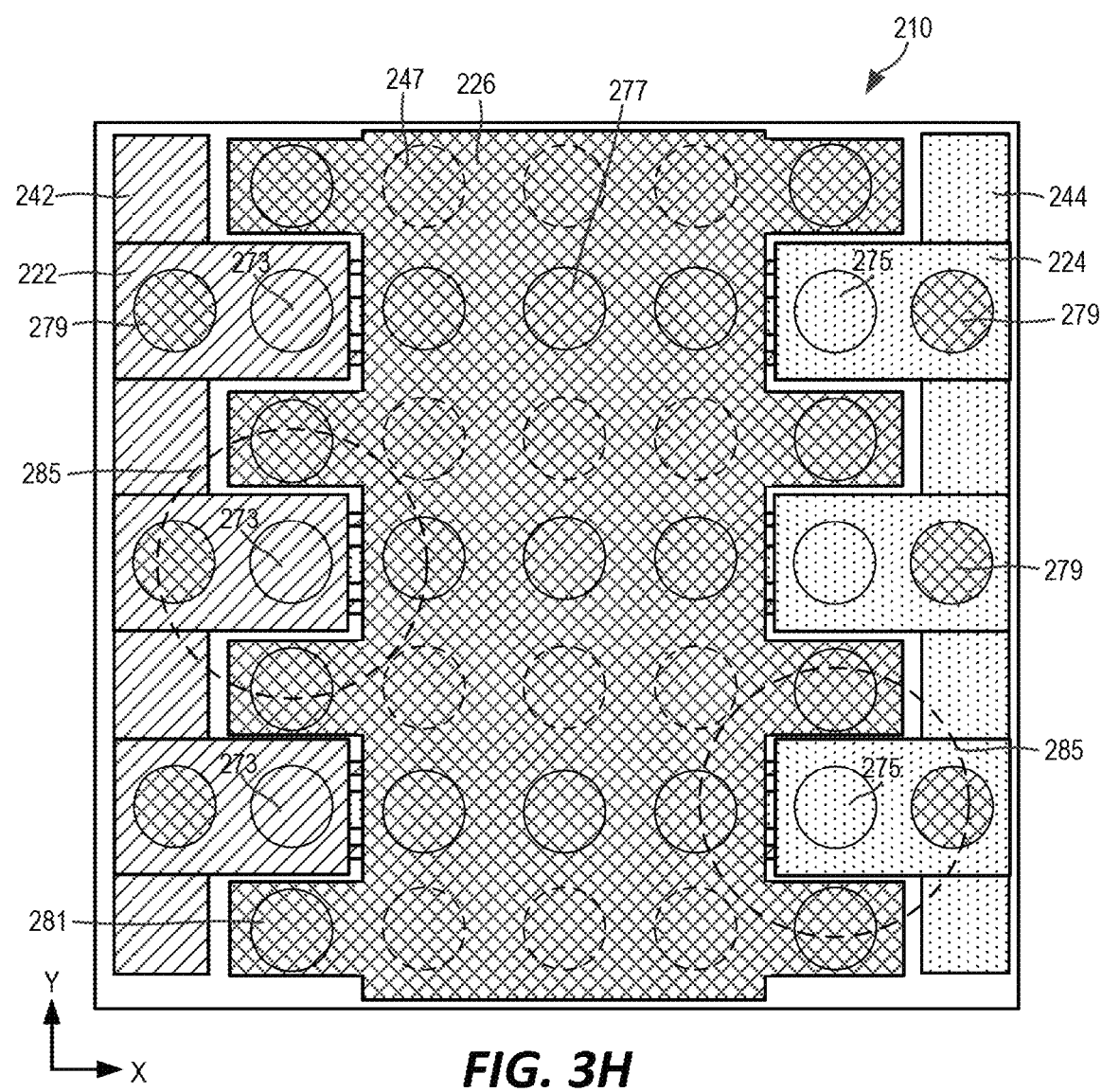
FIG. 3H is a schematic cross-sectional view taken along line 3H-3H of FIG. 3B.
Figure 3I:
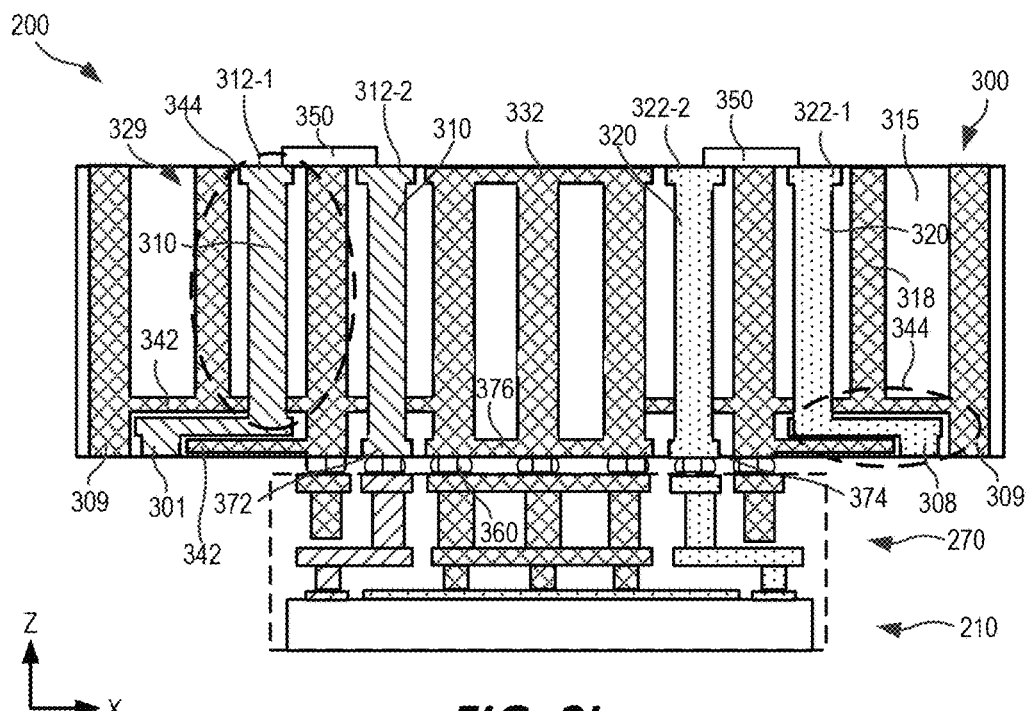
FIG. 3I is a schematic cross-sectional view of the Group III nitride-based RF transistor amplifier of FIGS. 3A-3H mounted on an interconnect structure.

FIGS. 3A-3I depict a Group III nitride-based RF transistor amplifier 200 according to certain embodiments of the present invention. In particular, FIG. 3A is a schematic plan view of a Group III nitride-based RF transistor amplifier 200. FIG. 3B is a schematic cross-sectional view of the RF transistor amplifier 200 of FIG. 3A that is taken along line 3B-3B of FIG. 3A. FIG. 3C is a schematic plan view taken along line 3C-3C of FIG. 3B that illustrates the portion of the top side metallization that directly contacts the semiconductor layer structure of the RF transistor amplifier die 210 that is included in RF transistor amplifier 200. FIGS. 3D through 3G are schematic cross-sectional views of the RF transistor amplifier 200 that are taken along lines 3D-3D through 3G-3G of FIG. 3C, respectively. FIG. 3H is a schematic cross-sectional view taken along line 3H-3H of FIG. 3B. FIG. 3I is a cross-sectional view of the RF transistor amplifier 200 of FIGS. 3A-3H mounted on an interconnect structure 300 such as a printed circuit board. The RF transistor amplifier 200 may or may not include the interconnect structure 300 depending upon the particular application.

Referring to FIGS. 3A and 3B, the Group III nitride-based RF transistor amplifier 200 may include an RF transistor amplifier die 210 and a coupling element 270 that is mounted on the upper surface of RF transistor amplifier die 210. As will be discussed further with reference to FIG. 3I, the RF transistor amplifier 200 may further include an interconnection structure 300. The coupling element 270 may be between the RF transistor amplifier die 210 and the interconnection structure 300 and may electrically connect the RF transistor amplifier die 210 to the interconnection structure 300. The RF transistor amplifier die 210, the coupling element 270 and the interconnection structure 300 may be in a stacked relationship or arrangement.

The RF transistor amplifier die 210 incudes a semiconductor layer structure 230 that has a top side 212 and a back side 214. A top side metallization structure 220 is formed on the top side 212 of the semiconductor layer structure 230 and a bottom side thermal layer 240 is formed on the bottom side 214 of the semiconductor layer structure 230. The top side metallization structure 220 comprises a gate terminal 222, a drain terminal 224, and a source terminal 226, as well as other metallization that will be discussed in further detail below. It should be noted that while the gate, drain and source terminals 222, 224, 226 are (mostly) described herein as each being a single terminal, any of these terminals may alternatively include multiple separate terminals that are electrically connected to one another. The RF transistor amplifier die 210 may be a HEMT-based RF transistor amplifier die, in which case the semiconductor layer structure 230 may include at least a channel layer and a barrier layer, as will be discussed in greater detail below.

The gate terminal 222 may receive RF signals from a first external circuit that are input to the RF transistor amplifier die 210, and the drain terminal 224 may output RF signals that have been amplified by RF transistor amplifier die 210 to a second external circuit. The gate and drain terminals 222, 224 may be generically referred to herein as input/output terminals.

The coupling element 270 is formed on top of the RF transistor amplifier die 210 on the top side metallization structure 220. The coupling element 270 may be used to connect the RF transistor amplifier die 210 to another structure, such as an interconnect structure (see FIG. 3I). As described above, in some embodiments, the coupling element 270 may be formed during the wafer level processing using semiconductor and/or non-semiconductor processing techniques. In other embodiments, the coupling element 270 may comprise a separate structure such as, for example, an RDL laminate structure or an interposer. An RDL laminate structure refers to a substrate that has conductive layer patterns and/or conductive vias. As will be discussed in detail below, according to embodiments of the present invention, the coupling element 270 may include shielded ground-signal-ground transmission line structures that may exhibit increased signal isolation, reduced insertion loss and/or improved impedance matching.

The coupling element 270 may be used to connect the RF transistor amplifier die 210 to another structure, such as an interconnect structure. FIG. 3I illustrates how the coupling element 270 may be used to connect the RF transistor amplifier die 210 to an interconnect structure 300 in the form of a printed circuit board.

As shown in FIGS. 3A-3B, the coupling element 270 includes a gate connection pad 272, a drain connection pad 274, and a source connection pad 276. Each of these connection pads 272, 274, 276 may comprise, for example, an exposed copper pad, though the present invention is not limited thereto. The gate connection pad 272 may be electrically coupled to the gate terminal 222 by one or more conductive gate pillars 273. Similarly, the drain connection pad 274 may be electrically coupled to the drain terminal 224 by one or more conductive drain pillars 275, and the source connection pad 276 may be electrically coupled to source terminal(s) 226 by one or more conductive source pillars 277. Additional conductive source pillars 279 may also be provided that will be discussed in further detail below.

In some embodiments, the combination of the RF transistor amplifier die 210 and the coupling element 270 may have a fan-in configuration. The fan-in configuration may be used to position the gate connection pad 272 inwardly (i.e., closer to the middle of the coupling element when viewed in plan view) with respect to the gate terminal 222 and/or to position the drain connection pad 274 inwardly of the drain terminal 224. However, the present invention is not limited to devices having such fan-in configurations. For example, as will be discussed below with reference to FIG. 5A-5F, in other embodiments, the connections may be neither fan-in nor fan-out, and it will appreciated that fan-out connections are also possible.

In some embodiment the coupling element 270 may be formed as part of a wafer level processing operation. For example, the coupling element 270 can be formed by forming the conductive gate pillars 273 on the gate terminal 222, the conductive drain pillars 275 on the drain terminal 224, and the conductive source pillars 277 on the source terminal 226. In some embodiments, the conductive pillars 273, 275, 277 may comprise copper pillars. For example, the conductive pillars may be formed by electroplating copper seed layers on the gate, drain and source terminals 222, 224, 226 and using one or more masks to form the conductive pillars 273, 275, 277 thereon. The gate connection pad 272, the drain connection pad 274, and the source connection pad 276 may then be formed on the respective gate, drain and source pillars 273, 275, 277. The conductive pillars 273, 275, 277 and the connection pads 272, 274, 276 may be disposed at least partially within an encapsulating structure 278, which may comprise a dielectric material. A wide variety of dielectric materials may be used including, for example, silicon oxide, silicon nitride, a polymer, a molding compound, and/or a combination thereof. The dielectric material may be processed (e.g., planarized) to expose the gate connection pad 272, the drain connection pad 274, and/or the source connection pad 276. When the coupling element 270 is formed using wafer level processes, a plurality of coupling elements 270 may be formed (one on top of each RF transistor amplifier die 210 included in the wafer), and the RF transistor amplifier die 210 may then be singulated with individual coupling elements 270 formed thereon.

In some embodiments, the coupling element 270 may be formed in a chip-first or chip-last process. In a chip-first process, the coupling element 270 may be formed directly on the RF transistor amplifier die 210 (or on a wafer including the RF transistor amplifier die 210). For example, a seed layer may be deposited (e.g., on one or more of the gate terminal 222, the drain terminal 224, and the one or more source terminal(s) 226). The seed may then be patterned and electroplated to form a layer of conductive material. This process may be repeated multiple times to from the conductive pillars 273, 275, 277 and connection pads 272, 274, 276. The conductive pillars 273, 275, 277 and connection pads 272, 274, 276 may then be enclosed in the encapsulating structure 278 to form the coupling element 270.

In a chip-last process, the coupling element 270 may be formed on a temporary carrier layer (not shown). The conductive pillars 273, 275, 277 and connection pads 272, 274, 276 may be formed in a manner similar to the chip-first process on the temporary carrier layer. When complete, the coupling element 270 may be decoupled from the temporary carrier layer and then coupled to the RF transistor amplifier die 210 (either as a wafer level process or a chip level process). For example, the coupling element 270 may be coupled to one or more of the gate terminal 222, the drain terminal 224, and the source terminal 226 (e.g., via solder).

Other coupling elements 270 may alternatively be used such as, for example, a printed circuit board (e.g., a multi-layer printed circuit board), an RDL laminate structure, a ceramic substrate that includes conductive vias and/or pads, or any coupling that can make suitable electrical connections to the RF transistor amplifier die 210. In some configurations, as will be discussed further herein, the coupling element 270 may be omitted.

The arrangement of conductive pillars 273, 275, 277 and connection pads 272, 274, 276 illustrated in FIGS. 3A-3B are merely an example, and other arrangements are possible without deviating from the present invention.

In embodiments where the semiconductor layer structure 230 of the RF transistor amplifier die 210 has a high thermal conductivity, the back side of the RF transistor amplifier die 210 can be mounted on a thermally conductive carrier substrate or submount, such as a metal slug, leadframe, or flange, to provide improved thermal dissipation of the heat generated by the RF transistor amplifier die from the amplifier package. A thermal layer 240 may be formed on the back side 214 of the semiconductor layer structure 230. The thermal layer 240 may be configured to facilitate thermal transfer between the RF transistor amplifier die 210 and the carrier substrate or submount. In some embodiments, the thermal layer 240 may be omitted. In some embodiments, the thermal layer 240 may be a die attach layer, such as a eutectic layer. The thermal layer 240 can be a metal layer to form a eutectic or other metal bond. In some embodiments, the thermal layer 240 can be a thermal adhesive.

FIG. 3C is a schematic plan view of RF transistor amplifier die 210 taken along line 3C-3C of FIG. 3B which shows the portion of the top side metallization structure 220 that contacts the semiconductor layer structure 230. The RF transistor amplifier die 210 may comprise a Group III nitride-based HEMT RF transistor amplifier that includes a plurality of unit cell transistors 216 that are electrically connected to each other in parallel.

As shown in FIG. 3C, the RF transistor amplifier die 210 includes a gate manifold 242 and a drain manifold 244, a plurality of gate fingers 252, a plurality of drain fingers 254 and a plurality of source fingers 246, all of which may be formed on an upper surface of the semiconductor layer structure 230. The gate manifold 242 and gate fingers 252 are part of a gate electrode of the RF transistor amplifier die 210. The gate manifold 242 and the gate fingers 252 may be implemented as a first monolithic metal pattern, but the present invention is not limited thereto. The drain manifold 244 and drain fingers 254 are part of a drain electrode of the RF transistor amplifier die 210, and may be implemented as a second monolithic metal pattern, but the present invention is not limited thereto. The region between the gate manifold 242 and the drain manifold 242 that includes the unit cell transistors 216 is referred to as the active region 218 of RF transistor amplifier die 210.

The gate fingers 252 may be formed of materials that are capable of making a Schottky contact to a Group III nitride-based semiconductor material, such as Ni, Pt, Cu, Pd, Cr, W, and/or WSiN. The drain fingers 254 and source fingers 246 may include a metal, such as TiAlN, that can form an ohmic contact to Group III nitride-based materials. A dielectric layer (or a series of dielectric layers) that help isolate the gate manifold/fingers 242, 252, the drain manifold/fingers 244, 254 and the source fingers 246 from each other is not shown in FIG. 3C to better illustrate the elements of the RF transistor amplifier die 210.

One of the unit cell transistors 216 is shown in FIG. 3C. The unit cell transistor 216 includes a gate finger 252, a drain finger 254, and a source finger 246 along with the underlying portion of the semiconductor layer structure 230. Since all of the gate fingers 252 are electrically connected to a common gate manifold 242, all of the drain fingers 254 are electrically connected to a common drain manifold 244, and all of the source fingers 246 are electrically connected together via the source terminal 226 (discussed below), it can be seen that the unit cell transistors 216 are all electrically connected together in parallel.

The unit cell transistors 216 may be HEMT devices. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess," issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

Referring to FIGS. 3D-3G, the semiconductor layer structure 230 includes a growth substrate 232 and a plurality of semiconductor layers formed thereon. In the depicted embodiment, a total of two semiconductor layers are shown on the growth substrate 232, namely a channel layer 234 and a barrier layer 236 that is on a top side of the channel layer 234. The semiconductor layer structure 230 may include additional semiconductor and/or non-semiconductor layers such as optional buffer, nucleation, and/or transition layers (not shown) that may be provided on the growth substrate 232 beneath the channel layer 234. For example, an AlN buffer layer may be included to provide an appropriate crystal structure transition between an SiC growth substrate 232 and the remainder of the semiconductor layer structure 230. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein. The growth substrate 232 may comprise, for example, a 4H—SiC or 6H—SiC substrate. In other embodiments, the growth substrate may be or comprise a different semiconductor material (e.g., a Group III nitride-based material, Si, GaAs, ZnO, InP) or a non-semiconductor material (e.g., sapphire).

SiC has a much closer crystal lattice match to Group III nitrides than does sapphire ($Al_2O_3$) or silicon, which are very common substrate materials for Group III nitride devices. The closer lattice match of SiC may result in Group III nitride films of higher quality than those generally available on sapphire or silicon. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

In some embodiments, the channel layer 234 is a Group III nitride material, such as $Al_xGa_{1-x}N$ where 0≤x<1, provided that the energy of the conduction band edge of the channel layer 234 is less than the energy of the conduction band edge of the barrier layer 236 at the interface between the channel and barrier layers 234, 236. In certain embodiments of the present invention, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 2 nm. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN or combinations of layers thereof with a thickness of between about 0.1 nm and about 30 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. In certain embodiments, the barrier layer 236 is undoped or doped with an n-type dopant to a concentration less than about $10^{19}$ cm$^{-3}$. In some embodiments of the present invention, the barrier layer 236 is Al$_x$Ga$_{1-x}$N where 0<x<1. In particular embodiments, the aluminum concentration is about 25%. However, in other embodiments of the present invention, the barrier layer 236 comprises AlGaN with an aluminum concentration of between about 5% and about 100%. In specific embodiments of the present invention, the aluminum concentration is greater than about 10%. The barrier layer 236 may be implemented as a graded layer and/or as multiple layers in some embodiments.

Due to the difference in bandgap between the barrier layer 236 and the channel layer 234 and piezoelectric effects at the interface between the barrier layer 236 and the channel layer 234, a two dimensional electron gas (2DEG) is induced in the channel layer 234 at a junction between the channel layer 234 and the barrier layer 236. The 2DEG acts as a highly conductive layer that allows conduction between the source region of each unit cell transistor 216 and its associated drain region, where the source region is the portion of the semiconductor layer structure 230 that is directly underneath the source finger 246 and the drain region is the portion of the semiconductor layer structure 230 that is directly underneath the corresponding drain finger 254.

An interlayer insulating layer (not shown) may be formed over the gate fingers 252, the drain fingers 254, and the source fingers 246. The interlayer insulating layer may include a dielectric material, such as SiN, SiO$_2$, etc.

As shown, for example, in FIG. 3D, the gate terminal 222 may be physically and electrically connected to the gate manifold 242 by conductive vias 243, the drain terminal 224 may be physically and electrically connected to the drain manifold 244 by conductive vias 245, and the source terminal 226 may be physically and electrically connected to the source fingers 246 by conductive vias 247. Though the various terminals 222, 224, 226 are illustrated as being directly connected to the gate/drain manifold 242, 244 and/or source fingers 246, it will be understood that, in some embodiments, intermediate elements may be present. For example, in some embodiments, capacitors, inductors, resistors, etc., may be coupled between the terminal and the respective manifold and/or finger. As an example, a capacitor may formed on the surface of the RF transistor amplifier die 210 that is coupled to the drain manifold 244, and the drain terminal 224 may be coupled to the capacitor.

Since all of the terminals 222, 224, 226 are positioned on the top side of the RF transistor amplifier die 210, conductive vias are not required that extend through the semiconductor layer structure 230 to the back side of the RF transistor amplifier die 210. Without vias on the back side of the RF transistor amplifier die 210 connecting the source to a grounded electrically conductive submount, it becomes possible to omit the submount altogether or to use a non-conductive submount. Furthermore, the back side of the RF transistor amplifier die 210 may be coupled to a thermally conductive submount or layer 240 such as a heat sink to provide improved thermal dissipation. In some embodiments, the thermal layer 240 may facilitate this thermal coupling. When SiC is used as a substrate material (for substrate 232), the thermal properties of the package can be further improved due to the improved thermal conductivity of SiC.

Moreover, the placement of all of the terminals 222, 224, 226 on the top side of the RF transistor amplifier die 210, allows for the use of the coupling element 270, which can bring all of the transistor connections to respective connection pads. This may allow the RF transistor amplifier die 210 to be further coupled to other elements of the circuit (e.g., other routing elements, grounding elements, harmonic and/or input/output impedance matching elements) through the use of connection methods that avoid bonding wires, such as solder. As will be discussed in detail below, positioning all of the terminals on the top side of the RF transistor amplifier die 210 also allows for the use of shielded transmission line structures within the coupling element 270 which may provide various advantages including increased signal isolation, reduced insertion loss and/or improved impedance matching.

FIG. 3E is a cross-section taken through the gate pillars 273. As shown, each gate pillar 273 extends between the gate terminal 222 and the gate connection pad 272. A plurality of source pillars 281 are also shown in FIG. 3E. Each source pillar 281 extends upwardly from the source terminal 226. The source pillars 281, however, are shorter than the source pillars 277 described above so that the gate connection pad 272 can extend above the source pillars 281 and be electrically isolated therefrom. In the depicted embodiment, the gate pillars 273 are positioned above the gate and drain fingers 252, 254, but embodiments of the present invention are not limited thereto. A cross-section line 3E'-3E' is also shown in FIG. 3C. A cross-section taken along this line will look identical to FIG. 3E, except that the gate terminal 222 would be the drain terminal 224, the gate pillars 273 would be drain pillars 275, and the gate connection pad 272 would be the drain connection pad 274.

FIG. 3F illustrates an example of the metallization that is formed above the gate manifold 242. As shown, individual gate terminals 222 are provided above the gate manifold 242 and electrically connected thereto by gate vias 243. While multiple separate gate terminals 222 are shown, it will be appreciated that a single larger gate terminal 222 may alternatively be used. As shown in FIGS. 3B and 3H, the gate terminals 222 extend in the x-direction so that the gate pillars 273 may be laterally offset (in the x-direction) from the gate vias 243. This allows source pillars 279 to be formed above the gate manifold 242 (and the gate terminals 222). The source pillars 279 that are formed above the gate terminals 222 may be shorter in length than the source pillars 277 that are formed above the source terminal 226 so that a gap 283 is provided between each source pillar 279 and the respective gate terminals 222, preventing electrical short-circuits therebetween. The source pillars 279 connect to the source connection pad 276, as shown in FIG. 3F.

FIG. 3G illustrates an example of the metallization that is formed above the drain manifold 244. As shown, individual drain terminals 224 are provided above the drain manifold 244 and electrically connected thereto by drain vias 245. While multiple separate drain terminals 224 are shown, it will be appreciated that a single larger drain terminal 224 may alternatively be used. As shown in FIGS. 3B and 3H, the drain terminals 224 extend in the x-direction so that the drain pillars 275 may be laterally offset from the drain vias 245. This allows source pillars 279 to be formed above the drain manifold 244 (and the drain terminals 224). The source pillars 279 that are formed above the drain terminals 224 may be shorter in length than the source pillars 277 that are formed above the source terminal 226 so that a gap 283 is provided between each source pillar 279 and the respective drain terminals 224, preventing electrical short-circuits therebetween. The source pillars 279 connect to the source connection pad 276, as shown in FIG. 3G.

As noted above, FIG. 3H is a cross-sectional view taken along line 3H-3H of FIG. 3B that shows the arrangement of the pillars 273, 275, 277, 279, 281 included in the coupling element 270. As can be seen on the left side of FIG. 3H, three conductive gate pillars 273 extend upwardly from the gate terminals 222 to connect to the gate connection pad 272 (see FIGS. 3A-3B and 3E). RF signals that are to be input to the RF transistor amplifier die 210 are passed from an external structure to the gate connection pad 272, and then are passed through the gate pillars 273 to the gate terminals 222, which feeds the gate signals to the gate fingers 252 through the gate vias 243 and gate manifold 242. Thus, the gate pillars 273 are part of a transmission line that is used to input RF signals to the RF transistor amplifier die 210. As can be seen from FIG. 3H, a source via 277, a source via 279 and two source vias 281 surround each gate pillar 273. Each set of four source vias 277, 279, 281 define a circle that surrounds a respective one of the gate pillars 273, with the source vias 277, 279, 281 separated from one another by about 90 degrees. Since the source of the RF transistor amplifier die 210 is maintained at a ground voltage during operation, each gate pillar 273 and the source vias 277, 279, 281 surrounding it form a shielded transmission line segment 285. The shielded transmission line structure may extend perpendicularly to the upper surface of the semiconductor layer structure 230. The source vias 277, 279, 281 act to reduce the emission of RF energy that passes along the transmission line segment 285 and also shield the gate pillar 273 from RF energy from other sources. The drain pillars 275 have an identical design with each drain pillar 275 being surrounded by four source vias 277, 279, 281 to form another set of shielded transmission lines segments 285 that are used to carry RF signals output by the RF transistor amplifier die 210 to an external circuit element. Two of the shielded transmission line segments 285 are shown by dashed circles in FIG. 3H. By forming the transmission line segments 285 as shielded transmission line segments, the transmission line segments may be better isolated from external RF interference and/or noise, may exhibit reduced insertion losses, and/or may exhibit improved impedance matching (thereby reducing return loss).

In the embodiment of FIGS. 3A-3H, four source pillars 277, 279, 281 surround each gate pillar 273 and each drain pillar 275. The source pillars 277, 279, 281 may also be referred to herein as ground pillars as the source terminal 226 (which is electrically connected to the source pillars 277, 279, 281) is typically coupled to electrical ground during device operation. As shown best in FIGS. 3B and 3H, in order to provide a source pillar 279 on the outside of each gate pillar 273 and each drain pillar 275 the source and drain terminals 222, 224 are each designed to have a fan-in configuration to make room for source pillars 277 on the outside of each gate pillar 273 and drain pillar 275.

As can also be seen from FIG. 3H, each gate pillar 273 and each drain pillar 275 vertically overlap the active region 218 of the RF transistor amplifier die 210. Herein, one element of an RF transistor amplifier "vertically overlaps" another element thereof if an axis that is perpendicular to a major surface of the semiconductor layer structure 230 passes through both elements. As can also be seen from FIG. 3H, the source pillars 279 on the left hand side of the coupling element 270 vertically overlap the gate manifold 242 and the source pillars 279 on the right hand side of the coupling element 270 vertically overlap the drain manifold 244. All of the source pillars 279 may vertically overlap respective portions of the RF transistor amplifier die 210 that are outside the active region 218. It can also be seen from FIG. 3H that one of the gate pillars 273 and one of the source pillars 279 vertically overlap each gate terminal 222, and that one of the drain pillars 275 and one of the source pillars 279 vertically overlap each drain terminal 224.

As is also shown in FIG. 3H, the source terminal 226 may be implemented as a large monolithic structure in some embodiments. This source terminal 226 may be connected to the source fingers 246 by source vias 247, which are not visible in the view of FIG. 3H since they are covered by the source terminal 226, but their locations underneath the source terminal 226 are shown using dashed circles. It will also be appreciated that in other embodiments, a plurality of smaller source terminals 226 may be provided (e.g., a source terminal 226 may be provided above each source finger 246), and the source connection pad 276 may electrically connect the source terminals 226 and source fingers 246 together. Note that in FIG. 3H the source pillars 277, 281 that connect the source terminal 226 to the source connection pad 276 are visible, but the source connection pad 276 itself is not visible as the cross-section is taken through the pillars. The shape of the source connection pad for the embodiment of FIGS. 3A-3I is shown in the plan view of FIG. 3A.

FIG. 3I is a schematic cross-sectional view of the RF transistor amplifier 200 where the RF transistor amplifier 200 additionally includes an interconnect structure 300 that is mounted to the coupling element 270. The coupling element 270 may be used to connect the RF transistor amplifier die 210 to the interconnect structure 300. Since the RF transistor amplifier die 210 and the coupling element 270 have been discussed in detail above with reference to FIGS. 3A-3H, the discussion below will focus on the interconnect structure 300.

The interconnect structure 300 may be used to connect the RF transistor amplifier die 210 to other circuit elements. For example, the interconnect structure 300 may include an RF input 301 that receives RF signals that are to be coupled to the input of the RF transistor amplifier die 210, an RF output 308 that receives RF signals that are output from the RF transistor amplifier die 210, and one or more ground inputs 309 that each receives a ground reference voltage. The interconnect structure 300 may further include a first interconnect pad 372 that may be configured to couple to the gate connection pad 272, a second interconnect pad 374 that may be configured to couple to the drain connection pad 274, and a third interconnect pad 376 that may be configured to couple to the source connection pad 276 of the coupling element 270.

In some embodiments, a bonding element 360 (e.g., solder balls and/or bumps, conductive die attach material, etc.) may be used to respectively couple the first, second, and third interconnect pads 372, 374, 376 to the gate connection pad 272, the drain connection pad 274, and the source connection pad 276, respectively. Though illustrated as a single pad, in some embodiments, one or more of the first, second, and/or third interconnect pads 372, 374, 376 may include a plurality of pads.

Each of the first, second, and third interconnect pads 372, 374, 376 may be coupled to one or more conductive patterns 329 within the interconnect structure 300. The conductive patterns 329 may provide various routing and/or circuitry within the interconnect structure 300. For example, the conductive patterns 329 may connect the first interconnect pad 372 to one or more first surface connection pads 312-1, 312-2 and to the RF input 301. The conductive patterns 329 may also connect the second interconnect pad 374 to one or more second surface connection pads 322-1, 322-2 and to the RF output 308. The conductive patterns 329 may also connect the third interconnect pad 376 to one or more third surface connection pads 332 and to one or more ground pads 309. Thus, the interconnection structure 300 may have a surface (e.g., a top surface) having a plurality of first surface connection pads 312, respective ones of which are coupled to the gate connection pad 272 of the coupling element 270, a plurality of second surface connection pads 322, respective ones of which are coupled to the drain connection pad 274 of the coupling element 270, and a plurality of third surface connection pads 332, respective ones of which are coupled to the source connection pad 276 of the coupling element 270.

The conductive patterns 329 may be encased in an isolation material 315. In some embodiments, the isolation material 315 may include, for example, silicon oxide, silicon nitride, a polymer, a molding compound, a dielectric substrate or a combination thereof. In some embodiments, interconnect structure 300 may be formed as a printed circuit board (PCB). In a PCB embodiment, the isolation material 315 may be the substrate of the PCB, and the conductive patterns 329 may be traces and plated or metal filled vias that are formed within the substrate.

Circuit elements 350 may also be formed on and/or within the interconnect structure 300. For example, circuit elements 350 may be coupled (e.g., via solder or other bonding) between two or more of the first, second, and third surface connection pads 312, 322, 332. The circuit elements 350 may provide various electronic capabilities to the RF transistor amplifier 200. For example, the circuit elements 350 may comprise impedances (including, for example, resistive, inductive, and capacitive elements) that may be used for impedance matching and/or harmonic termination. The conductive patterns 329 allow the circuit elements 350 to be coupled along the input or output paths in a variety of different configurations.

Although illustrated as being on the surface of the interconnect structure 300, it will be understood that additional circuit elements 350 may be provided internally within the interconnect structure 300. For example, plate capacitors, interdigitated finger capacitors and or capacitors formed between conductive vias may be implemented within the interconnect structure 300. Likewise spiral inductors or other inductive elements may also be implemented within the interconnect structure 300. Resistive elements may be formed on or within the interconnect structure 300 by, for example, forming trace segments or conductive vias using higher resistance conductive materials. In some embodiments, the circuit elements 350 and/or the conductive patterns 329 may be configured to provide at least part of harmonic terminating circuitry, matching circuitry, splitting circuitry, combining circuitry, and/or biasing circuitry. Other configurations of the conductive patterns 329 and/or other types of circuit elements 350 may be used without deviating from the scope of the present invention.

One or more ground planes and/or traces 342 may be formed within the interconnect structure 300. These ground planes may be used to form stripline transmission line structures 344 within the interconnect structure 300. One such stripline transmission line structure is shown in FIG. 3I within a dashed ellipse. The signal carrying vias 310 and/or 320 may also have grounded vias 318 on opposed sides thereof to form vertical shielded RF transmission line structures 344 within the interconnect structure 300. It will also be appreciated that the configuration of the conductive patterns 329 and circuit elements 350 illustrated in FIG. 3I are merely examples and are not intended to limit embodiments of the present invention.

As will be discussed below with reference to FIGS. 10A-10G, in some embodiments, the interconnect structure 300 and the circuit elements 350 may be optionally encased within an encapsulating material (not shown). The encapsulating material may include, for example, silicon oxide, silicon nitride, a polymer, a molding compound, or a combination thereof.

As shown in FIG. 3I, the provision of the interconnect structure 300 in conjunction with the top-side contacts of the RF transistor amplifier die 210 allows for additional functionality, such as impedance matching and/or harmonic termination, to be conveniently added to the RF transistor amplifier 200 without the use of extensive wire bonding. Thus, different functionality and/or capability may be coupled to an RF transistor amplifier 200 simply by using a different interconnect structure 300. The reduced or eliminated need for wire bonds may also allow for reduced die size in some applications (where the sizes of the wire bond pads drive die size), and hence the RF transistor amplifier dies according to embodiments of the present invention may also exhibit increased integration density. Thus, the RF transistor amplifier die according to embodiments of the present invention may exhibit improved product assembly consistency, higher yields, increased product integration, reduced cost and improved RF performance, especially for products operating at high frequencies such as millimeter wave frequencies.

Figure 3J:
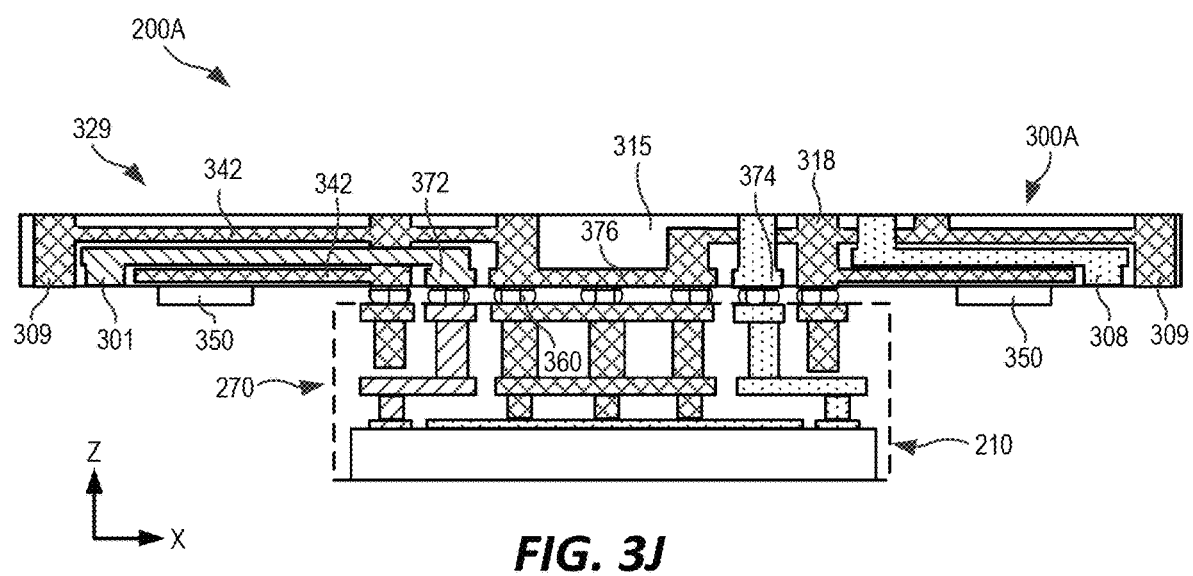
FIG. 3J is a schematic cross-sectional view of the Group III nitride-based RF transistor amplifier of FIGS. 3A-3H mounted on an alternate interconnect structure.

FIG. 3J is a schematic cross-sectional view of an RF transistor amplifier 200A which is similar to the RF transistor amplifier 200 of FIG. 3I. The difference between RF transistor amplifiers 200 and 200A is that RF transistor amplifier 200A includes an interconnect structure 300A in which the circuit elements 350 are mounted on the same side of the interconnect structure 350 as is the RF transistor amplifier die 210. It will be appreciated that in other embodiments, the circuit elements 350 may be provided on both major surfaces of the interconnect structure 300, 300A. It will also be appreciated that the RF input 301 the RF output 308 that receives RF signals that are output from the RF transistor amplifier die 210, and the one or more ground inputs 309 that each receives a ground reference voltage may be provided on either major surface of the interconnect structure (and inputs 301, 308 and 309 need not all be on the same major surface). These different arrangements may facilitate different packaging schemes.

The techniques disclosed herein may be particularly beneficial in higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF transistor amplifier dies disclosed herein may be configured to operate at frequencies greater than 1 GHz. In other embodiments, these RF transistor amplifier dies may be configured to operate at frequencies greater than 2.5 GHz. In still other embodiments, these RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or subportions thereof.

In the above-described embodiment, the gate manifold 242 and the gate terminal 222 are separate elements and drain gate manifold 244 and the drain terminal 224 are separate elements (e.g., connected by vias 243, 245, respectively). The present invention is not limited thereto. For example, the gate manifold 242 and the gate terminal 222 may be formed as a single monolithic structure and/or the drain manifold 244 and drain terminal 224 may similarly be formed as a single monolithic structure.

Though FIGS. 3A-3I illustrate a semiconductor layer structure 230 that comprises a HEMT it will be understood that other types of semiconductor devices may be formed in the semiconductor layer structure 230 without deviating from the present invention. For example, the semiconductor layer structure 230 may include a MOSFET, a DMOS transistor, a MESFET, and/or an LDMOS transistor. One of ordinary skill in the art will recognize that the arrangement of all of the source/drain/gate contacts on a single side of the semiconductor layer structure 230, including the use of the coupling element 270, may allow for improved connection possibilities and better thermal performance.

By placing gate, drain, and source contacts on a same side of the RF transistor amplifier die 210, connection options may be available that were not previously possible. These connection options may also allow for embodiments that can more strongly leverage the improved thermal conductivity of SiC materials.

Figure 3K:
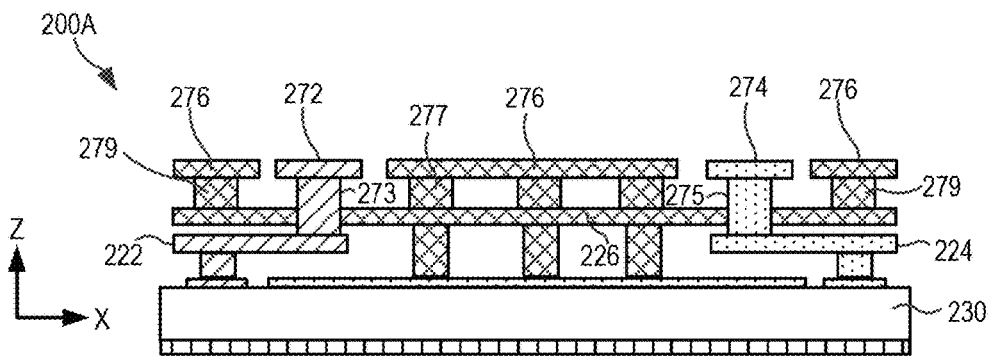
FIG. 3K is a schematic cross-sectional view of an RF transistor amplifier that is a modified version of the RF transistor amplifier of FIGS. 3A-3G.

FIG. 3K is a schematic cross-sectional view of an RF transistor amplifier 200A that is a modified version of the RF transistor amplifier 200 of FIGS. 3A-3I. As shown in FIG. 3K, the RF transistor amplifier 200A is very similar to the RF transistor amplifier 200. However, the source terminal 226 is raised higher than the gate terminal 222 and the drain terminal 224 and extends farther outwardly in the X-direction. This modified arrangement allows the lower surface of each source pillar 279 to connect to the source terminal 226 since the source terminal 226 may extend over top of the gate terminal 222 and the drain terminal 224 while remaining electrically isolated therefrom. The gate pillars 273 and the drain pillars 275 may extend through openings in the source terminal 226. the openings in the source terminal 226 may be similar to the openings in the source terminal 226G that is shown in FIG. 5I (see discussion below).

Figure 3L:
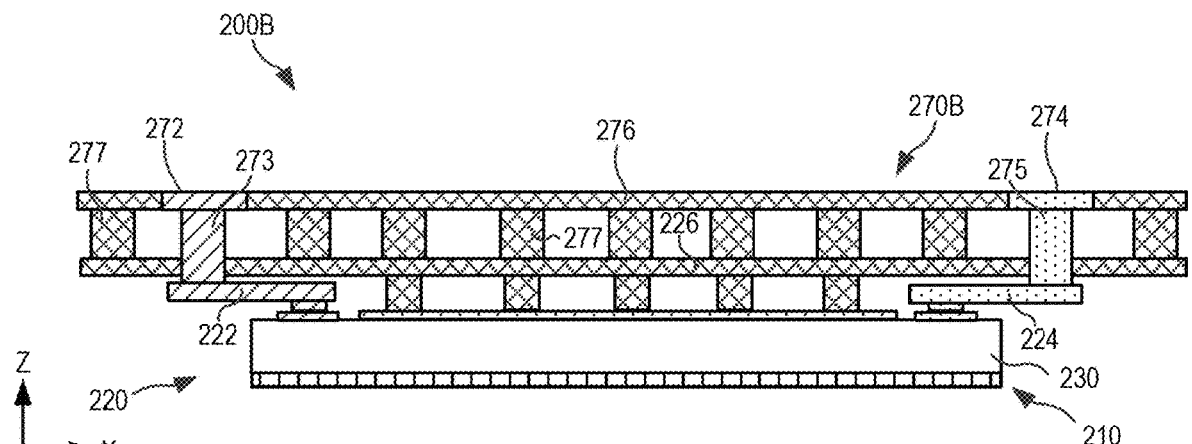
FIG. 3L is a schematic cross-sectional view of another modified version of the Group III nitride-based RF transistor amplifier of FIGS. 3A-3H that has a fan-out structure.

FIG. 3L is a schematic cross-sectional view of an RF transistor amplifier 200B that is another modified version of the Group III nitride-based RF transistor amplifier 200 of FIGS. 3A-3H. The primary difference between the RF transistor amplifiers 200B and 200 is that RF transistor amplifier 200 has a fan-in configuration for the gate and drain connection pads 272, 274, while RF transistor amplifier 200B has a fan-out configuration for the gate and drain connection pads 272, 274. Due to the fan-out configuration, the coupling element 270B of RF transistor amplifier 200B may extend further in the X-direction than does the RF transistor amplifier die 210. By making the coupling element 270B wider than the RF transistor amplifier die 210, it becomes possible to fan-out the gate and drain connection pads 272, 274 and to include ground pillars 277 to the outside of each gate pillar 273 and drain pillar 275. The gate connection pad 272 and the drain connection pad 274 may each comprise a plurality of discrete pads that are formed in openings within a large source connection pad in an example embodiment (and will be similar to the pads 272, 274, 276 shown in FIG. 5I, which is discussed below).

Figure 3M:
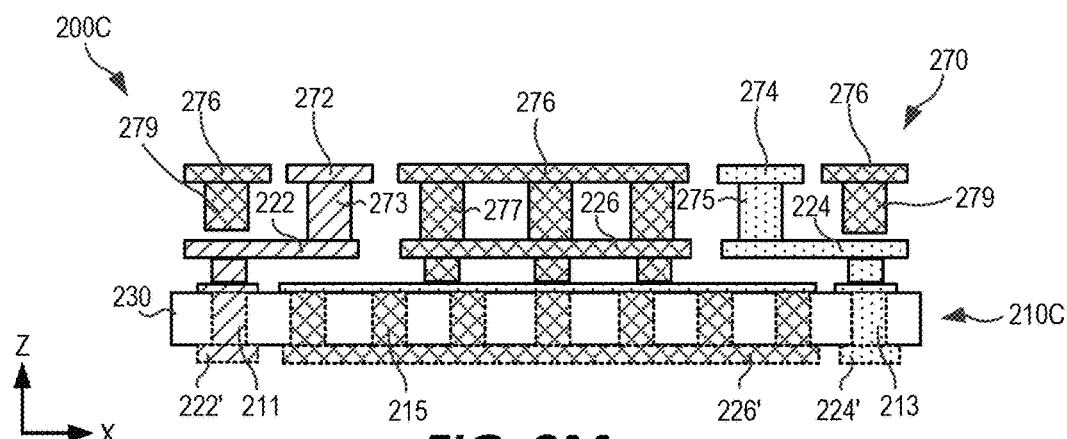
FIG. 3M is a schematic cross-sectional view of yet another modified version of the Group III nitride-based RF transistor amplifier of FIGS. 3A-3H.

It will also be appreciated that the RF transistor amplifier die may have a variety of different configurations. For example, while the RF transistor amplifier dies have top side gate, drain and source terminals 222, 224, 226, they may also, in some embodiments, have one or more of back side gate, drain and source terminals 222', 224', 226'. Such a configuration is schematically shown in FIG. 3M, which is a schematic cross-sectional view of an RF transistor amplifier 200C that corresponds to the cross-section of FIG. 3B. As shown in FIG. 3M, gate vias 211, drain vias 213 and/or source vias 215 may be formed through the semiconductor layer structure 230 that connect to respective gate, drain and source terminals 222', 224', 226'. As explained, for example, in U.S. Provisional Patent Application Ser. No. 63/004,985, filed Apr. 3, 2020 ("the '985 application"), including gate and drain terminals on the back side of an RF transistor amplifier die may have various advantages, such as allowing for more flexible impedance matching circuit implementations. The entire content of the '985 application is incorporated herein by reference. It will be appreciated that back side gate, drain and source terminals 222', 224', 226' and/or corresponding gate, drain and source vias 211, 213, 215 may be included in any of the RF transistor amplifier die disclosed herein.

Figure 4A:
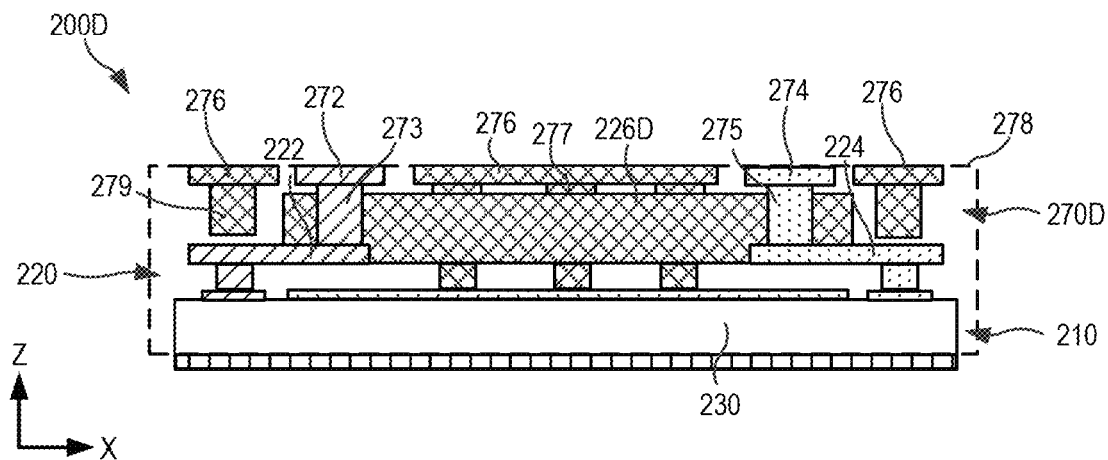
FIGS. 4A and 4B are schematic cross-sectional views of a Group III nitride-based RF transistor amplifier that is a modified version of the Group III nitride-based RF transistor amplifier of FIGS. 3A-3I.
Figure 4B:
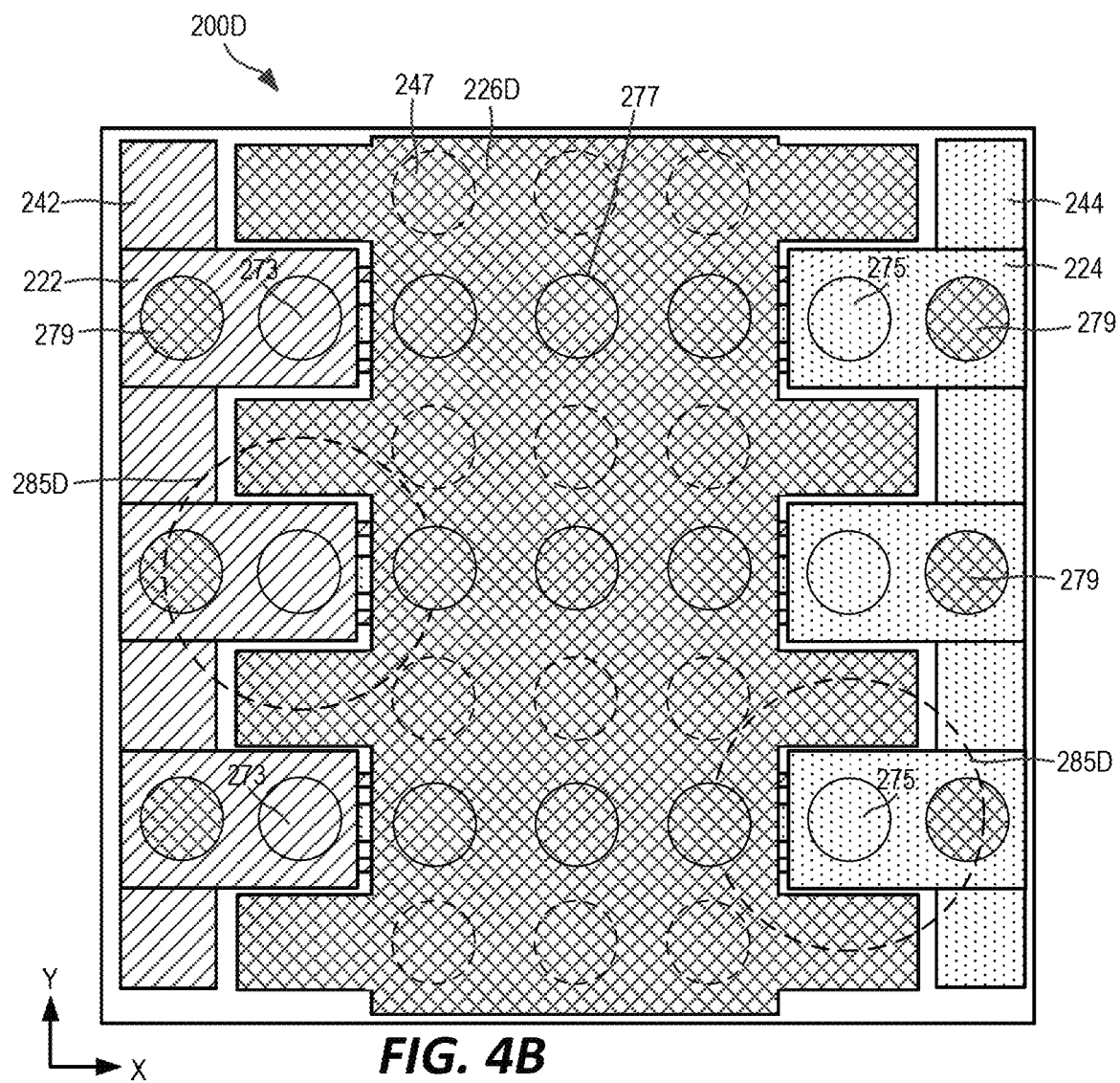

FIGS. 4A and 4B are schematic cross-sectional views of a Group III nitride-based RF transistor amplifier 200D that is a modified version of the Group III nitride-based RF transistor amplifier 200 of FIGS. 3A-3H. As shown in FIGS. 4A-4B, the RF transistor amplifier 200D differs from the RF transistor amplifier 200 of FIGS. 3A-3H in that the source terminal 226 and source pillars 277, 281 are replaced with a thick source plug 226D and much shorter source pillars 277 in RF transistor amplifier 200D. The source connection pad 276 may be identical to the source connection pad 276 of the RF transistor amplifier 200 of FIGS. 3A-3I. The thick metal source plug 226D may eliminate the need for the source pillars 281, and may provide an efficient thermal dissipation path to remove heat from the active area of the transistor amplifier die 210D. The source pillars 279 are still included in RF transistor amplifier 200D and are connected to the source plug 226D through the source connection pad 276. The RF transistor amplifier 200D may exhibit improved heat dissipation performance. As shown in FIG. 4B, each gate and drain pillar 273, 275 is surrounded by a source pillar 277, a source pillar 279 and the source plug 226D to form a shielded transmission line segment 285D.

Figure 5A:
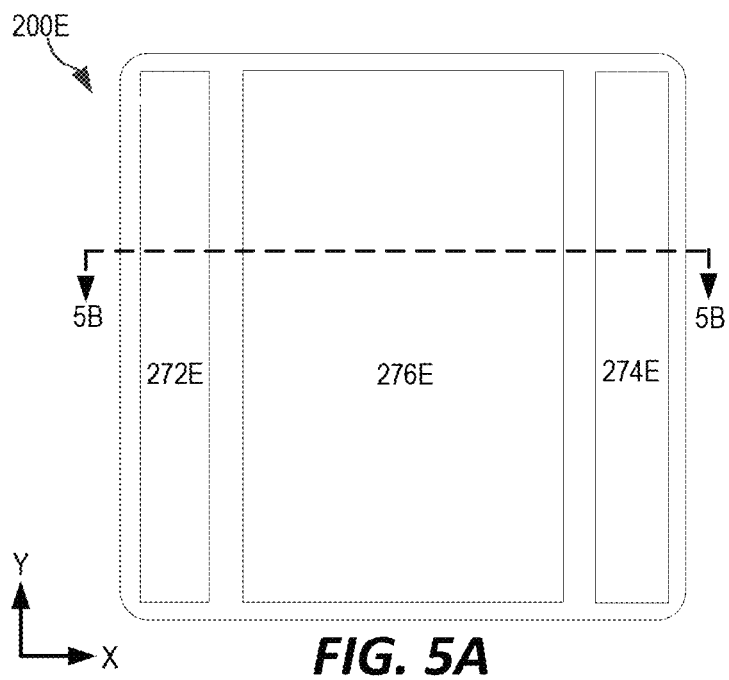
FIGS. 5A-5F are various views of a Group III nitride-based RF transistor amplifier die according to further embodiments of the present invention.
Figure 5B:
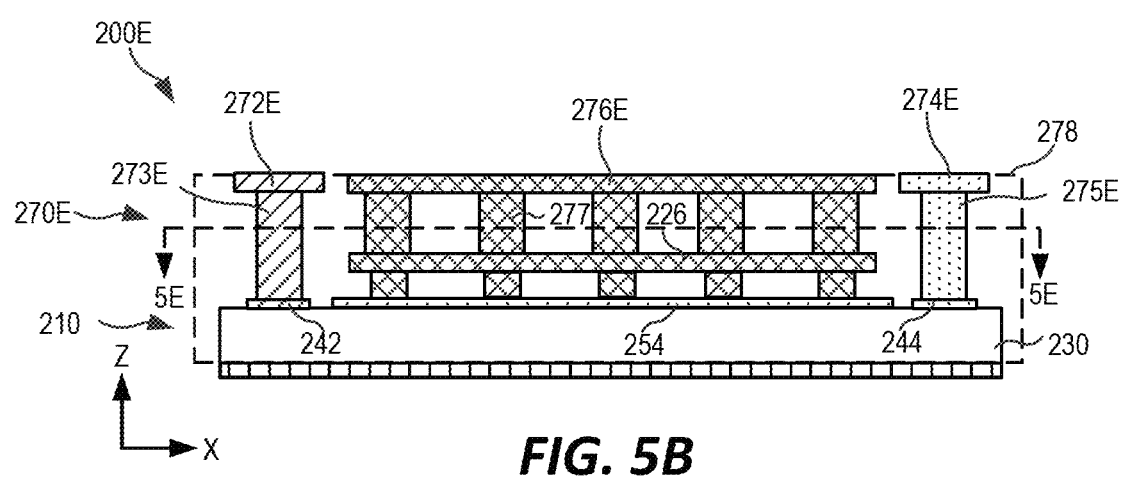
Figure 5C:
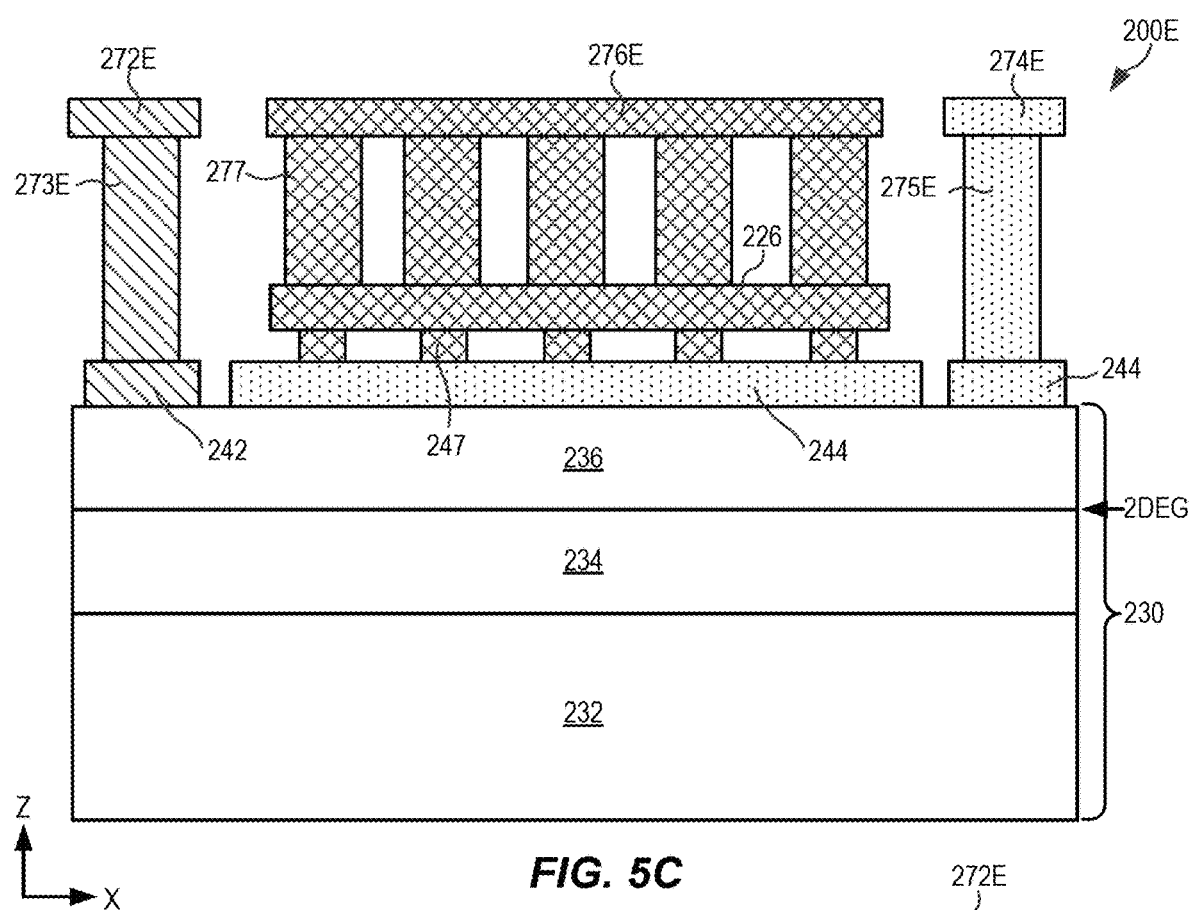
Figure 5D:
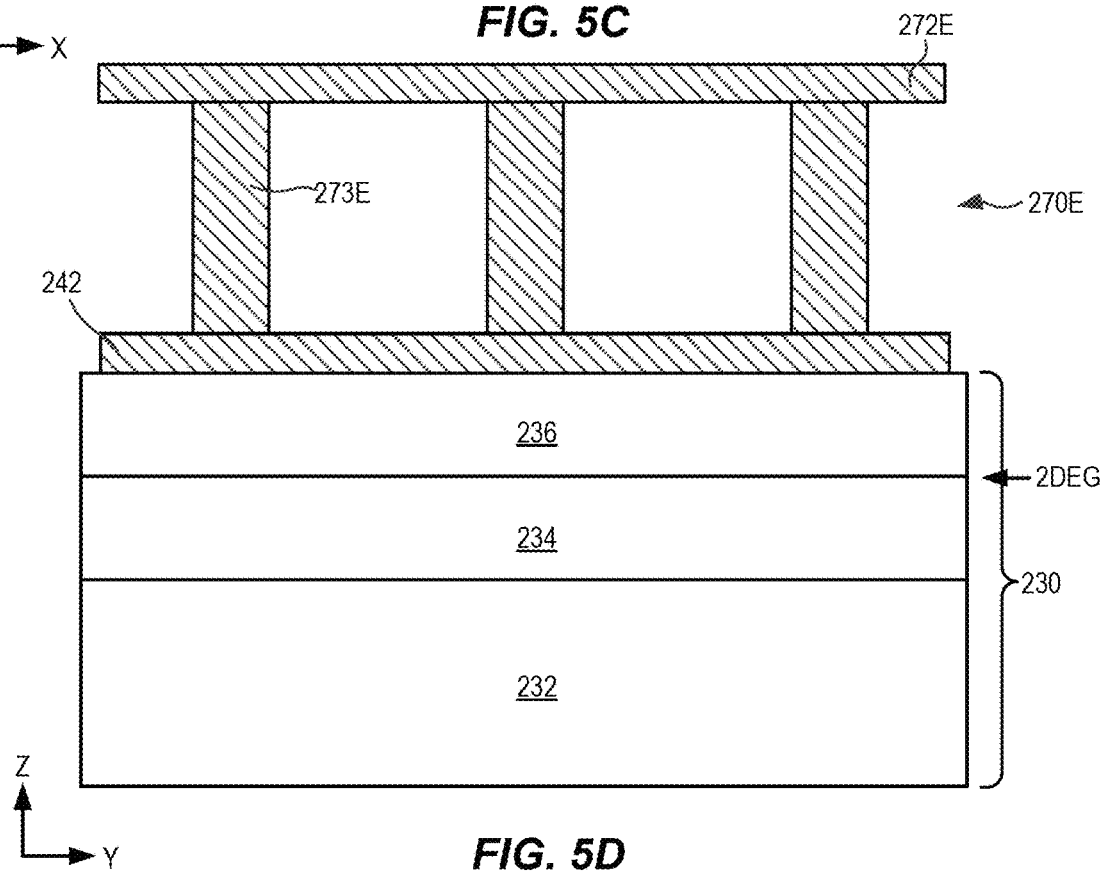
Figure 5E:
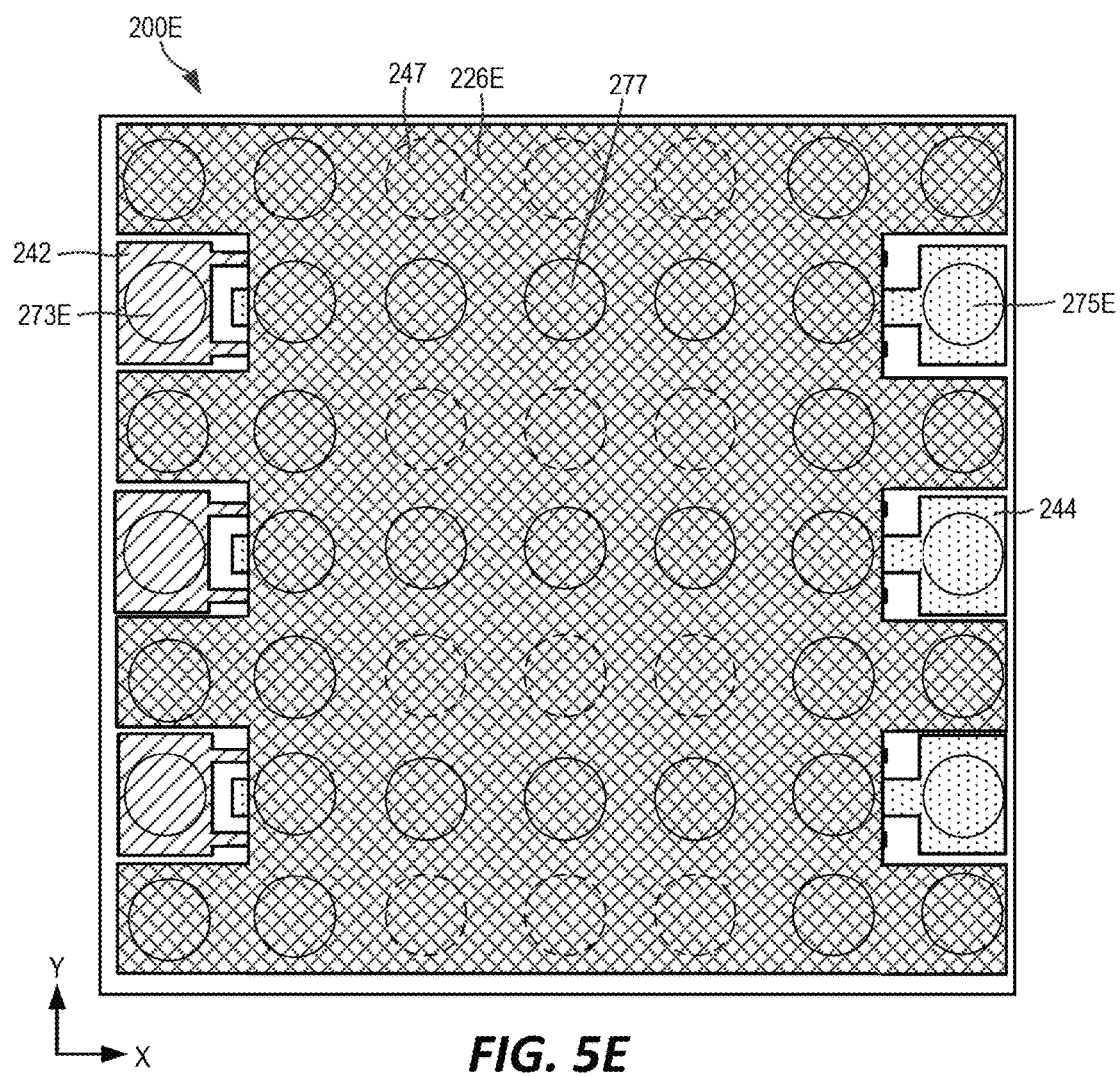
Figure 5F:
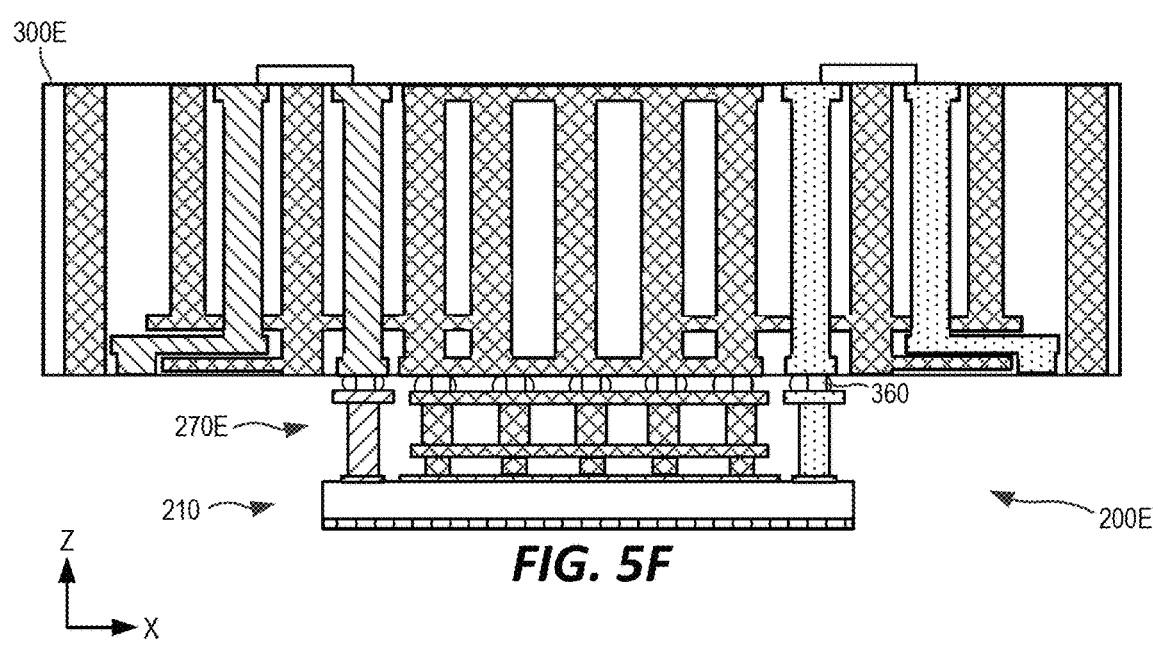

FIGS. 5A-5F illustrate a Group III nitride-based RF transistor amplifier 200E according to further embodiments of the present invention. In particular, FIG. 5A is a schematic plan view of the RF transistor amplifier 200E, while FIG. 5B is a schematic cross-sectional view of the RF transistor amplifier 200E that is taken along line 5B-5B of FIG. 5A. FIG. 5C is a schematic plan view taken along one of the source fingers of the RF transistor amplifier 200E (corresponding to line 3D-3D of FIG. 3C). FIG. 5D is a schematic cross-sectional view of the RF transistor amplifier 200E that is taken along the longitudinal axis of the gate manifold (corresponding to line 3F-3F of FIG. 3C). FIG. 5E is a cross-sectional view taken along line 5E-5E of FIG. 5B. Finally, FIG. 5F is a schematic cross-sectional view of the RF transistor amplifier 200E where the RF transistor amplifier further includes an interconnect structure 300E. RF transistor amplifier 200E of FIGS. 5A-5F is similar to the RF transistor amplifier 200 of FIGS. 3A-3I. Accordingly, the discussion below will focus on the differences between these two RF transistor amplifiers.

One complication with the RF transistor amplifier 200 of FIGS. 3A-3I is that source pillars 279 are provided "outside" the gate pillars 273 and are provided "outside" the drain pillars 275 (in other words, referring to FIGS. 3C and 3H, when viewed in plan view, each gate pillar 273 is in between a source pillar 279 and the active region 218 of the RF transistor amplifier die 210 and each drain pillar 275 is in between a source pillar 279 and the active region 218). Typically, the gate and drain manifolds 242, 244 are located very close to the edges of the RF transistor amplifier die 210 in order to maximize the area of the active region 218. As such, there may not be room to place source pillars 279 outside the gate pillars 273 or the drain pillars 275. The RF transistor amplifier die 210 of FIGS. 3A-3I addresses this issue using a fan-in configuration for the gate connection pads 272 and the drain connection pads 274. In particular, in RF transistor amplifier 200, the gate pillars 273 are laterally offset from the gate manifold 242 and the drain pillars 275 are laterally offset from the drain manifold 244 in order to make room to place source pillars 279 outside the gate pillars 273 and the drain pillars 275. This repositioning, however, complicates the design of coupling element 270.

The RF transistor amplifier die 210E of FIGS. 5A-5E avoids the complication of having source pillars 279 positioned outside the gate pillars 273 and the drain pillars 275 by simply omitting the source pillars 279. This simplifies the design of the coupling element 270E included in (or mounted on) RF transistor amplifier die 210E. Because the source pillars 279 are omitted, the RF transmission line structures in coupling element 270E are not as fully shielded as the corresponding RF transmission line structures in RF transistor amplifier die 210 of FIGS. 3A-3I, but they are still shielded on three sides which should provide significant performance improvement as compared to more conventional transmission line connections to RF transistor amplifier die.

The semiconductor layer structure 230 and the metallization that directly contacts the semiconductor layer structure 230 (e.g., the gate manifold 242, drain manifold 244, gate fingers 252, drain fingers 254 and source fingers 246) may be identical in RF transistor amplifier die 210E and RF transistor amplifier die 210 of FIGS. 3A-3I. As such, FIG. 3C schematically illustrates the metallization that directly contacts the semiconductor layer structure for both RF transistor amplifier dies 210 and 210E.

Referring to FIGS. 5A-5D, longer gate pillars 273E are provided in RF transistor amplifier die 210E that directly connect the gate manifold 242 to the gate connection pad 272E, and longer drain pillars 275E are provided that directly connect the drain manifold 244 to the drain connection pad 274E. The gate terminals 222 and the drain terminals 224 that are provided in RF transistor amplifier 200 may be omitted from RF transistor amplifier 200E, resulting in a simpler design. Moreover, in RF transistor amplifier 200E, the gate pillars 273E are positioned directly above the gate manifold 242 and the drain pillars 275 are positioned directly above the drain manifold 244. Additionally, the location of the gate and drain connection pads 272E, 274E may be changed, and the size and shape of the source connection pad 276E is modified so that the source connection pad 276E comprises a simple stripe as compared to the generally E-shaped source connection pad 276 included in RF transistor amplifier 200 (compare FIGS. 3A and 5A). The source pillars 279 are omitted in RF transistor amplifier 200E, while additional source pillars 277 are provided. Note that the gate and drain interconnect pads 272E, 274E of the RF transistor amplifier 200E do not have a fan-in configuration.

FIG. 5E is a cross section taken through the gate, drain and source pillars 273E, 275E, 277 that illustrates how these pillars are implemented as shielded transmission line structures. As can be seen, three source pillars 277 partially surround each gate pillar 273E. In particular, in the view of FIG. 5E, a source pillar 277 is provided above each gate pillar 273E, below each gate pillar 273E, and to the right side of each gate pillar 273E. Similarly, three source pillars 277 partially surround each drain pillar 275E; a source pillar 277 is provided above each drain pillar 275E, below each drain pillar 275E, and to the left side of each drain pillar 275E. No additional shielding is provided on the left side of each gate pillar 273E or on the right side of each drain pillar 275E. Note that the source pillars 281 of RF transistor amplifier 200 may be replaced with source pillars 277 in RF transistor amplifier 200E since the gate and drain terminals 222, 224 are omitted in RF transistor amplifier 200E.

FIG. 5F is a schematic cross-sectional view of the RF transistor amplifier 200E when the amplifier further includes an interconnect structure 300E. The coupling element 270E is used to connect the RF transistor amplifier die 210B to the interconnect structure 300E. As shown in FIG. 5F, bonding elements (e.g., solder balls and/or bumps) 360 may be used to respectively couple the interconnect structure 300E to coupling element 270E. The interconnect structure 300E may be almost identical to the interconnect structure 300 described above, and hence further description thereof will be omitted.

Figure 5G:
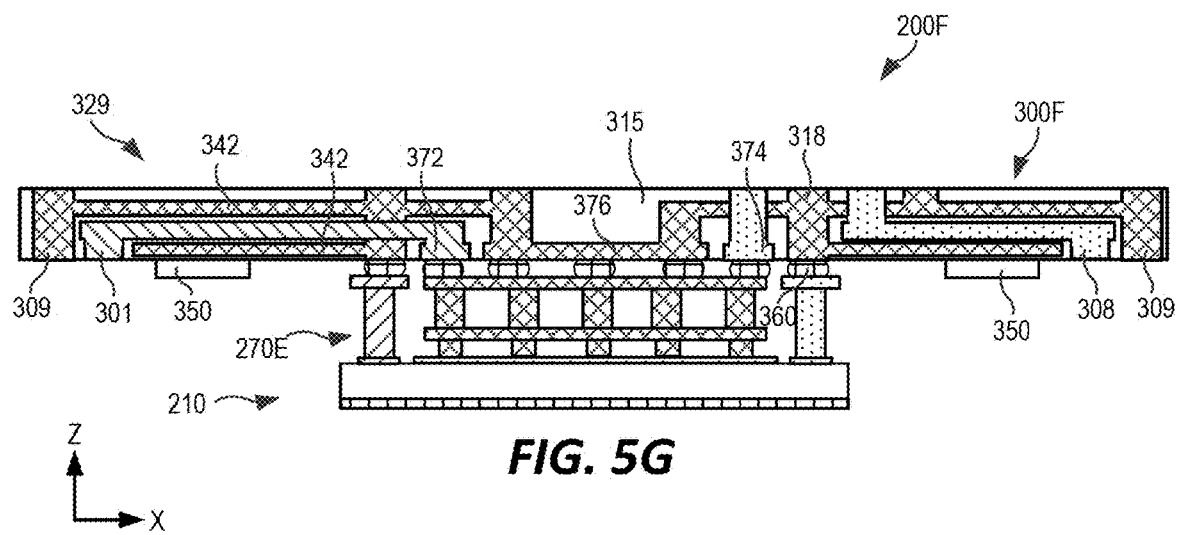
FIG. 5G is a schematic cross-sectional view of an RF transistor amplifier that is a modified version of the RF transistor amplifier of FIG. 5F.

FIG. 5G is a schematic cross-sectional view of an RF transistor amplifier 200F which is identical to the RF transistor amplifier 200E of FIG. 5F, except that RF transistor amplifier 200F includes an interconnect structure 300F in which the circuit elements 350 are mounted on the same side of the interconnect structure 350 as is the RF transistor amplifier die 210. It will be appreciated that in other embodiments, the circuit elements 350 may be provided on both major surfaces of the interconnect structures 300E, 300F. It will also be appreciated that the RF input 301, the RF output 308, and/or the ground inputs 309 may be provided on either major surface of interconnect structures 300E, 300F.

Figure 5H:
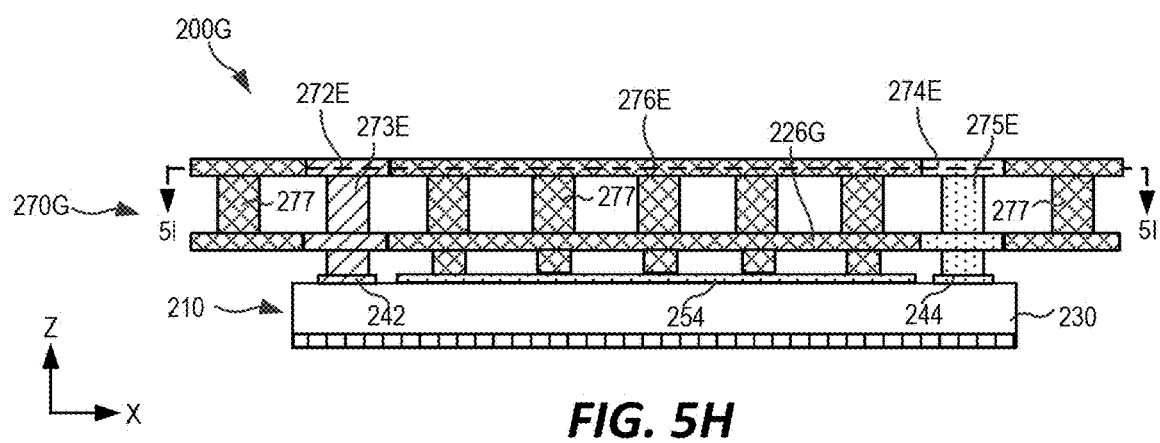
FIGS. 5H and 5I are a schematic cross-sectional view and a schematic plan view, respectively, of an RF transistor amplifier according to further embodiments of the present invention.
Figure 5I:
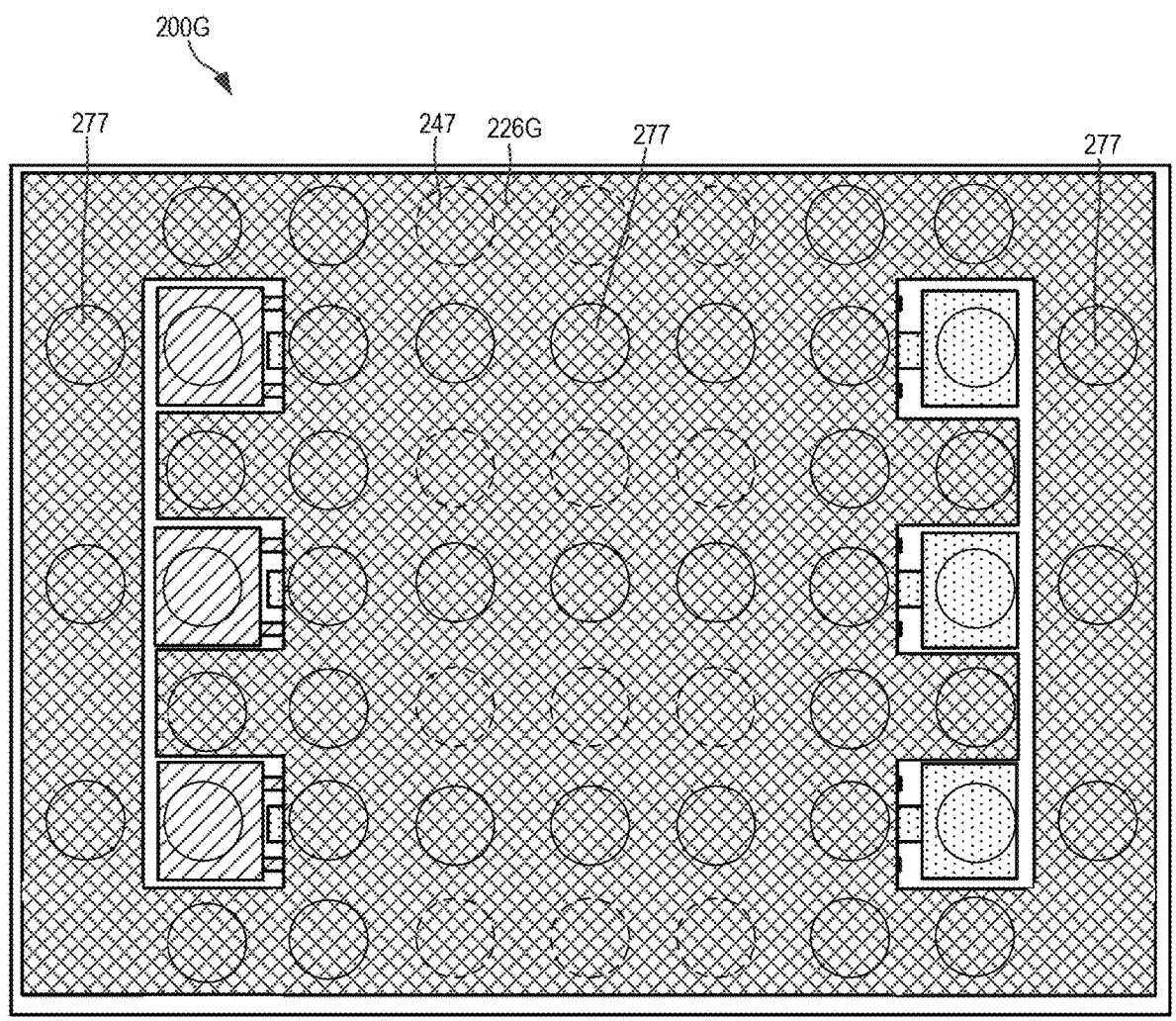
Figure 5I:
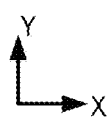

FIGS. 5H and 5I are a schematic cross-sectional view and a schematic plan view, respectively, of an RF transistor amplifier 200G according to further embodiments of the present invention. The RF transistor amplifier 200G is very similar to the RF transistor amplifier 200E of FIGS. 5A-5E, except that RF transistor amplifier 200G includes an extra source pillar 277 outside of each gate pillar 273E and drain pillar 275E so that a total of four source pillars 277 surround each gate and drain pillar 272E, 274E. Similar to the embodiment of FIG. 3L discussed above, this may be accomplished by forming the coupling element 270G to be wider than the RF transistor amplifier die 210.

Figure 6A:
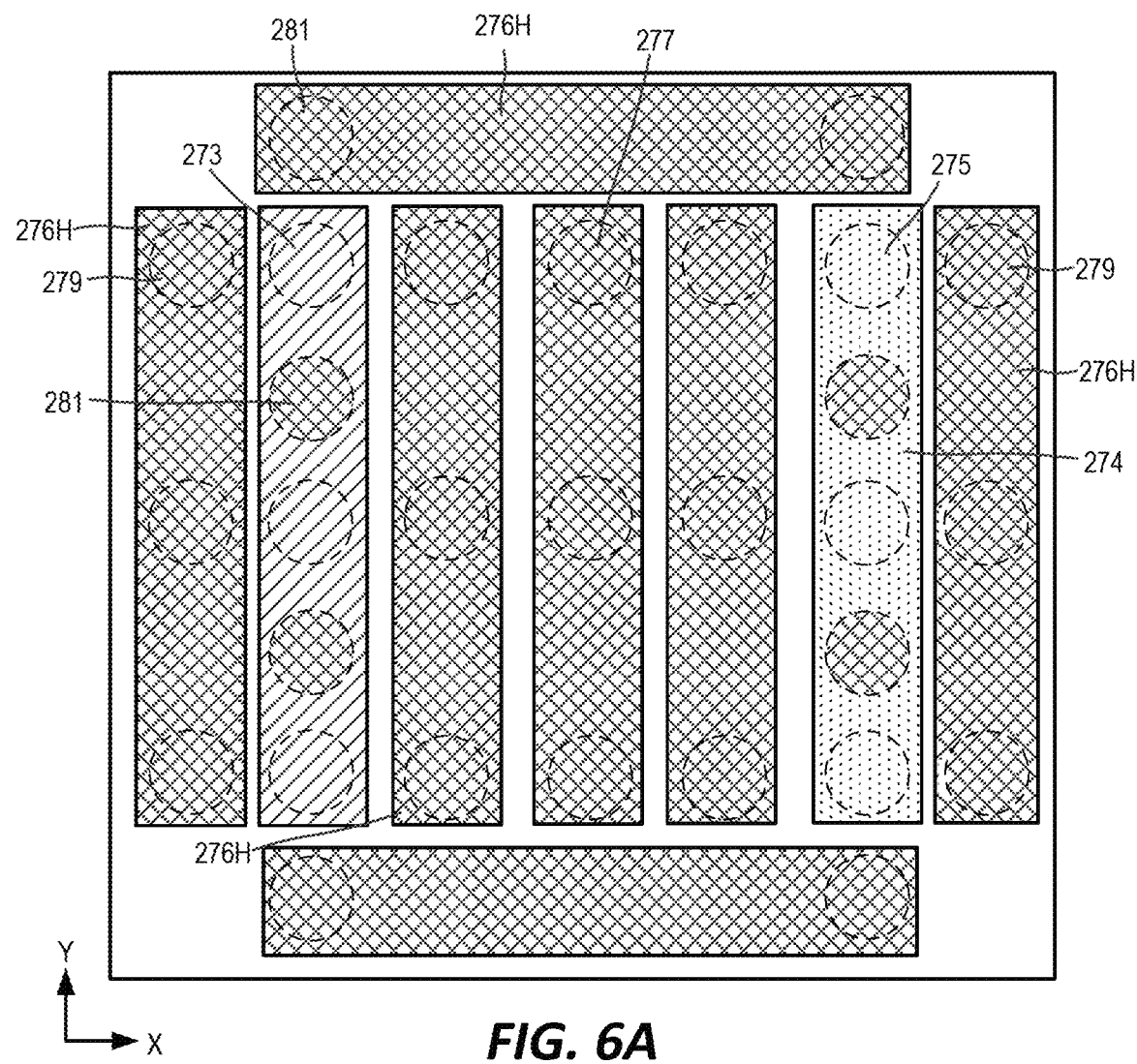
FIGS. 6A and 6B are schematic plan views illustrating alternate implementations of the coupling element according to embodiments of the present invention.
Figure 6B:
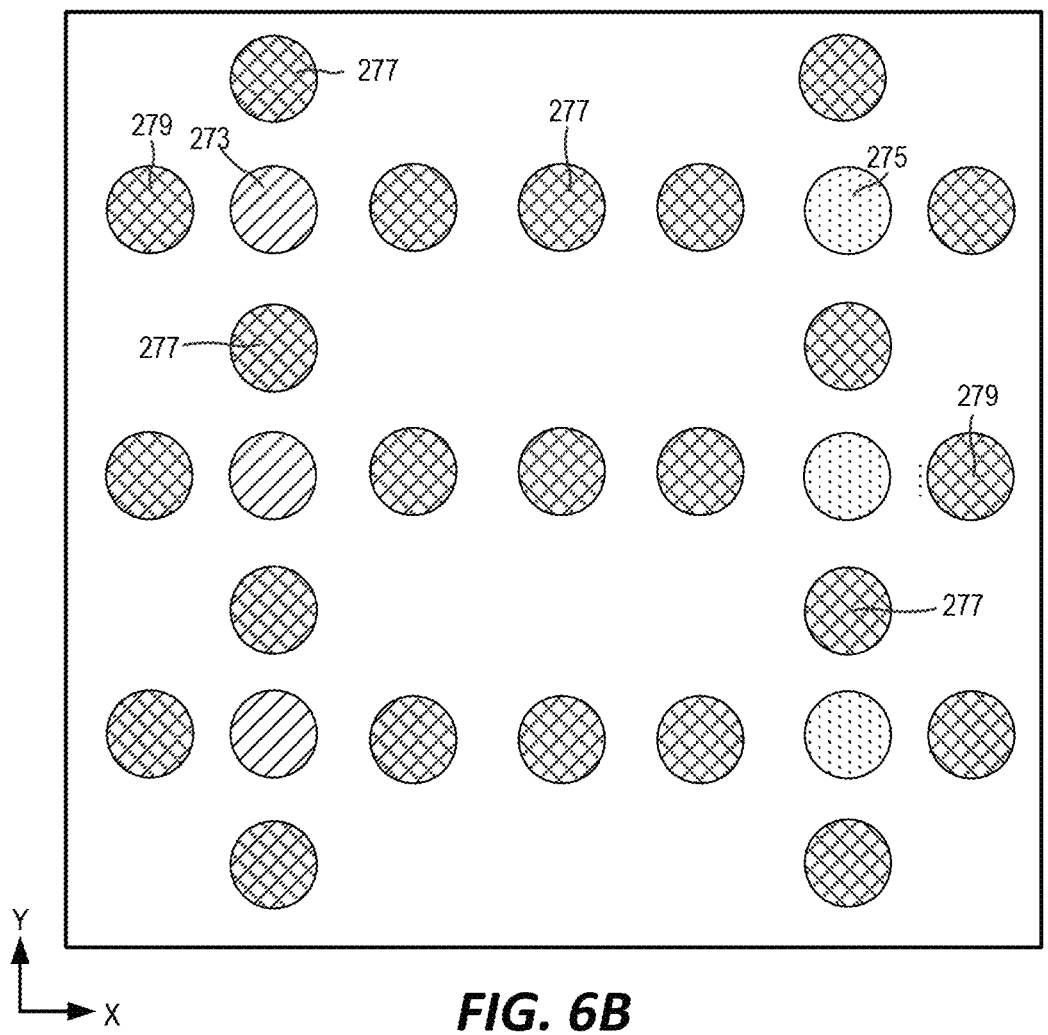

FIG. 3A illustrates two example implementations of the gate, drain and source connection pads 272, 274, 276; 272E, 274E, 276E that are included in the RF transistor amplifiers 200 and 200E of FIGS. 3A-3I and FIGS. 5A-5F. FIGS. 6A and 6B are schematic plan views illustrating two alternative implementations of the gate, drain and source connection pads that may be used, for example, in the RF transistor amplifier 200 of FIGS. 3A-3I. The cross-sections of FIGS. 6A-6B are horizontal cross-sections taken through the gate, drain and source connection pads 272, 274, 276 (i.e., they are taken along the equivalent of line 6-6 of FIG. 3A). The dashed circles in FIGS. 6A-6B illustrate the locations of the gate, drain and source pillars 273, 275, 277, 279, 281. Dielectric underfill material that is provided between the gate, drain and source pillars 273, 275, 277, 279, 281 is shown in FIGS. 6A and 6B and hence blocks the view of underlying structures such as the gate, drain and source terminals 222, 224, 226.

Referring first to FIG. 6A, it can be seen that a plurality of source connection pads 276H are provided as opposed to the monolithic source connection pad 276 included in RF transistor amplifier 200. In FIG. 6A, each source connection pad 276H is implemented as a stripe of conductive material. Notably, the source connection pads 276H are not electrically connected to each other within the RF transistor amplifier die 210 or the coupling element 270. Thus, each source connection pad 276H may have its own individual connection to ground. The source connection pads 276H may be electrically connected to each other through, for example, a common source connection in an interconnect structure 300 that is attached to the coupling element 270.

As shown in FIG. 6B, in another alternative embodiment, the gate, drain and source connection pads 272, 274, 276 may be omitted entirely. In such an embodiment, the gate, drain and source pillars 273, 275, 277, 279 may directly connect to corresponding pads on an interconnect structure using bonding material such as conductive bumps or conductive die attach material that are arranged in a ball grid array. Moreover, since the gate and drain connection pads 272, 274 are omitted, the source pillars 281 included in the embodiment of FIGS. 3A-3I may be replaced with source pillars 277 that extend all the way to the upper surface of the coupling element.

Figure 7A:
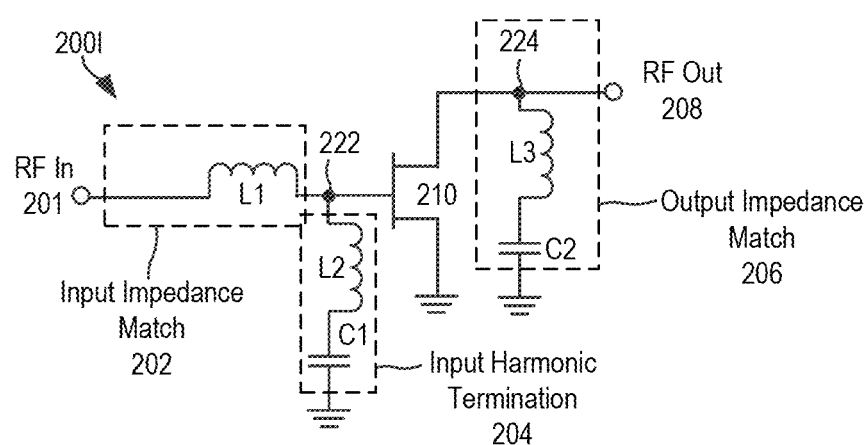
FIG. 7A is a schematic plan view of an interconnect structure according to embodiments of the present invention that includes impedance matching and harmonic termination circuits.
Figure 7B:
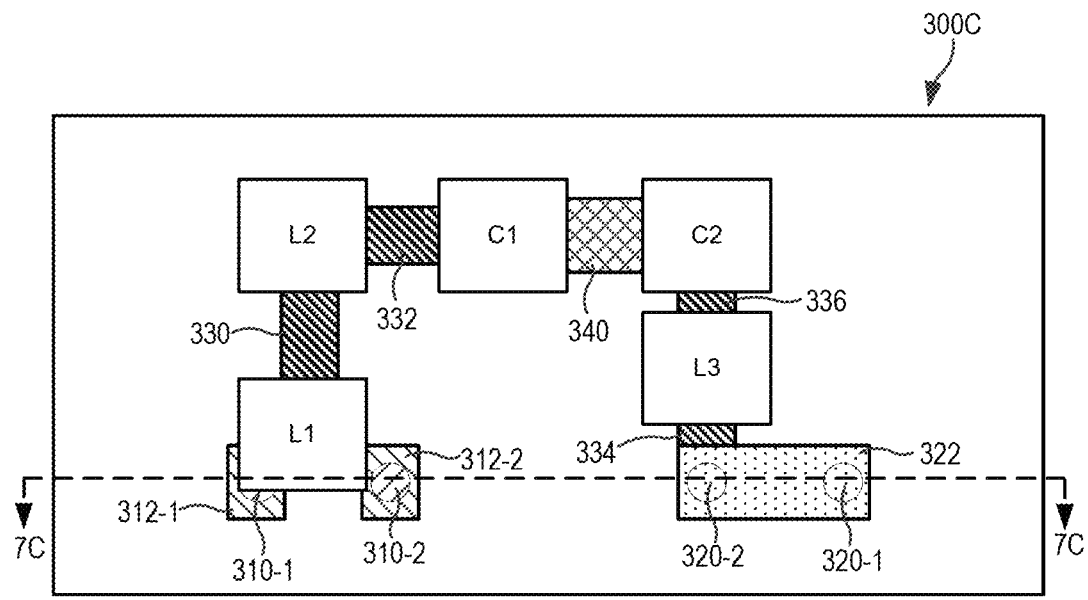
FIG. 7B is a schematic cross-sectional view of the interconnect structure taken along line 7B-7B of FIG. 7A.
Figure 7C:
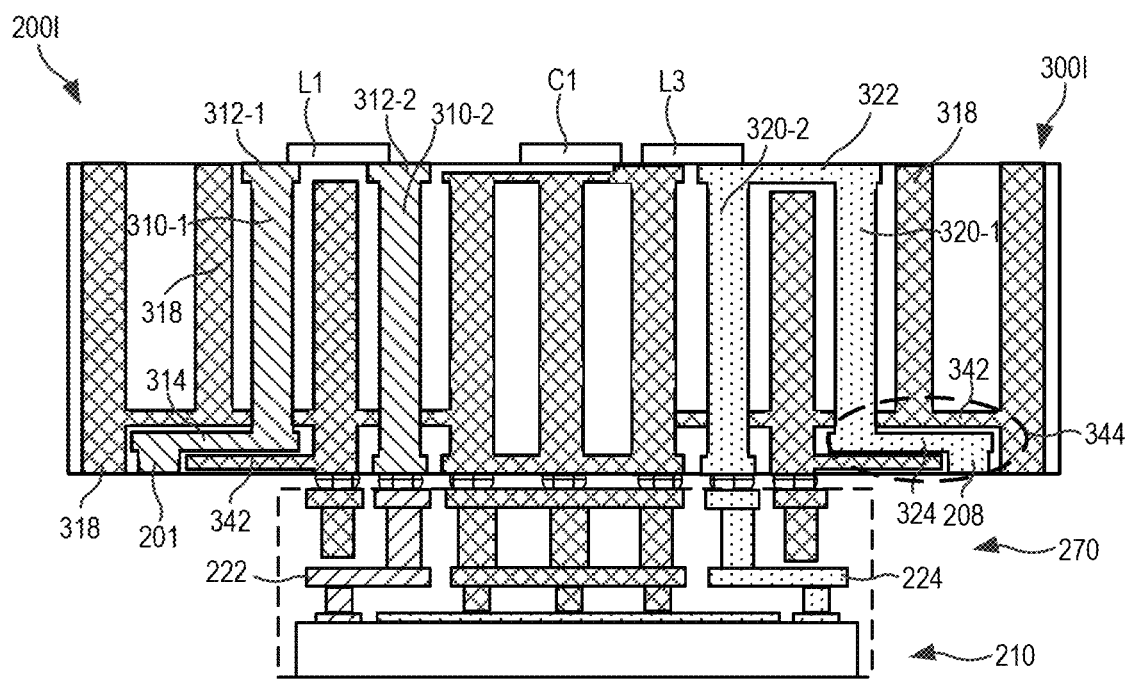
FIG. 7C is a circuit diagram of an RF transistor amplifier of FIGS. 7A-7B.

While FIGS. 6A and 6B are described above as showing two alternative implementations of the gate, drain and source connection pads 272, 274, 276 of the embodiments of FIGS. 3A-3I, it will be appreciated that the same modifications may be made to any of the other embodiments disclosed herein such as, for example, the embodiments of FIGS. 3J-3M, FIGS. 5A-5I, the embodiment of FIGS. 7A-7C and the embodiments of FIGS. 10A-10G.

FIGS. 7A-7C illustrate one example way in which matching circuits such as impedance matching circuits or harmonic termination circuits may be implemented in the RF transistor amplifiers according to embodiments of the present invention. In particular, FIG. 7A is a circuit diagram of an RF transistor amplifier 200I that includes both impedance matching and harmonic termination circuits. FIG. 7B is a schematic plan view of an interconnect structure 300I according to embodiments of the present invention that is part of the RF transistor amplifier 200I. FIG. 7C is a schematic cross-sectional view (taken along line 7C-7C of FIG. 7B) that illustrates the RF transistor amplifier 200I and the coupling element 270I that is included in RF transistor amplifier 200I.

Referring to FIG. 7A, it can be seen that the RF transistor amplifier 200I includes an input impedance matching circuit 202, an input harmonic termination circuit 204, the RF transistor amplifier die 210, and an output impedance matching circuit 206. The input impedance matching circuit 202 is coupled in series between an RF input 201 of RF transistor amplifier 200I and the gate terminal 222 of RF transistor amplifier die 210, and includes an inductor L1. The input harmonic termination circuit 204 is coupled between the gate terminal 222 of RF transistor amplifier die 210 and ground and includes a series L-C circuit including inductor L2 and capacitor C1. The output impedance matching circuit 206 is coupled in series between the drain terminal 224 of RF transistor amplifier die 210 and an RF output 208 of RF transistor amplifier 200I and includes a series L-C circuit including inductor L3 and capacitor C2.

Referring next to FIGS. 7B and 7C, it can be seen that the inductors L1-L3 and the capacitors C1 and C2 may be implemented using surface mount circuit elements that are mounted on the upper surface of interconnect structure 300I. The RF input 201 and the RF output 208 may be implemented as pads on the bottom surface of interconnect structure 300I.

First and second conductive gate vias 310-1, 310-2 may extend through the interconnect structure 300I. A horizontal gate segment 314 is also provided so that the RF input 201 has a fan-out configuration to make it easier to electrically connect the RF input 201 to an external circuit. Similarly, first and second conductive drain vias 320-1, 320-2 also extend through the interconnect structure 300I. A horizontal drain segment 324 is provided so that the RF output 208 also has a fan-out configuration to make it easier to electrically connect the RF output 208 to an external circuit. A conductive pad 312-1 is formed on top of the first conductive gate via 310-1 and a conductive pad 312-2 is formed on top of the second conductive gate via 310-2. The surface mount circuit element L1 is mounted above and electrically connected to conductive pads 312-1, 312-2 in order to implement the inductor L1 in series between the RF input 201 and the gate terminal 222 of RF transistor amplifier die 210. A conductive pad 322 is formed on top of both the first conductive drain via 320-1 and the second conductive drain via 320-2.

As shown in FIG. 7B, conductive traces 330, 332, 334 and 336 are provided on the upper surface of interconnect structure 300I. Conductive trace 330 electrically connects conductive pad 312-1 to an input pad of surface mount circuit element L2, conductive trace 332 electrically connects an output pad of surface mount circuit element L2 to an input pad of surface mount circuit element C1, and an output pad of surface mount circuit element C1 is mounted on and electrically connected to a pad 340 that is connected to ground. Conductive traces 330, 332 and surface mount circuit elements L2, C1 implement the input harmonic termination circuit 204. Conductive trace 334 electrically connects conductive pad 322 to an input pad of surface mount circuit element L3, conductive trace 336 electrically connects an output pad of surface mount circuit element L3 to an input pad of surface mount circuit element C2, and an output pad of surface mount circuit element C2 is mounted on and electrically connected to the ground pad 340. Conductive traces 334, 336 and surface mount circuit elements L3, C2 implement the output impedance matching circuit 206.

As shown in FIG. 7C, shielded transmission line structures may be implemented within the interconnect structure 300I. For example, conductive ground vias 318 are formed on opposed sides of each conductive gate via 310-1, 310-2 and each conductive drain via 320-1, 320-2. While two conductive ground vias 318 are shown on opposed sides of each conductive gate and drain via 310, 320 in the cross-section of FIG. 7C, it will be appreciated that additional conductive ground vias 318 may (optionally) further surround each conductive gate and drain via 310, 320 outside the cross-sectional view of FIG. 7C. Additionally, conductive ground traces 342 are formed both above and below the horizontal gate segment 314 and are formed above and below the horizontal drain segment 324. The conductive ground traces 342 convert horizontal gate segment 314 and the horizontal drain segment 324 into shielded transmission line segments in the form of respective stripline transmission line segments 344.

Locating the source terminal 226 on the top side of the RF transistor amplifier die 210 (i.e., the same side as the gate terminal 222 and the drain terminal 224) facilitates the use of the above-discussed shielded transmission line segments 344 as access to ground voltage connections are conveniently available in close proximity to the transmission line structures that connect to the gate and drain terminals of the RF transistor amplifier die 210. Additionally, the signal carrying vias 310 and/or 320 may also have grounded vias 318 on opposed sides thereof to form vertical shielded RF transmission line structures 344 within the interconnect structure 300I.

While the embodiment of FIGS. 7B-7C implements the circuit elements L1-L3 and C1-C2 on the major surface of interconnect structure 300I that is opposite the RF transistor amplifier die 210, it will be appreciated that embodiments of the present invention are not limited thereto. For example, in other embodiments, some or all of the circuit elements L1-L3 and C1-C2 may be mounted on the same major surface of interconnect structure 300I that the RF transistor amplifier die 210 is mounted on, or may be implemented within the conductive patterns in or on the interconnect structure 300I.

While the example of FIG. 7C includes stripline transmission line segments implemented within the interconnect structure 300I, it will be appreciated that embodiments of the present invention are not limited thereto. For example, coplanar waveguide transmission line segments and/or grounded coplanar waveguide transmission line segments may be used to form some or all of the shielded transmission line structures in the interconnect structures according to embodiments of the present invention. FIGS. 8A-8D are schematic views illustrating two example coplanar waveguide transmission line segments that may be used to form some of the shielded transmission line structures, while FIGS. 9A-9C are schematic views illustrating an example grounded coplanar waveguide transmission line segment that may be used to form some of the shielded transmission line structures.

Figure 8A:
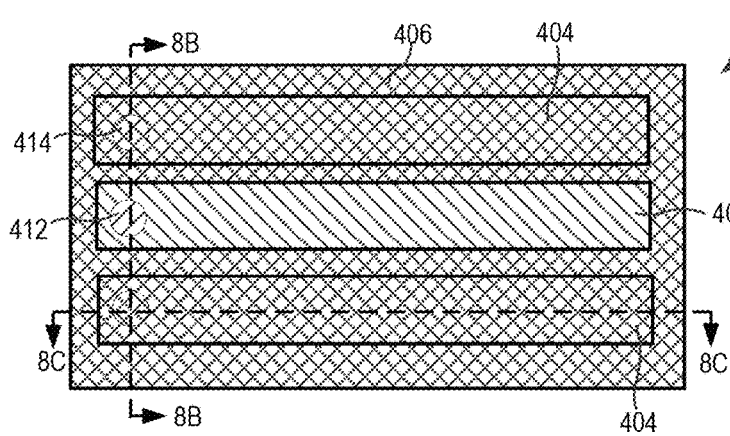
FIGS. 8A-8C are schematic views illustrating an example coplanar waveguide transmission line segment that may be used to form some of the transmission line segments in interconnect structures according to embodiments of the present invention.
Figure 8B:
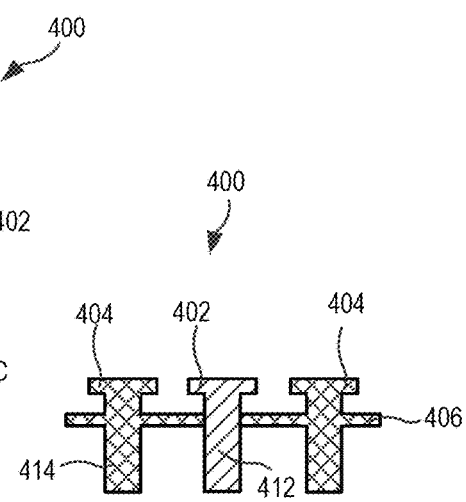

In particular, FIG. 8A is a plan view of a coplanar waveguide transmission line segment 400. FIG. 8B is a side end view of the coplanar waveguide transmission line segment 400 of FIG. 8A (taken along line 8B-8B in FIG. 8A), and FIG. 8C is a side front view of the coplanar waveguide transmission line segment 400 of FIG. 8A (taken along line 8C-8C in FIG. 8A).

Figure 8C:
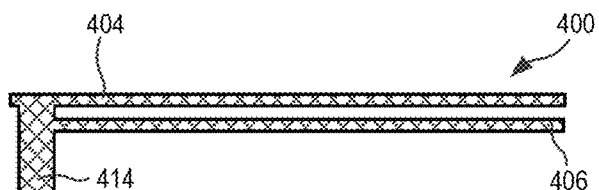
Figure 9A:
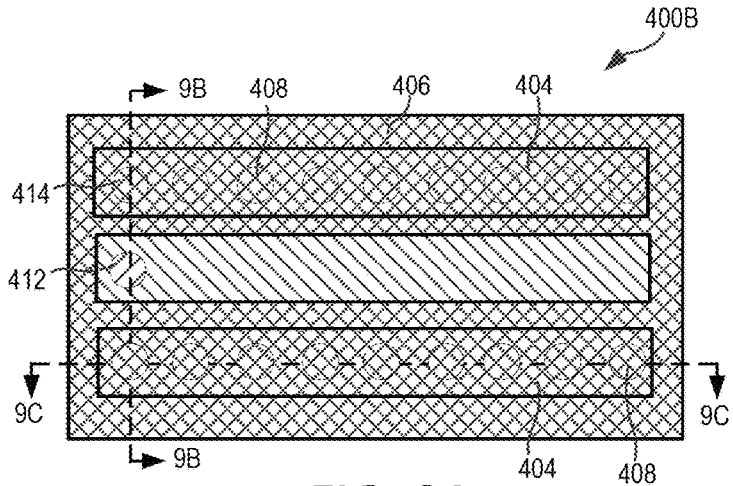
FIGS. 9A-9C are schematic views illustrating an example grounded coplanar waveguide transmission line segment that may be used to form some of the transmission line structures in interconnect structures according to embodiments of the present invention.
Figure 9B:
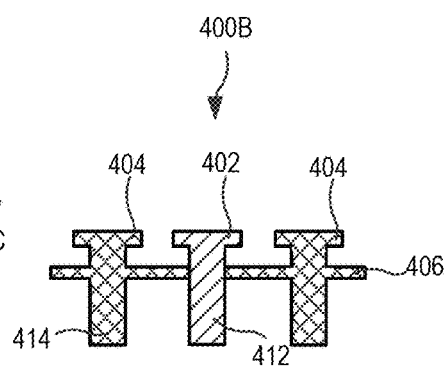
Figure 9C:
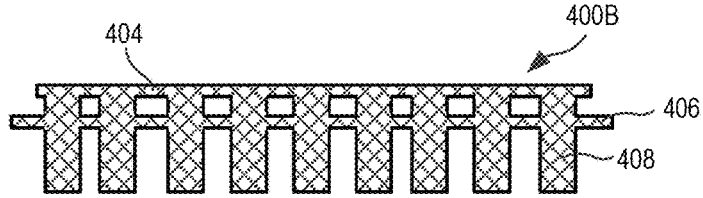

As shown in FIGS. 8A-8C, the coplanar waveguide transmission line segment 400 includes a conductive trace 402 and first and second ground conductive traces 404. The conductive trace 402 and the first and second ground conductive traces 404 extend in parallel to each other, with the first and second ground conductive traces 404 on opposed sides of the conductive trace 402. The conductive trace 402 and the first and second ground conductive traces 404 may comprise, for example, metal traces of a printed circuit board that are formed on a dielectric layer of the printed circuit board. A grounded metal layer 406 is disposed below the conductive trace 402 and the first and second ground conductive traces 404. This grounded metal layer 406 extends in parallel to the conductive trace 402 and the first and second ground conductive traces 404 (and may alternatively be disposed above the conductive trace 402). As shown in FIG. 8B, a conductive via 412 may connect to the conductive trace 402. The conductive via 412 may be used to pass RF signals between the conductive trace 402 and another element (e.g., another RF transmission line segment). Likewise, first and second conductive ground vias 414 may connect to the respective first and second conductive ground traces 404 to maintain the conductive ground traces 404 at ground potential. The conductive ground traces 414 help contain RF energy in the dielectric between the grounded metal layer 406 and the conductive ground traces 414.

Figure 8D:
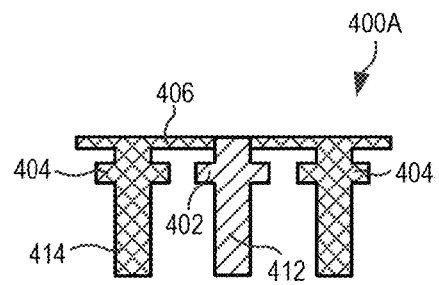
FIG. 8D is an end view of another coplanar waveguide transmission line segment that may be used to form some of the transmission line segments in interconnect structures according to embodiments of the present invention.

It will also be appreciated that other coplanar waveguide transmission line segments may be used. For example, FIG. 8D is a side end view (corresponding to the view of FIG. 8B) of another coplanar waveguide structure 400A in which the grounded metal layer 406 is disposed above the conductive trace 402 and the grounded conductive traces 404. The coplanar waveguide transmission line segment 400A could likewise be used in the interconnection structures according to embodiments of the present invention.

FIGS. 9A-9C illustrate a grounded coplanar waveguide transmission line segment 400B that is similar to the coplanar waveguide transmission line segment 400. FIGS. 9A-9C correspond to FIGS. 8A-8C, respectively, and show how the coplanar waveguide transmission line segment 400 of FIGS. 8A-8C can be converted into a grounded coplanar waveguide transmission line segment 400B. As can be seen by comparing FIGS. 8A-8C to FIGS. 9A-9C, the only difference between transmission line segments 400 and 400B is that transmission line segment 400B includes a plurality of ground vias 408 that extend between the ground metal layer 406 and each conductive ground trace 404. The ground vias 408 may extend in a line, and adjacent ground vias 408 may be spaced apart a distance that is small enough to prevent more than de minimis RF energy from passing between adjacent ground vias 408. The grounded coplanar waveguide transmission line segment 400B may exhibit a high level of RF shielding. As with the coplanar waveguide transmission line segments discussed above, other grounded coplanar waveguide transmission line segments may be used (e.g., ones in which the grounded metal layer 406 is disposed above the conductive trace 402 and the grounded conductive traces 404).

Figure 10A:
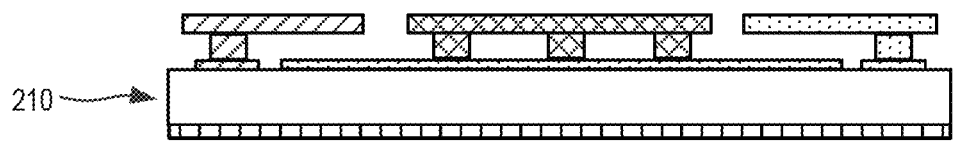
FIGS. 10A-10G are schematic diagrams illustrating methods of forming packaged RF amplifiers according to certain embodiments of the present invention.

FIGS. 10A-10G are schematic diagrams illustrating methods of forming packaged RF transistor amplifiers according to certain embodiments of the present invention. As shown in FIG. 10A, an RF transistor amplifier die such as RF transistor amplifier die 210 may be fabricated. Typically, a plurality of RF transistor amplifier die 210 may be formed on a single semiconductor wafer that is subsequently diced into individual RF transistor amplifier die 210.

Figure 10B:
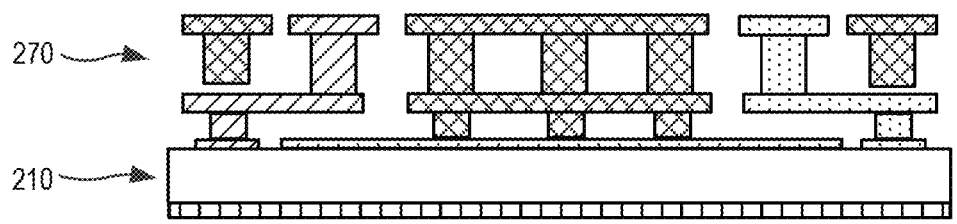
Figure 10C:
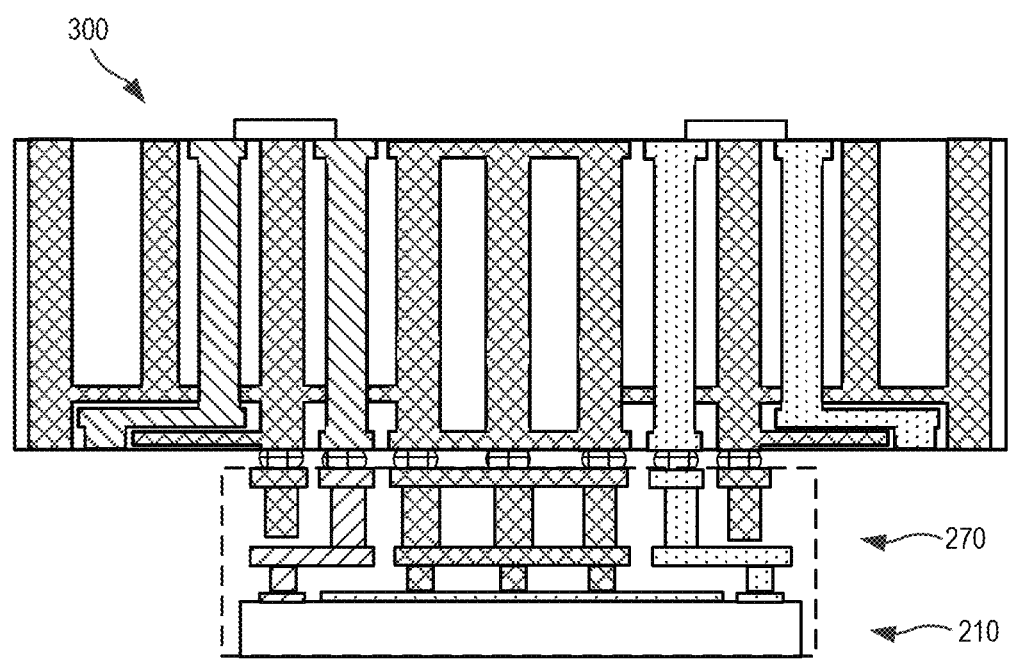

Referring to FIG. 10B, next, a coupling element, such as coupling element 270, is formed on the upper surface of the RF transistor amplifier die 210. The coupling element may, in some cases, be formed using semiconductor processing techniques before the wafer is diced, in which case the coupling element 270 may be considered to be part of the RF transistor amplifier die 210. In other cases, the coupling element 270 may be formed separately (e.g., as an RDL laminate structure) and placed on the semiconductor wafer, or formed separately and placed on an individually diced RF transistor amplifier die 210. Next, as shown in FIG. 10C, an interconnect structure (e.g., interconnect structure 300) may be bonded to the coupling element 270 to attach the RF transistor amplifier die 210 to the interconnect structure 300.

Figure 10D:
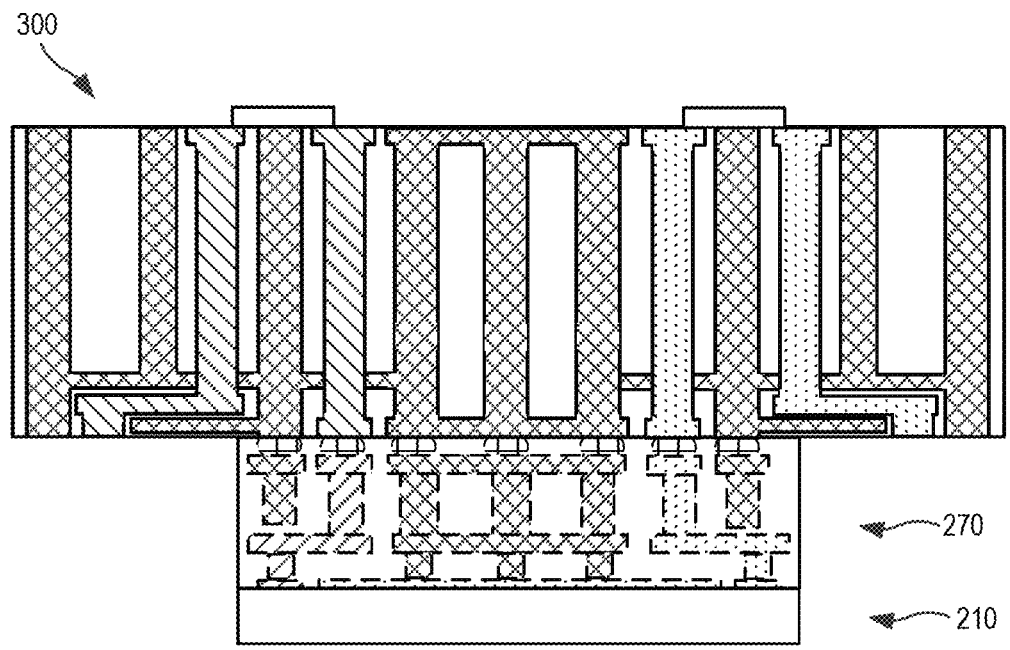
Figure 10E:
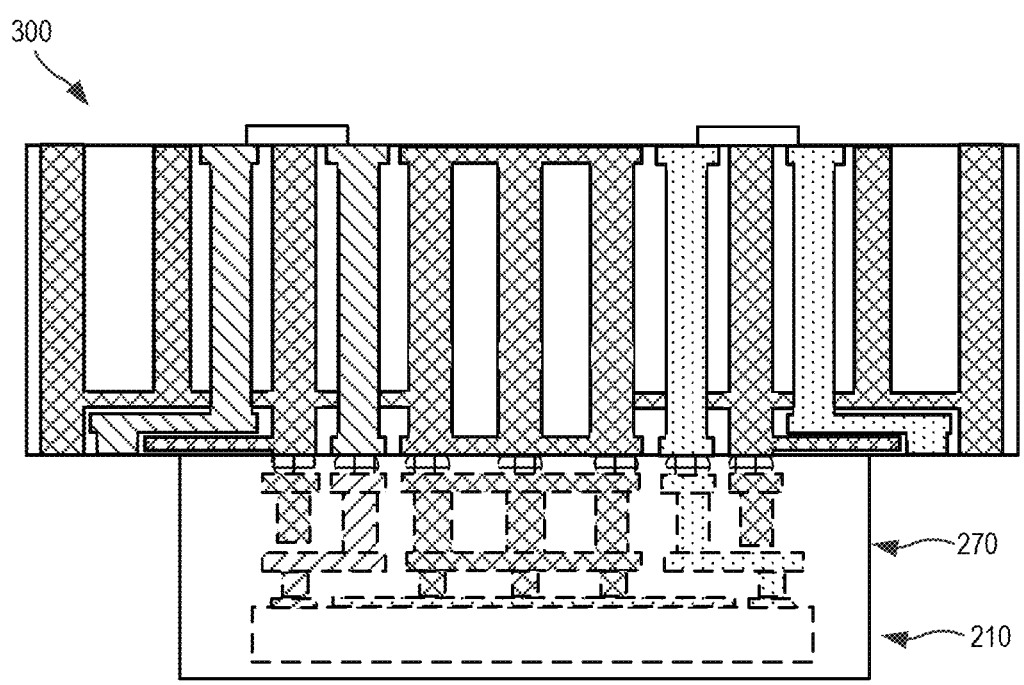
Figure 10F:
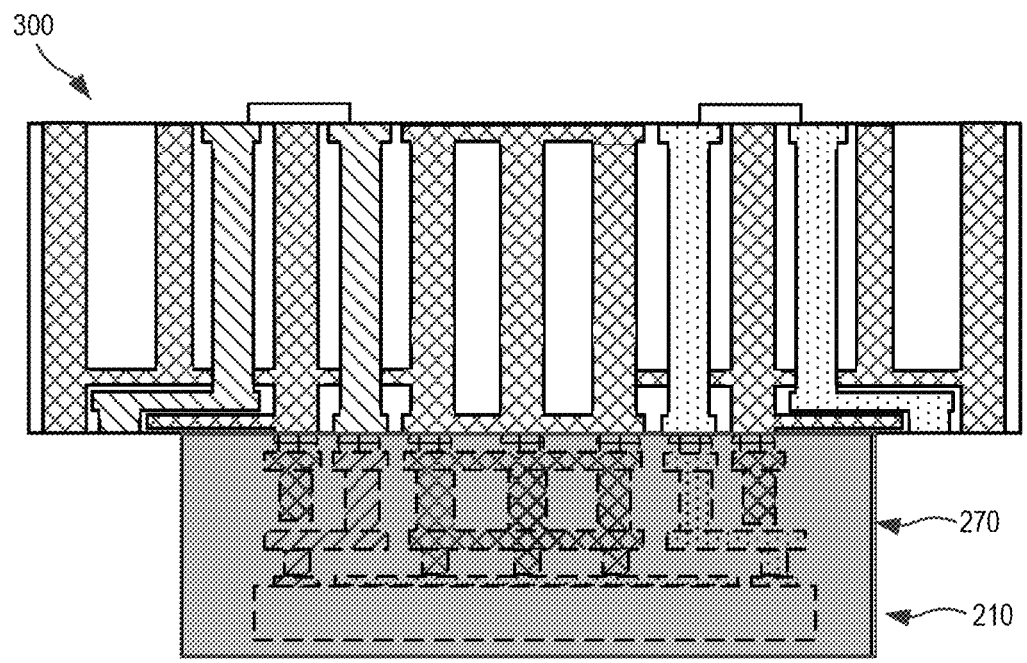
Figure 10G:
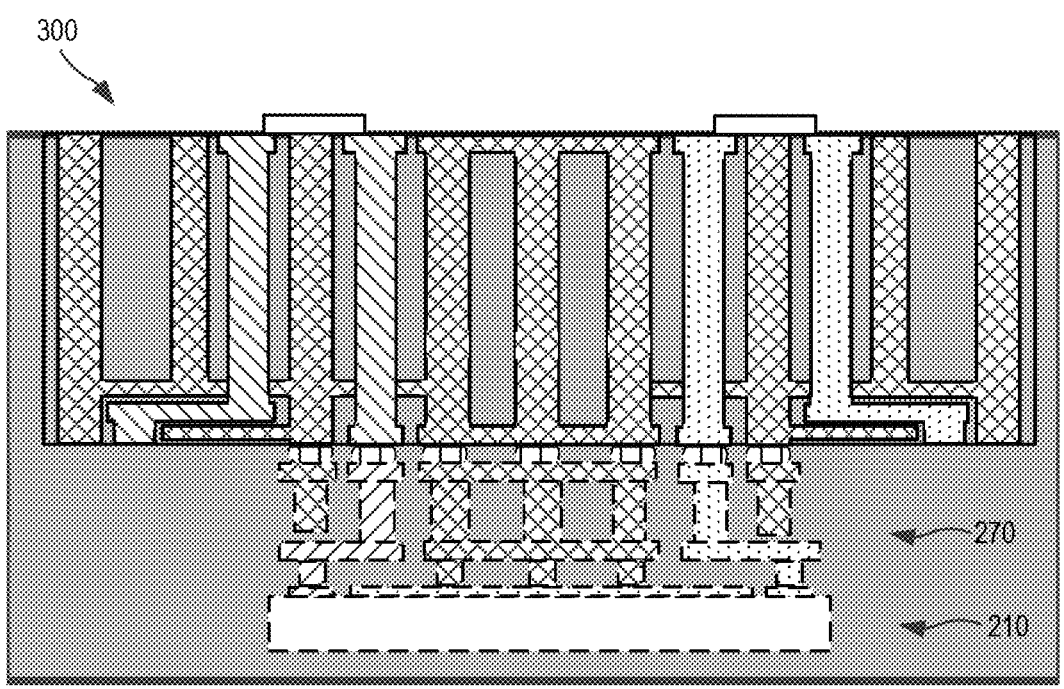

As shown in FIG. 10D, a capillary underfill process may be used to inject dielectric material between the conductive structures of the coupling element 270. The dielectric material may help prevent short circuits, enhance the structural integrity of the coupling element and provide for proper impedance matching. As shown in FIG. 10E, in other cases, a molded underfill process may be used to inject underfill material between the conductive structures of the coupling element 270 and to also encapsulate the RF transistor amplifier die 210 in protective underfill material. As shown in FIGS. 10F and 10G, the device of FIG. 10D may be packaged with an overmold plastic. In the embodiment of FIG. 10F, only the RF transistor amplifier die 210 and the coupling element 270 are encapsulated within the overmold plastic material, while in the embodiment of FIG. 10G all three of the RF transistor amplifier die 210, the coupling element 270 and the interconnect structure 300 are encapsulated. Openings may be formed within the encapsulation material to provide access to various terminals of the device (e.g., an RF input terminal, an RF output terminal, a ground terminal, bias voltage terminals, etc.).

Figure 11A:
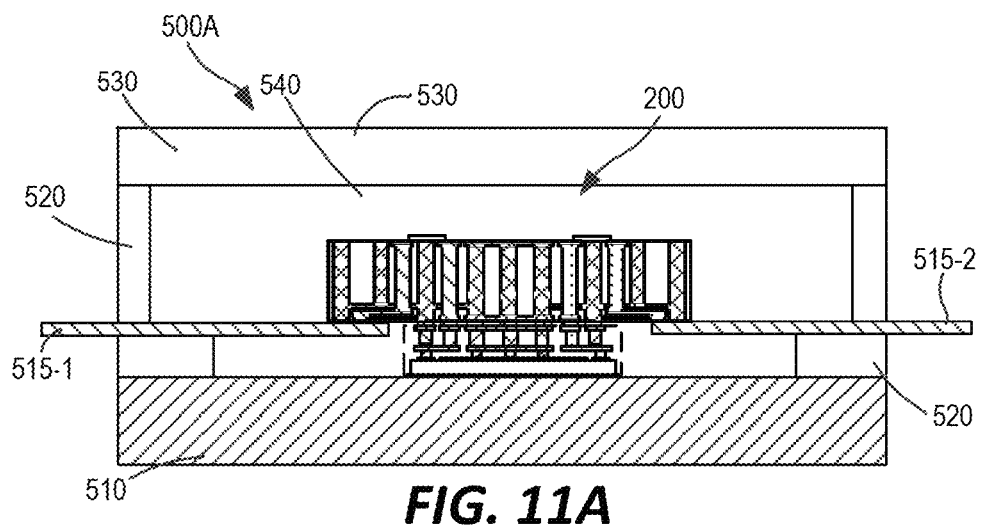
FIG. 11A is a schematic cross-sectional view of a packaged RF transistor amplifier that includes the RF transistor amplifier of FIG. 3I in a ceramic package.
Figure 11B:
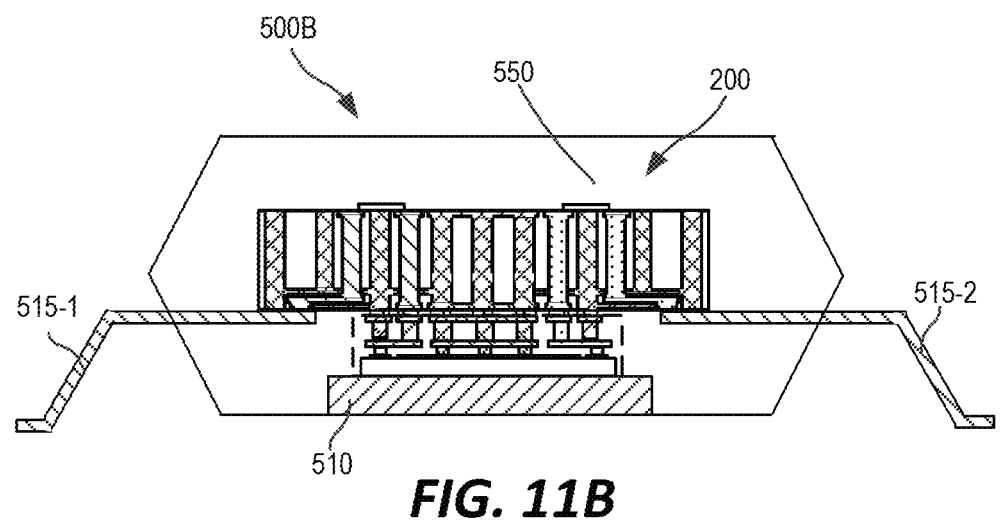
FIG. 11B is a schematic cross-sectional view of a packaged RF transistor amplifier that includes the RF transistor amplifier of FIG. 3I in an overmold plastic package.

FIGS. 11A and 11B are schematic cross-sectional views of additional packaging options 500A, 500B for the RF transistor amplifiers (e.g., RF transistor amplifier 200 of FIGS. 3A-3I) according to embodiments of the present invention. As the RF transistor amplifier 200 has already been discussed in detail, the discussion of FIGS. 11A-11B will focus on the external packaging.

Referring first to FIG. 11A, packaging option 500A encloses RF transistor amplifier 200 in a ceramic package. The package 500A is a so-called open-cavity package that includes a carrier substrate 510, sidewalls 520 and a lid 530 that together define an open-cavity 540. The RF transistor amplifier 200 (including interconnect structure 300) is disposed on the carrier substrate 510 within the open-cavity 540.

The carrier substrate 510 may include materials configured to assist with the thermal management of the package 500A. For example, the carrier substrate 510 may include copper and/or molybdenum. In some embodiments, the carrier substrate 510 may be composed of multiple layers and/or contain vias/interconnects. In an example embodiment, the carrier substrate 510 may be a multilayer copper/molybdenum/copper metal flange that comprises a core molybdenum layer with copper cladding layers on either major surface thereof. The provided examples of the materials of the carrier substrate 510 are not intended to limit the present invention.

The sidewalls 520 and/or lid 530 may be formed of or include an insulating material in some embodiments. For example, the sidewalls 530 and/or lid 530 may be formed of or include ceramic materials. In some embodiments, the sidewalls 530 and/or lid 530 may be formed of, for example, $Al_2O_3$. The lid 530 may be glued to the sidewalls 520 using an epoxy glue. The sidewalls 520 may be attached to the carrier substrate 510 via, for example, braising. Leads 515-1, 515-2 may be configured to extend through the sidewalls 520, though embodiments of the present invention are not limited thereto.

In some embodiments, the RF transistor amplifier 200 may be disposed on the carrier substrate 510 and the leads 515-1, 515-2 may attach to the underside of the interconnect structure 300. The leads 515-1, 515-2 may be coupled to the interconnect structure 300 using, for example, a conductive die attach material. As shown, in some embodiments, the use of wire bonds to connect the RF transistor amplifier 200 to leads 515-1, 515-2 may be avoided.

Referring to FIG. 11B, packaging option 500B encloses RF transistor amplifier 200 in an overmold plastic package. The package 500B includes the carrier substrate 510, leads 515-1, 515-2 and overmold plastic material 550. The RF transistor amplifier 200 (including interconnect structure 300) is disposed on the carrier substrate 510. The leads 515-1, 515-2 are connected to the interconnect structure (e.g., in the same manner described above with reference to FIG. 11A). The overmold material 550, which may be a plastic or a plastic polymer compound, is injection molded around RF transistor amplifier 200 (including interconnect structure 300), thereby providing protection from the outside environment.

Methods of manufacturing an overmold plastic package are described in U.S. Pat. No. 9,515,011 entitled "Over-mold plastic packaged wide band-gap power transistors and MMICS," to Wood et al., issued Dec. 6, 2016, the disclosure of which is incorporated herein by reference as if set forth fully herein. In package 500B, leads 515-1, 515-2 may extend through the overmold plastic material 550 to connect directly to the interconnect structure. As such, in some embodiments, the use of wire bonds to connect the RF transistor amplifier 200 to leads 515-1, 515-2 may be avoided.

The carrier substrate 510 of package 500B may include materials configured to assist with thermal management. For example, the carrier substrate 510 may include copper and/or molybdenum. In some embodiments, the carrier substrate 510 may be composed of multiple layers and/or contain vias/interconnects. In some embodiments, the carrier substrate 510 may include a metal heat sink that is part of a lead frame or metal slug that is at least partially surrounded by a plastic overmold plastic 550.

Though FIGS. 11A and 11BC illustrate the use of an RF transistor amplifier 200 having a coupling element 270, the present invention is not limited thereto. In other embodiments, the RF transistor amplifier die 210 may be coupled directly to the interconnect structure (as in FIGS. 5A-5F above) and the resulting RF transistor amplifier may be packaged using packages 500A or 500B.

It will be appreciated that any of the RF transistor amplifiers according to embodiments of the present invention that are discussed herein may be mounted in packages such as the packages shown in FIGS. 10D-10G and FIGS. 11A and 11B. Depending on the embodiment, the packaged RF transistor amplifier can include a monolithic microwave integrated circuit (MMIC) as the RF transistor amplifier die where the RF transistor amplifier die incorporates multiple discrete circuits in a single integrated die. Additionally and/or alternatively, the package can comprise multiple RF transistor amplifier die in a path that are connected in series to form a multiple stage RF transistor amplifier and/or multiple RF transistor amplifier die that are disposed in multiple paths (e.g., in parallel) to form an RF transistor amplifier with multiple transistor amplifier die and multiple paths, such as in a Doherty amplifier configuration. In some embodiments, the packaged RF transistor amplifier may include RF transistor amplifier die according to embodiments of the present invention that have conducive gate and/or conductive drain vias that provide electrical connections to a back side interconnect structure as well as traditional RF transistor amplifier die that have gate and drain terminals that are connected to other structures via wire bonds.

Figure 12:
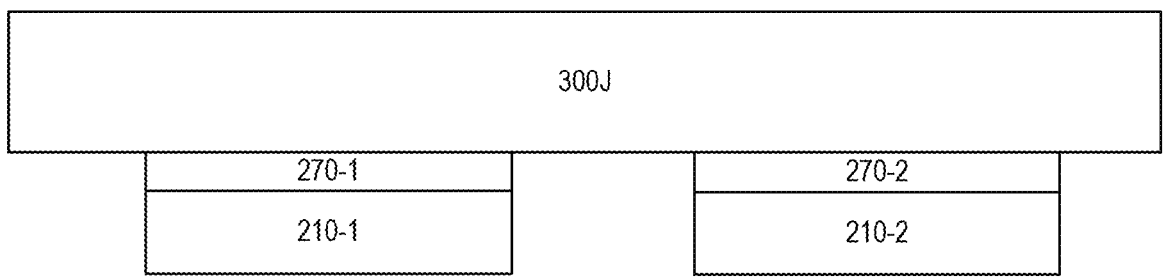
FIG. 12 is a schematic side view of an RF transistor amplifier according to embodiments of the present invention that includes two RF transistor amplifier die coupled to an interconnect structure.

It will also be appreciated that multiple RF transistor amplifier dies may be coupled to a single interconnect structure. Such an arrangement is schematically shown in FIG. 12. As shown in FIG. 12, first and second RF transistor amplifier dies 210-1, 210-2 are coupled to an interconnect structure 300J by respective coupling elements 270-1, 270-2. Conductive patterns (e.g., conductive vias and traces) within the interconnect structure 300J may be used to electrically connect each RF transistor amplifier die 210-1, 210-2 to matching circuitry that is, for example, mounted on and/or implemented within the interconnect structure 300J and to each other (if desired).

The interconnect structure 300J may be used, for example, to provide interconnects to the RF transistor amplifier dies 210-1, 210-2 in order to implement a multistage and/or multipath amplifier circuit, such as a Doherty amplifier. The conductive patterns within the interconnect structure 300J may provide the electrical connections of the multistage and/or multipath amplifier circuit. Thus, the interconnect structure 300J may be configured to provide modular interconnects that can be easily coupled to a plurality of RF transistor amplifiers without the use of bond wires.

The shielded transmission line structures disclosed herein may be used in a wide variety of RF transistor amplifiers. For example, U.S. Provisional Patent Application Ser. No. 63/004,765, filed Apr. 3, 2020 ("the '765 application"), discloses a variety of RF transistor amplifiers that may include an RF transistor amplifier die, a coupling element and an optional interconnection structure. The shielded transmission line structures disclosed herein may be incorporated into any of the RF transistor amplifiers disclosed in the '765 application. The entirety of the '765 application is incorporated herein by reference.

The RF transistor amplifiers according to embodiments of the present invention may have a number of advantages as compared to conventional RF transistor amplifiers. The provision of shielded transmission line structures may improve the performance of the RF transistor amplifier. Moreover, the reduction in bond wires (or eliminating the bond wires entirely) may reduce costs and simplify manufacturing, and may improve the RF performance of the device since the amount of inductance in the impedance matching networks may be tightly controlled, and the problem of too much inductance in the matching networks can be avoided. Moreover, increased wafer level packaging becomes possible with the RF transistor amplifiers according to embodiments of the present invention, which may further simplify manufacturing and/or reduce production costs.

Embodiments of the present disclosure can be used, for example, in RF power products for 5G and base station and/or handset applications, as well as in radar applications.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
    an RF transistor amplifier die having a semiconductor layer structure and a gate terminal and a drain terminal that are on an upper surface of the semiconductor layer structure;
    a coupling element on an upper surface of the semiconductor layer structure; and
    an interconnect structure on an upper surface of the coupling element so that the RF transistor amplifier die and the interconnect structure are in a stacked arrangement, wherein the coupling element includes a first shielded transmission line structure that extends between the RF transistor amplifier die and the interconnect structure, the first shielded transmission line structure comprising a first conductive pillar that is electrically connected to the gate terminal of the RF transistor amplifier die and a first conductive ground pillar that has a first end that is electrically connected to a source terminal of the RF transistor amplifier die and a second end that is not connected to a conductive element.

2. The RF transistor amplifier of claim 1, wherein the first shielded transmission line structure further comprises a second conductive ground pillar that is electrically connected to the source terminal of the RF transistor amplifier die, the first and second conductive ground pillars on opposed sides of the first conductive pillar.

3. The RF transistor amplifier of claim 2, wherein the first shielded transmission line structure further comprises third and fourth conductive ground pillars that are electrically connected to the source terminal of the RF transistor amplifier, the first through fourth ground pillars radially arranged around the first conductive pillar.

4. The RF transistor amplifier of claim 1, wherein the first conductive pillar vertically overlaps an active region of the RF transistor amplifier die.

5. The RF transistor amplifier of claim 2, wherein the first and second conductive ground pillars vertically overlap a gate manifold of the RF transistor amplifier die, wherein the gate manifold is connected to a plurality of conductive fingers that extend across an active region of the RF transistor amplifier die.

6. A radio frequency ("RF") transistor amplifier, comprising:
an RF transistor amplifier die having a Group III nitride-based semiconductor layer structure and gate and drain fingers extending on an upper surface of the semiconductor layer structure; and
a first shielded transmission line structure extending perpendicularly to the upper surface of the semiconductor layer structure,
an interconnect structure, wherein the first shielded transmission line structure electrically connects the RF transistor amplifier die to the interconnect structure,
wherein the first shielded transmission line structure comprises a first conductive pillar that is electrically connected to one of the gate fingers or one of the drain fingers and first and second conductive ground pillars that are on opposed sides of the first conductive pillar, the first and second conductive ground pillars electrically connected to source fingers of the RF transistor amplifier die, and
wherein the first shielded transmission line structure further comprises third and fourth conductive ground pillars that are on opposed sides of the first conductive pillar, the third and fourth conductive ground pillars electrically connected to the source fingers.

7. The RF transistor amplifier of claim 6, wherein the second conductive ground pillar vertically overlaps a portion of the RF transistor amplifier die that is outside an active region of the RF transistor amplifier die.

8. The RF transistor amplifier of claim 6, wherein the RF transistor amplifier die further includes a gate terminal that is electrically connected to the gate fingers, a drain terminal that is electrically connected to the drain fingers, and a source terminal that is electrically connected to the source fingers, wherein the gate terminal, the drain terminal and the source terminal are all located farther above the semiconductor layer structure than the gate fingers, the drain fingers and the source fingers.

9. A radio frequency ("RF") transistor amplifier, comprising:
an RF transistor amplifier die comprising a gate terminal, a drain terminal, and a source terminal on a first surface of the RF transistor amplifier die; and
an interconnect structure that is in a stacked arrangement with the RF transistor amplifier die and electrically connected thereto by a shielded transmission line structure,
wherein the shielded transmission line structure comprises a first conductive pillar that is electrically connected to the gate terminal and first and second conductive ground pillars that are on opposed sides of the first conductive pillar, the first and second conductive ground pillars electrically connected to the source terminal, and
wherein the shielded transmission line structure further comprises a third conductive ground pillar that together with the first and second conductive ground pillars surrounds the first conductive pillar on at least three sides.

10. The RF transistor amplifier of claim 9, wherein the first conductive ground pillar vertically overlaps a gate manifold that is electrically connected to the gate terminal.

11. A radio frequency ("RF") transistor amplifier, comprising:
an RF transistor amplifier die comprising a gate terminal, a drain terminal, and a source terminal on a first surface of the RF transistor amplifier die; and
an interconnect structure that is in a stacked arrangement with the RF transistor amplifier die and electrically connected thereto by a shielded transmission line structure,
wherein the shielded transmission line structure comprises a first conductive pillar that is electrically connected to the gate terminal and first and second conductive ground pillars that are on opposed sides of the first conductive pillar, the first and second conductive ground pillars electrically connected to the source terminal, and
wherein the first conductive pillar and the first conductive ground pillar both vertically overlap the gate terminal.

12. A radio frequency ("RF") transistor amplifier, comprising:
an RF transistor amplifier die comprising a gate terminal, a drain terminal, and a source terminal on a first surface of the RF transistor amplifier die; and
an interconnect structure that is in a stacked arrangement with the RF transistor amplifier die and electrically connected thereto by a shielded transmission line structure,
wherein the shielded transmission line structure comprises a first conductive pillar that is electrically connected to the gate terminal and first and second conductive ground pillars that are on opposed sides of the first conductive pillar, the first and second conductive ground pillars electrically connected to the source terminal, and
wherein the first conductive pillar and a third conductive pillar are electrically connected to a gate manifold of the RF transistor amplifier die, and wherein the first conductive ground pillar is positioned between the first and third conductive pillars.

13. The RF transistor amplifier of claim 9, wherein the second conductive ground pillar vertically overlaps a portion of the RF transistor amplifier die that is outside an active region of the RF transistor amplifier die.

14. The RF transistor amplifier of claim 9, wherein the shielded transmission line structure comprises a first shielded transmission line structure, and the RF transistor amplifier further comprises a second shielded transmission line structure that comprises a second conductive pillar that is electrically connected to a drain terminal of the RF transistor amplifier die and third and fourth conductive ground pillars that are on opposed sides of the second conductive pillar, the third and fourth conductive ground pillars electrically connected to the source terminal.

15. The RF transistor amplifier of claim 9, the coupling element further comprising an injectable underfill material that surrounds the first conductive pillar and the first and second conductive ground pillars.

16. The RF transistor amplifier of claim 9, wherein the second conductive ground pillar comprises a metal slug, the metal slug having a cross-sectional area in a first plane that is parallel to a major surface of the RF transistor amplifier die that is at least five times a cross-sectional area of the first conductive pillar in the first plane.

17. The RF transistor amplifier of claim 11, the coupling element further comprising an injectable underfill material that surrounds the first conductive pillar and the first and second conductive ground pillars.

18. The RF transistor amplifier of claim 11, wherein the shielded transmission line structure further comprises a third conductive ground pillar that together with the first and second conductive ground pillars surrounds the first conductive pillar on at least three sides.

19. The RF transistor amplifier of claim 12, the coupling element further comprising an injectable underfill material that surrounds the first conductive pillar and the first and second conductive ground pillars.

20. The RF transistor amplifier of claim 12, wherein the second conductive ground pillar vertically overlaps a portion of the RF transistor amplifier die that is outside an active region of the RF transistor amplifier die.

* * * * *